(12) United States Patent
Isobe et al.

(10) Patent No.: US 7,795,734 B2
(45) Date of Patent: Sep. 14, 2010

(54) SEMICONDUCTOR DEVICE AND METHOD OF MANUFACTURING THE SAME

(75) Inventors: Atsuo Isobe, Atsugi (JP); Shunpei Yamazaki, Setagaya (JP); Chiho Kokubo, Tochigi (JP); Koichiro Tanaka, Atsugi (JP); Akihisa Shimomura, Atsugi (JP); Tatsuya Arao, Atsugi (JP); Hidekazu Miyairi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 462 days.

(21) Appl. No.: 11/636,598

(22) Filed: Dec. 11, 2006

(65) Prior Publication Data

US 2007/0085080 A1    Apr. 19, 2007

Related U.S. Application Data

(62) Division of application No. 10/352,066, filed on Jan. 28, 2003, now Pat. No. 7,148,092.

(30) Foreign Application Priority Data

| Jan. 28, 2002 | (JP) | ............................. 2002-019286 |
| Feb. 4, 2002 | (JP) | ............................. 2002-027497 |
| Apr. 19, 2002 | (JP) | ............................. 2002-118282 |

(51) Int. Cl.
*H01L 23/48* (2006.01)
*H01L 23/52* (2006.01)
*H01L 29/40* (2006.01)

(52) U.S. Cl. ..................... 257/758; 257/64; 257/E27.11

(58) Field of Classification Search ................. 257/758, 257/64, E27.11
See application file for complete search history.

(56) References Cited

U.S. PATENT DOCUMENTS 4,330,363 A    5/1982    Biegesen et al.

(Continued)

FOREIGN PATENT DOCUMENTS

EP    1 049 144    11/2000

(Continued)

OTHER PUBLICATIONS

Official Action dated Jun. 6, 2005 for U.S. Appl. No. 10/352,233, filed Jan. 28, 2003 to Isobe.

(Continued)

*Primary Examiner*—Kiesha R Bryant
*Assistant Examiner*—Igwe U Anya
(74) *Attorney, Agent, or Firm*—Eric J. Robinson; Robinson Intellectual Property Law Office, P.C.

(57) ABSTRACT

To provide a semiconductor device composed of a semiconductor element or a group of semiconductor elements, in which a crystalline semiconductor film having as few grain boundaries as possible in a channel formation region is formed on an insulating surface, which can operate at high speed, which have high current drive performance, and which are less fluctuated between elements. The method of the present invention includes: forming an insulating film with an opening on a substrate having an insulating surface; forming on the insulating film and over the opening an amorphous semiconductor film or a polycrystalline semiconductor film that has randomly-formed grain boundaries; forming a crystalline semiconductor film by melting the semiconductor film, pouring the melted semiconductor into the opening of the insulating film, and crystallizing or re-crystallizing the semiconductor film; and removing the crystalline semiconductor film except a portion of the crystalline semiconductor film that is in the opening to form a gate insulating film, which is in contact with the top face of the crystalline semiconductor film, and a gate electrode.

4 Claims, 35 Drawing Sheets

U.S. PATENT DOCUMENTS

| | | | |
|---|---|---|---|
| 4,385,937 A | 5/1983 | Ohmura | |
| 4,565,584 A | 1/1986 | Tamura et al. | |
| 4,597,060 A | 6/1986 | Mitchell et al. | |
| 4,933,298 A | 6/1990 | Hasegawa | |
| 5,011,787 A | 4/1991 | Jeuch | |
| 5,338,959 A | 8/1994 | Kim et al. | |
| 5,397,908 A | 3/1995 | Dennison et al. | |
| 5,432,122 A | 7/1995 | Chae | |
| 5,568,288 A * | 10/1996 | Yamazaki et al. | 349/42 |
| 5,643,826 A | 7/1997 | Ohtani et al. | |
| 5,696,003 A | 12/1997 | Makita et al. | |
| 5,759,879 A | 6/1998 | Iwasaki | |
| 5,770,486 A | 6/1998 | Zhang et al. | |
| 5,808,321 A * | 9/1998 | Mitanaga et al. | 257/72 |
| 5,821,562 A | 10/1998 | Makita et al. | |
| 5,851,862 A | 12/1998 | Ohtani et al. | |
| 5,854,803 A | 12/1998 | Yamazaki et al. | |
| 5,893,990 A | 4/1999 | Tanaka | |
| 5,894,137 A * | 4/1999 | Yamazaki et al. | 257/66 |
| 5,894,151 A | 4/1999 | Yamazaki et al. | |
| 5,937,282 A | 8/1999 | Nakajima et al. | |
| 5,942,768 A | 8/1999 | Zhang | |
| 5,986,306 A * | 11/1999 | Nakajima et al. | 257/353 |
| 5,990,527 A | 11/1999 | Wen | |
| 6,029,680 A | 2/2000 | Hawthorne et al. | |
| 6,127,702 A * | 10/2000 | Yamazaki et al. | 257/347 |
| 6,133,583 A | 10/2000 | Ohtani et al. | |
| 6,160,269 A | 12/2000 | Takemura et al. | |
| 6,171,890 B1 | 1/2001 | Adachi et al. | |
| 6,365,933 B1 | 4/2002 | Yamazaki et al. | |
| 6,373,082 B1 | 4/2002 | Ohno et al. | |
| 6,410,368 B1 | 6/2002 | Kawasaki et al. | |
| 6,413,802 B1 | 7/2002 | Hu et al. | |
| 6,479,331 B1 | 11/2002 | Takemura | |
| 6,558,989 B1 | 5/2003 | Moon | |
| 6,599,783 B2 | 7/2003 | Takatoku | |
| 6,599,790 B1 | 7/2003 | Yamazaki et al. | |
| 6,600,197 B1 | 7/2003 | Nakajima et al. | |
| 6,602,758 B2 | 8/2003 | Kizilyalli et al. | |
| 6,617,226 B1 | 9/2003 | Suguro et al. | |
| 6,632,711 B2 | 10/2003 | Sugano et al. | |
| 6,636,280 B1 | 10/2003 | Miyazawa et al. | |
| 6,677,191 B1 | 1/2004 | Battersby | |
| 6,700,133 B1 | 3/2004 | Ohtani et al. | |
| 6,746,901 B2 | 6/2004 | Kasahara et al. | |
| 6,747,289 B2 | 6/2004 | Yamazaki et al. | |
| 6,780,687 B2 | 8/2004 | Nakajima et al. | |
| 6,906,383 B1 * | 6/2005 | Zhang et al. | 257/347 |
| 6,930,326 B2 | 8/2005 | Kato et al. | |
| 6,933,527 B2 * | 8/2005 | Isobe et al. | 257/59 |
| 6,974,731 B2 | 12/2005 | Yamazaki et al. | |
| 7,064,016 B2 | 6/2006 | Kasahara et al. | |
| 7,078,321 B2 | 7/2006 | Yoshimoto | |
| 7,105,392 B2 | 9/2006 | Isobe et al. | |
| 7,115,453 B2 | 10/2006 | Nakamura et al. | |
| 7,129,522 B2 | 10/2006 | Nakajima et al. | |
| 7,297,585 B2 | 11/2007 | Maeda et al. | |
| 7,339,235 B1 | 3/2008 | Yamazaki et al. | |
| 2001/0002719 A1 | 6/2001 | Shimizu et al. | |
| 2001/0036755 A1 | 11/2001 | Tanaka | |
| 2002/0036290 A1 | 3/2002 | Inaba et al. | |
| 2002/0098628 A1 | 7/2002 | Hamada et al. | |
| 2003/0141505 A1 | 7/2003 | Isobe et al. | |
| 2003/0183875 A1 * | 10/2003 | Isobe et al. | 257/347 |
| 2003/0186490 A1 * | 10/2003 | Kato et al. | 438/166 |
| 2003/0218169 A1 * | 11/2003 | Isobe et al. | 257/59 |
| 2003/0218171 A1 | 11/2003 | Isobe et al. | |
| 2003/0230749 A1 * | 12/2003 | Isobe et al. | 257/59 |
| 2003/0234395 A1 * | 12/2003 | Kokubo et al. | 257/66 |
| 2004/0132236 A1 | 7/2004 | Doris et al. | |
| 2006/0246634 A1 | 11/2006 | Kasahara et al. | |
| 2007/0015323 A1 | 1/2007 | Isobe et al. | |
| 2007/0051957 A1 | 3/2007 | Nakajima et al. | |

FOREIGN PATENT DOCUMENTS

| | | |
|---|---|---|
| JP | 57-023217 | 2/1982 |
| JP | 58-015226 | 1/1983 |
| JP | 58-086717 | 5/1983 |
| JP | 58-151042 | 9/1983 |
| JP | 62-104117 | 5/1987 |
| JP | 02-143417 | 6/1990 |
| JP | 03-288475 | 12/1991 |
| JP | 04-180030 | 6/1992 |
| JP | 06-244208 | 9/1994 |
| JP | 07-130652 | 5/1995 |
| JP | 07-249779 | 9/1995 |
| JP | 08-078329 | 3/1996 |
| JP | 08-097431 | 4/1996 |
| JP | 08-195357 | 7/1996 |
| JP | 08-288515 | 11/1996 |
| JP | 10-064842 | 3/1998 |
| JP | 10-135468 | 5/1998 |
| JP | 10-135469 | 5/1998 |
| JP | 11-121753 | 4/1999 |
| JP | 11-177102 | 7/1999 |
| JP | 2000-068520 | 3/2000 |
| JP | 2000-183351 | 6/2000 |
| JP | 2001-011085 | 1/2001 |
| JP | 2001-091941 | 4/2001 |
| JP | 2001-144027 | 5/2001 |
| JP | 2001-144302 | 5/2001 |
| JP | 2001-274433 | 10/2001 |
| JP | 2001-284601 | 10/2001 |
| JP | 2001-324723 | 11/2001 |
| JP | 2002-009289 | 1/2002 |
| JP | 2002-014337 | 1/2002 |
| JP | 2002-033330 | 1/2002 |
| JP | 2002-313811 | 10/2002 |
| JP | 2002-324808 | 11/2002 |

OTHER PUBLICATIONS

Official Action dated Dec. 7, 2005 for U.S. Appl. No. 10/352,233, filed Jan. 28, 2003 to Isobe.

Official Action dated Aug. 9, 2005 for U.S. Appl. No. 10/352,240, filed Jan. 28, 2003.

Geis et al., "Crystalline Silicon on Insulators by Graphoepitaxy," IEEE 1979, pp. 210-212.

Official Action dated Dec. 20, 2004 for U.S. Appl. No. 10/352,233, filed Jan. 28, 2003.

Geis et al., "Grapho-epitaxy of Silicon on Fused Silica Using Surface Micropatterns and Laser Crystallization," J. Vac. Sci. Tech., 16(6), Nov./Dec. 1979, pp. 1640-1643.

D.K. Biegelsen et al., *Laser-Induced Crystallization of Silicon Islands on Amorphous Substrates: Multilayer Structures*, Appl. Phys. Lett. 38 (3), Feb. 1, 1981, pp. 150-152.

H.I. Smith et al., *Oriented Crystal Growth on Amorphous Substrates Using Artificial Surface-Relief Gratings* [a)], Appl. Phys. Lett. 32(6), Mar. 15, 1978, pp. 349-350.

H.W. Lam et al., *Characteristics of MOSFETS Fabricated in Laser-Recrystallized Polysilicon Islands with a Retaining Wall Structure on an Insulating Substrate*, IEEE Electron Device Letters, vol. EDL-1, No. 10, Oct. 1980, pp. 206-208.

Wolf, *Silicon Processing for the VLSI Era vol. 2: Process Integration*, vol. 2, pp. 194-199, Jan. 1, 1990.

Office Action (Application No. 200710142234.X) Dated Aug. 14, 2009, Full.

Office Action (Application No. JP 2003-019447) dated Dec. 15, 2009, Full.

* cited by examiner

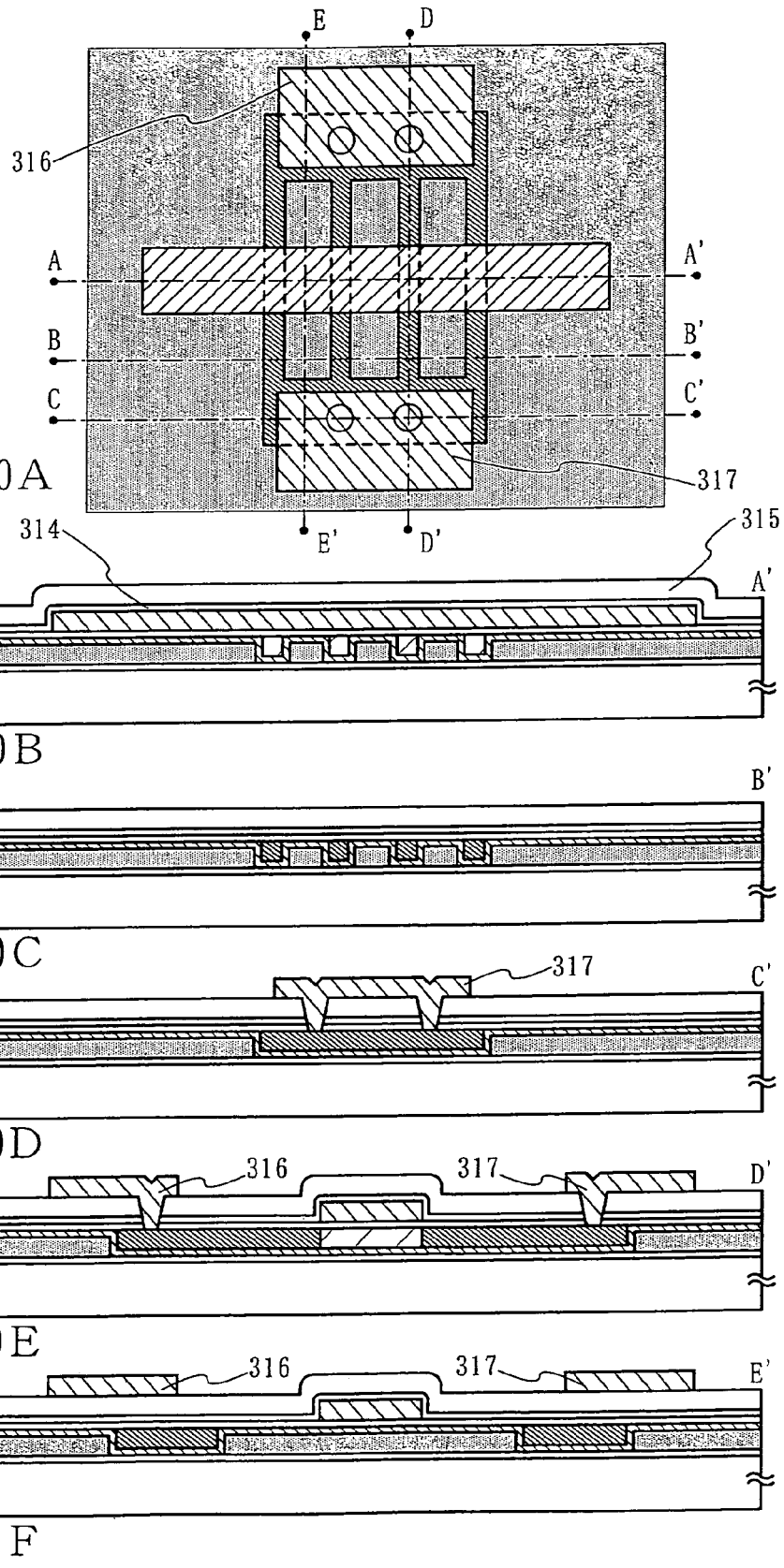

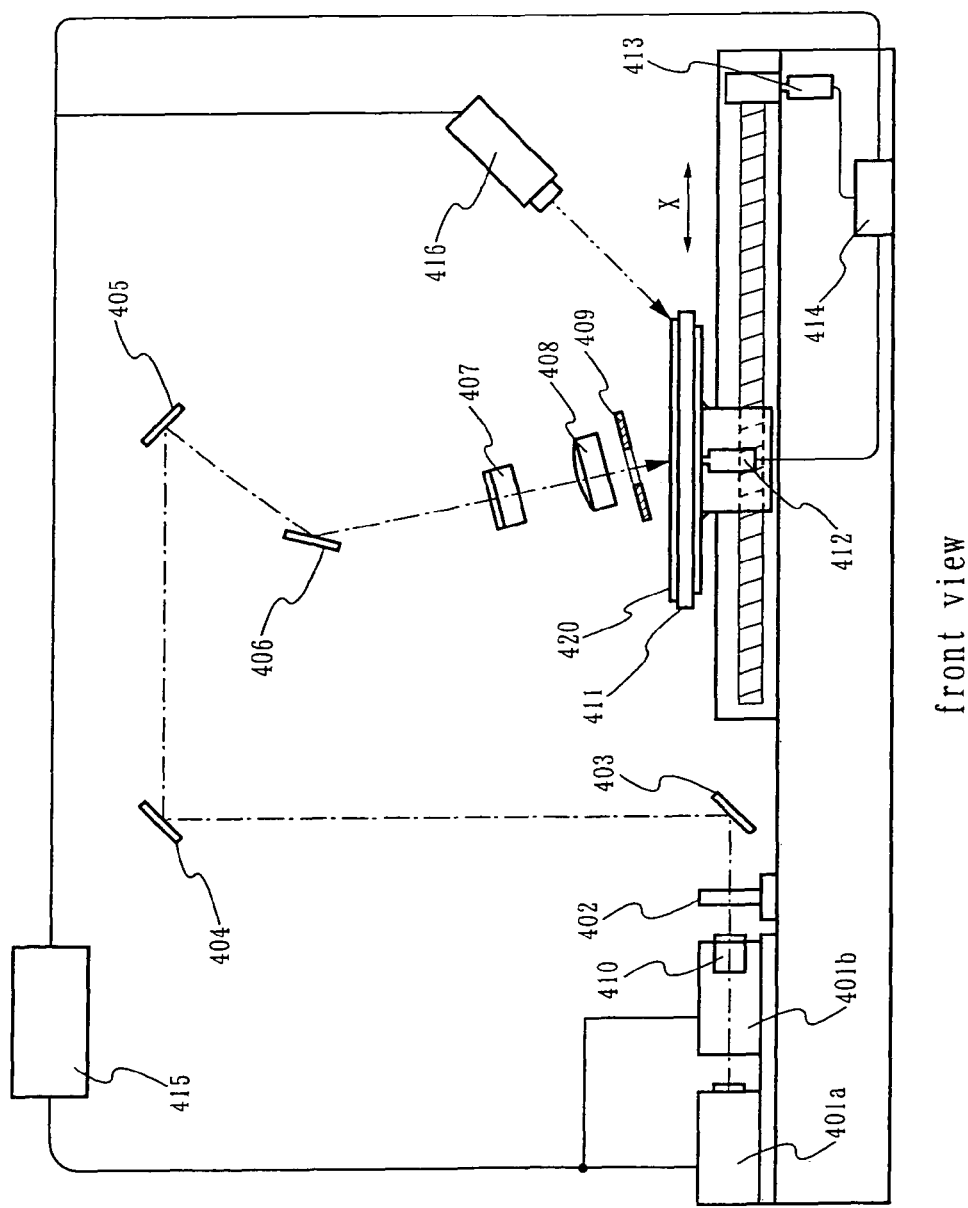
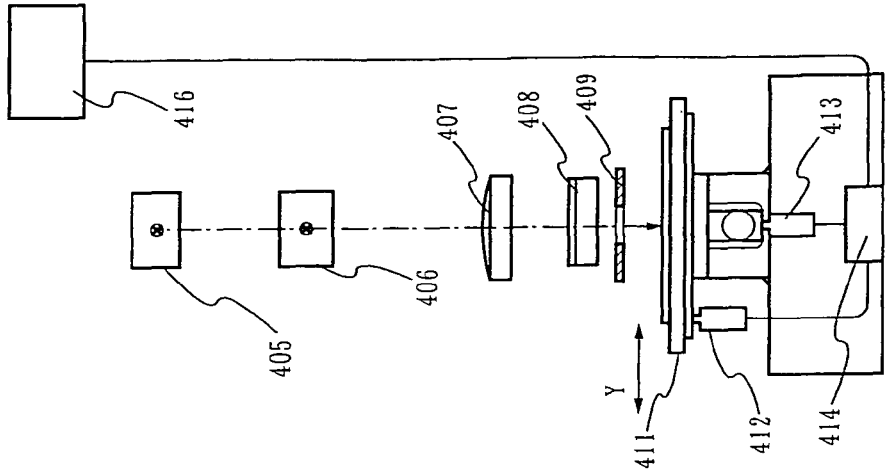
Fig. 13 sample : MA467#12
step : L/S=0.50/0.50um

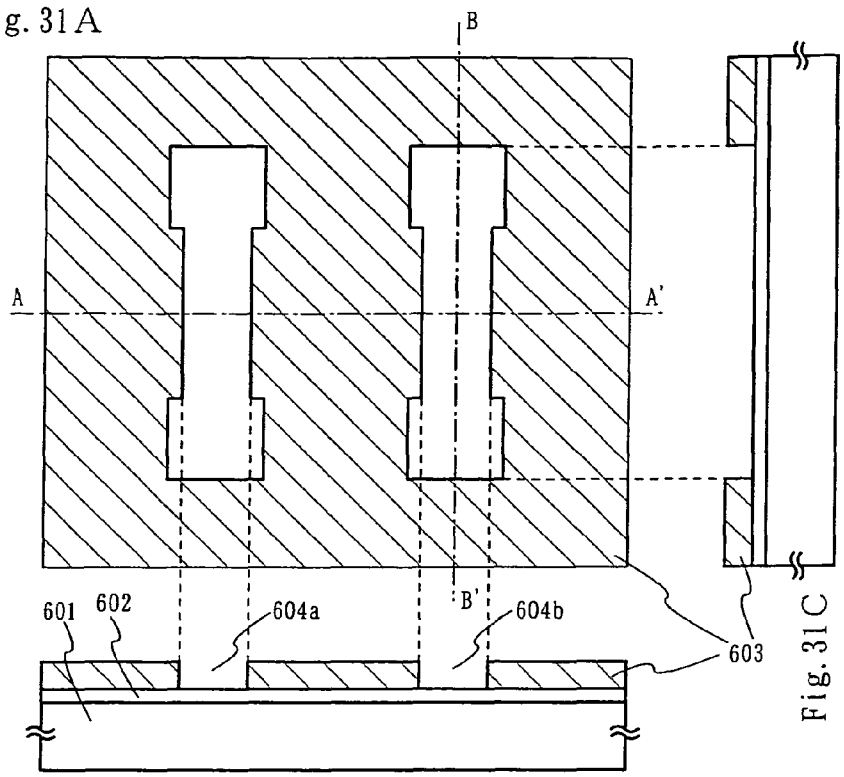
Fig. 31A
Fig. 31B
Fig. 31C
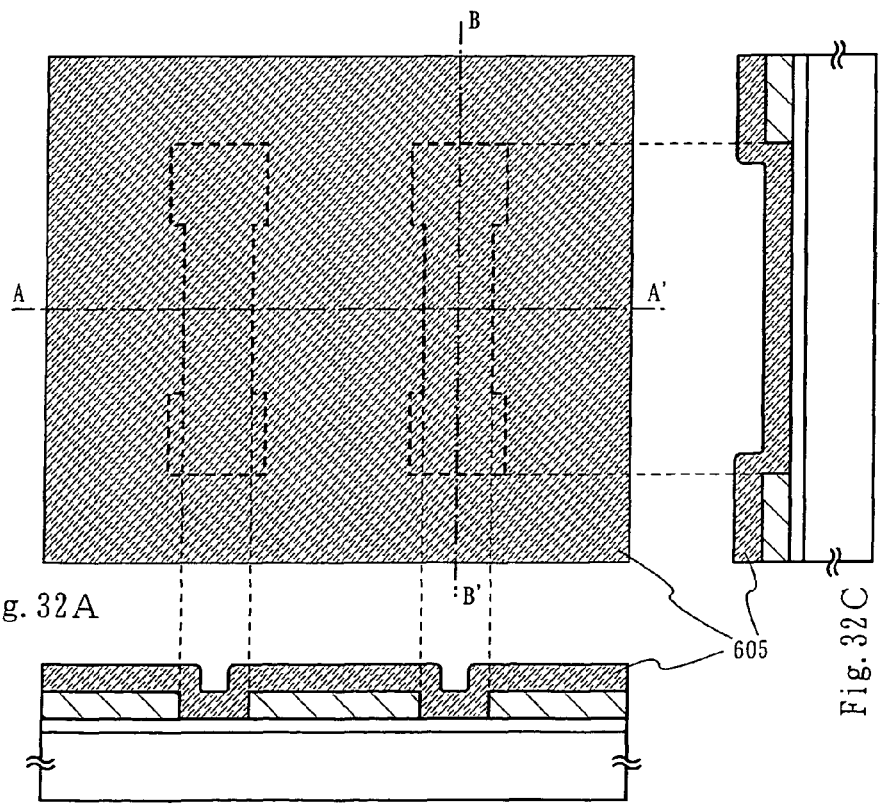
Fig. 32A
Fig. 32B
Fig. 32C

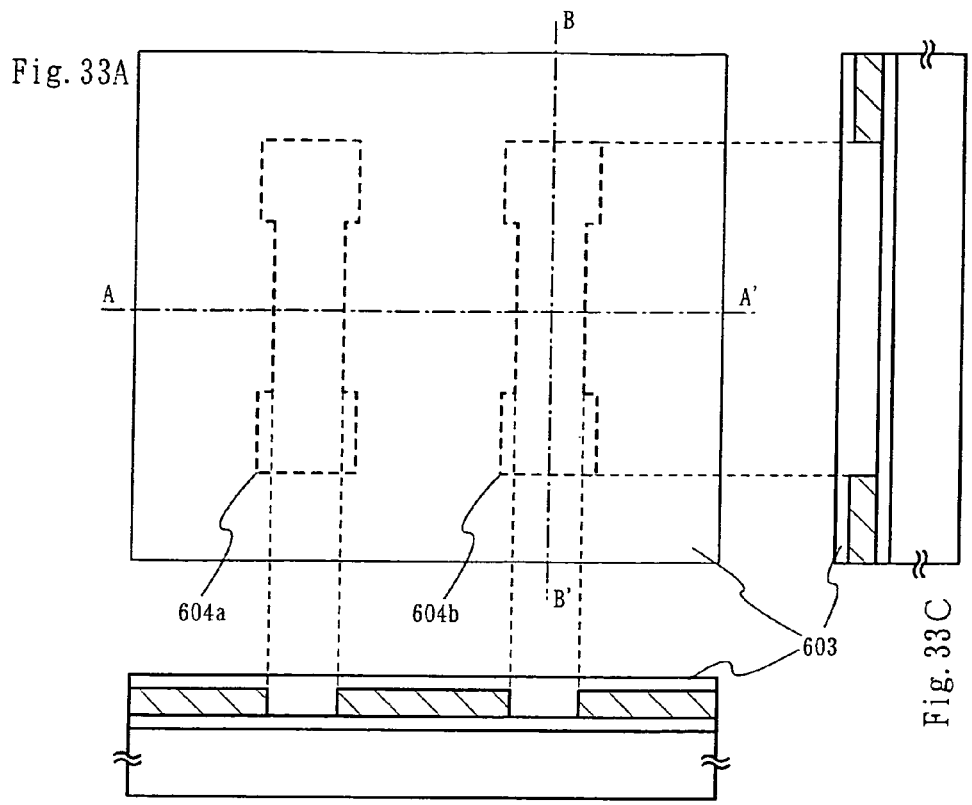
Fig. 33A
Fig. 33B
Fig. 33C
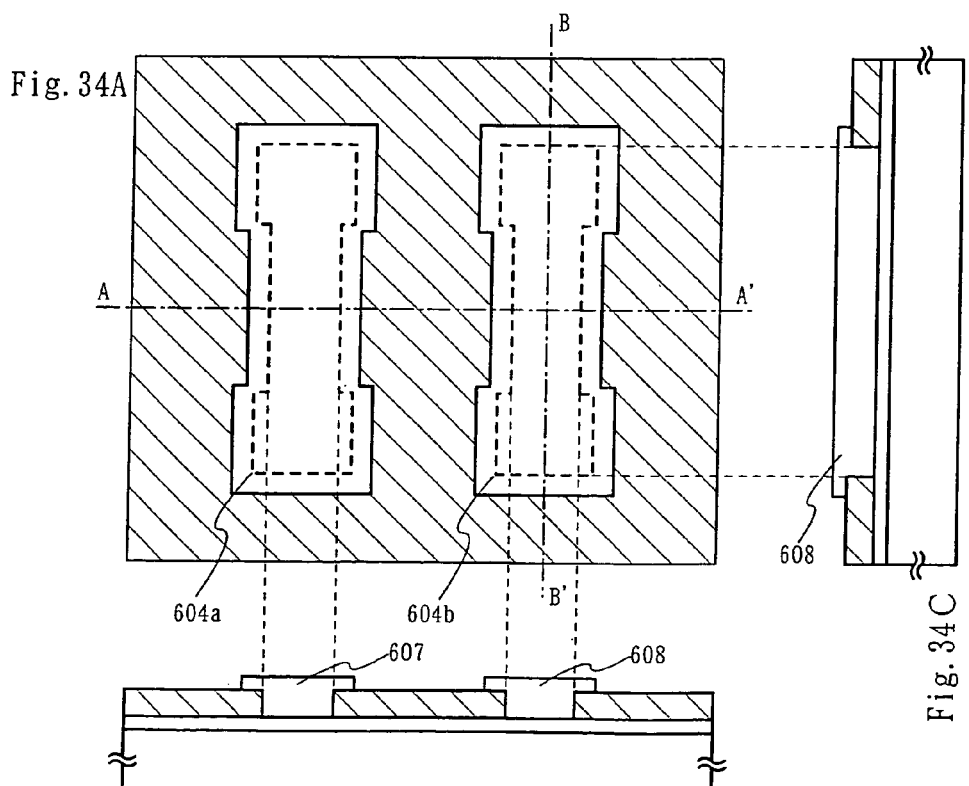
Fig. 34A
Fig. 34B
Fig. 34C

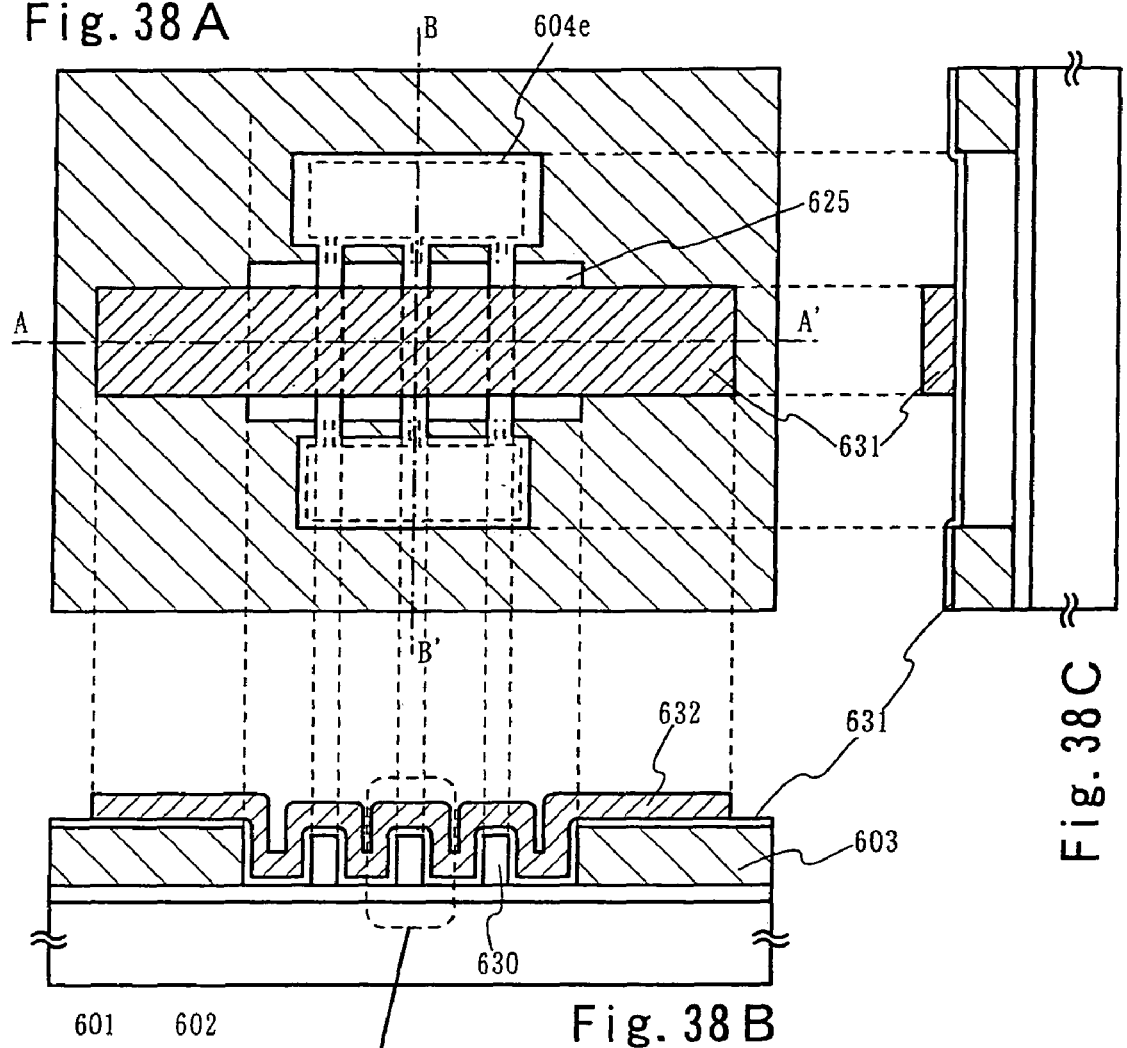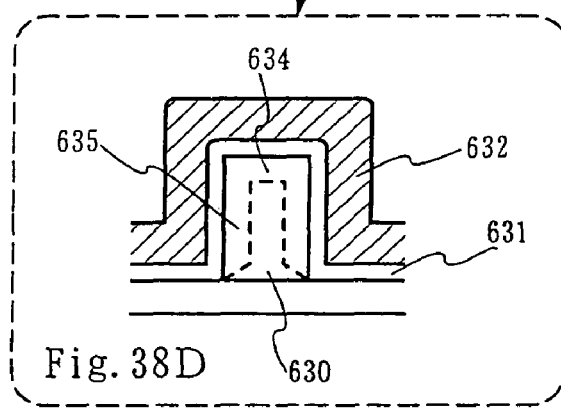

SEMICONDUCTOR DEVICE AND METHOD OF MANUFACTURING THE SAME

BACKGROUND OF THE INVENTION

1. Field of the Invention

The present invention relates to a semiconductor device formed from a semiconductor film that has a crystal structure as well as a method of manufacturing the same, and more specifically, to a semiconductor device including a field effect transistor whose channel formation region is formed from a crystalline semiconductor film on an insulating surface and a method of manufacturing the semiconductor device.

2. Description of the Related Art

A technique of forming an amorphous semiconductor film on a glass or other insulating substrate and crystallizing the film by laser light irradiation is known. A thin film transistor (hereinafter referred to as TFT) manufactured from a semiconductor film having a crystal structure (crystalline semiconductor film) is applied to planar display devices (flat panel displays), typically, liquid crystal display devices.

Laser light is applied to a semiconductor manufacturing process in the form of a technique of re-crystallizing a damaged layer or an amorphous layer in a semiconductor substrate or a semiconductor film and in the form of a technique of crystallizing an amorphous semiconductor film formed on an insulating surface. Laser oscillators usually used are gas lasers represented by excimer lasers and solid-state lasers represented by YAG lasers.

An example of crystallizing an amorphous semiconductor film by laser light irradiation is disclosed in JP 62-104117 A. In this example, the laser light scanning speed is set to the beam spot diameter multiplied by 5000 per second or faster to make an amorphous semiconductor film into a polycrystalline film through high-speed scanning without melting the film completely. Another known example is to use laser processing apparatus disclosed in JP 08-195357 A and process laser light into a linear beam by an optical system before irradiation.

JP 2001-144027 A discloses a technique of manufacturing a TFT in which a solid-state laser oscillator such as an Nd:YVO$_4$ laser is employed to irradiate an amorphous semiconductor film with the second harmonic of its laser light and to form a crystalline semiconductor film of larger grain size than prior art.

However, the mainstream method for forming on an insulating surface a high quality crystalline semiconductor film which has less defects and grain boundaries, or sub-grain boundaries and which is less fluctuated in orientation has been re-crystallization of a semiconductor film on a single crystal substrate after the film is heated and melted at high temperature, which is known as a zone melting method.

It is considered that the problem is that the method utilizes level differences of a base as in the known graphoepitaxy technique and crystals grow along the level differences to leave level differences on the surface of the obtained single crystal semiconductor film. In addition, a single crystal semiconductor film cannot be formed by graphoepitaxy on a glass substrate which has a relatively low distortion point.

On the other hand, when an amorphous semiconductor film formed on a flat surface is crystallized by laser light irradiation, polycrystals are obtained and defects such as grain boundaries are formed at random. Therefore crystals having the same orientation cannot be obtained.

A grain boundary has a large number of crystal defects, which serve as carrier traps and are considered as the cause of lowering in mobility of electrons or holes. It has been impossible to form a semiconductor film that has no defects, grain boundaries, or sub-grain boundaries caused by volume shrinkage of a semiconductor, thermal stress with a base, and lattice mismatch which accompany crystallization. Accordingly, it has been impossible for a crystalline semiconductor film formed on an insulating surface by crystallization or re-crystallization to achieve the quality of a MOS transistor formed on a single crystal substrate without bonding SOI (Silicon on Insulator).

For instance, when a semiconductor film is formed on a glass substrate to build a TFT, the TFT is arranged giving no regard to randomly-formed grain boundaries and therefore the crystallinity of a channel formation region of the TFT cannot be controlled strictly. The randomly-formed grain boundaries and crystal defects lower the characteristics and cause fluctuation in characteristic between elements.

SUMMARY OF THE INVENTION

The present invention has been made in view of the above problems, and an object of the present invention is therefore to provide a semiconductor device composed of a semiconductor element or a group of semiconductor elements, in which a crystalline semiconductor film having as few grain boundaries as possible in a channel formation region is formed on an insulating surface, which can operate at high speed, which have high current drive performance, and which are less fluctuated between elements.

In order to solve the above problems, the present invention forms an insulating film with an opening on a substrate having an insulating surface, forms on the insulating film and over the opening an amorphous semiconductor film or a polycrystalline semiconductor film that has randomly-formed grain boundaries, and forms a crystalline semiconductor film filling the opening with the crystalline semiconductor film. To elaborate, the crystalline semiconductor film is formed by melting the semiconductor film, pouring the melted semiconductor into the opening of the insulating film, and crystallizing or re-crystallizing the semiconductor film. Then the crystalline semiconductor film is removed except a portion of the crystalline semiconductor film that is in the opening. A gate insulating film is formed in contact with the top face of the crystalline semiconductor film and a gate electrode is formed over the gate insulating film. The above is a characteristic of the present invention.

The opening may be formed by direct etching treatment of the surface of the insulating substrate, or by etching treatment of a silicon oxide film, a silicon nitride film, a silicon oxynitride film, or the like. The opening is positioned in accordance with arrangement of an island-like semiconductor film including a channel formation region of a TFT and, desirably, positioned so as to coincide with at least the channel formation region. The opening extends in the channel length direction. The width of the opening (in the channel width direction when the opening coincides with the channel formation region) is equal to or more than 0.01 μm and equal to or less than 2 μm, preferably, equal to or more than 0.1 μm and equal to or less than 1 μm. The depth of the opening is equal to or more than 0.01 μm and equal to or less than 1 μm, preferably, equal to or more than 0.05 μm and equal to or less than 0.2 μm.

The semiconductor film formed on the insulating film and over the opening in an early stage is an amorphous semiconductor film or polycrystalline semiconductor film formed by plasma CVD, sputtering, or reduced pressure CVD, or a polycrystalline semiconductor film formed by solid-phase growth. An amorphous semiconductor film in the present invention refers not only to a film of a thoroughly amorphous structure in the strict sense but also to a film including minute crystal grains or a microcrystalline semiconductor film, and to a semiconductor film having a crystal structure in some places. Typically, an amorphous silicon film is employed. Other than that, an amorphous silicon germanium film, an amorphous silicon carbide film, or the like is employable. The term polycrystalline semiconductor film refers to a film obtained by crystallizing one of these amorphous semiconductor films through a known method.

The means for melting and crystallizing a semiconductor film is pulse oscillation or continuous wave laser light emitted from a gas laser oscillator or a solid-state laser oscillator. The laser light is collected by an optical system into a linear shape. The intensity of the laser light may be uniform in the longitudinal direction while it is varied in the lateral direction. A laser oscillator used as the light source is a rectangular beam solid-state laser oscillator, and a slab laser oscillator is particularly preferable. Alternatively, a solid-state laser oscillator using a rod doped with Nd, Tm, or Ho may be employed. Specifically, it is a combination of a slab structure amplifier and a solid-state laser oscillator using a crystal such as YAG, $YVO_4$, YLF, or $YAlO_3$ doped with Nd, Tm, or Ho. A slab material used is a crystal such as Nd:YAG, Nd:GGG (gadolinium gallium garnet), or Nd:GsGG (gadolinium scandium gallium garnet). Laser light of a slab laser travels along a zigzag light path in this plate-like laser medium repeating total reflection.

Intense light similar to the above laser light may also be used. For example, light radiated from a halogen lamp, a xenon lamp, a high-pressure mercury lamp, a metal halide lamp, or an excimer lamp is collected by a mirror reflector, a lens or the like to obtain light of high energy density.

The semiconductor film is irradiated with laser light or intense light collected into a linear shape and expanded in the longitudinal direction. Moving the laser light irradiation position and the substrate on which the crystalline semiconductor film is formed relatively, laser light runs over a part or the entire surface of the crystalline semiconductor film to melt and crystallize or re-crystallize the crystalline semiconductor film. The laser light scanning direction is set to the longitudinal direction of the opening or the channel length direction of the transistor. This way crystals grow along the laser light scanning direction and grain boundaries or sub-grain boundaries are prevented from crossing the channel length direction.

A semiconductor device of the present invention which is manufactured as described above is characterized in that an insulating film with an opening is formed on a substrate having an insulating surface, that a region of a crystalline semiconductor film formed on the substrate fills the opening, and that a channel formation region is placed in the filling region. A semiconductor device of the present invention is characterized in that a crystalline semiconductor formed over an insulating surface, contacting a pair of impurity regions of one conductivity type, having at least two crystal orientations and having at least two crystal grains which extend in a direction parallel to a channel length direction without forming a grain boundary, and that the crystalline semiconductor film is in an opening that is as deep as the thickness of the crystalline semiconductor film.

Another structure of the present invention is characterized in that an insulating film with an opening is formed on a substrate having an insulating surface, the opening extending in the channel length direction, that a region of a crystalline semiconductor film formed on the substrate fills the opening, that a channel formation region is placed in the filling region, and that the opening is as deep as the crystalline semiconductor film or deeper.

The present invention has that a crystalline semiconductor formed over an insulating surface, contacting a pair of impurity regions of one conductivity type, having at least two crystal orientations and having at least two crystal grains which extend in a direction parallel to a channel length direction without forming a grain boundary, and the semiconductor device has a structure in which a channel is formed by the crystalline semiconductor film and a conductive layer overlapping the crystalline semiconductor film with an insulating layer interposed therebetween, and the present invention is characterized in that the crystalline semiconductor film measures in channel width direction equal to or more than 0.01 µm and equal to or less than 2 µm, preferably equal to or more than 0.1 µm and equal to or less than 1 µm, and has a thickness of equal to or more than 0.01 µm and equal to or less than 1 µm, preferably equal to or more than 0.05 µm and equal to or less than 0.2 µm, and that the crystalline semiconductor film is formed in an opening that is as deep as the thickness of the crystalline semiconductor film.

By setting the depth of the opening equal to the thickness of the semiconductor film, the semiconductor melted by irradiation of laser light or intense light aggregates and solidifies in the opening (concave) through surface tension. As a result, the semiconductor film is thinned in the opening (convex) to cause the stress deformation to concentrate on the thinned region. The side faces of the opening have an effect of determining the crystal orientation to a certain degree. The angle of the side faces of the opening with respect to the substrate surface is 5 to 90°, preferably 30 to 90°. Laser light runs over the semiconductor film in the direction parallel to the channel length direction, thereby orienting crystals primarily in a specific crystal orientation along the opening extending in this direction.

After the semiconductor film is melted by irradiation of laser light or intense light, solidification of the film starts from the region where the bottom and side faces of the opening meet and crystal growth begins from this region. For example, thermal analysis simulation is performed on points A to D in the coordinate system where an insulating film (1) and an insulating film (2) form a level difference as shown in FIG. 39. As a result, characteristics shown in FIG. 40 are obtained. Heat is transmitted to two places; the insulating film (2) right under the semiconductor film and the insulating film (1) by the semiconductor film. Therefore the temperature is lowered the quickest at the point B. The second quickest is the point A, and points C and D follow in this order. This simulation result is for when the angle of the side faces is 45°. However, qualitatively, similar phenomenon will take place when the side face angle is 90°. To summarize, deformation accompanying crystallization can be centered on a region other than the opening by melting the semiconductor film once, utilizing surface tension to gather the melted semiconductor film in the opening formed on the insulating surface, and starting crystal growth from the vicinity of the point where the bottom and side faces of the opening meet. Accordingly, the crystalline semiconductor film filling the opening can be freed from deformation.

Then the crystalline semiconductor film which remains on the insulating film and which contains grain boundaries and crystal defects are removed by etching.

The present invention described above makes it possible to specify the location for forming a semiconductor element such as a transistor, in particular, a channel formation region of a TFT, so that a crystalline semiconductor film having no grain boundaries is obtained. This eliminates causes of fluctuation such as randomly-formed grain boundaries and crystal defects, and provides a TFT or a group of TFTs less fluctuated in characteristic.

BRIEF DESCRIPTION OF THE DRAWINGS

In the accompanying drawings:

FIGS. 10A to 10F are a top view and vertical sectional views illustrating a process of manufacturing a TFT in accordance with the present invention;

FIG. 13 is an arrangement diagram showing a mode of a laser irradiation apparatus employed in the present invention;

FIGS. 31A to 31C are a top view and vertical sectional views illustrating a process of manufacturing a TFT in accordance with the present invention;

FIGS. 32A to 32C are a top view and vertical sectional views illustrating a process of manufacturing a TFT in accordance with the present invention;

FIGS. 33A to 33C are a top view and vertical sectional views illustrating a process of manufacturing a TFT in accordance with the present invention;

FIGS. 34A to 34C are a top-view and vertical sectional views illustrating a process of manufacturing a TFT in accordance with the present invention;

FIGS. 38A to 38D are a top view and vertical sectional views illustrating an example of a TFT manufactured in accordance with the present invention;

DETAILED DESCRIPTION OF THE PREFERRED EMBODIMENTS

Embodiments of the present invention will be described in detail with reference to drawings. However, the present invention is not limited to the following description and a person skilled in the art will readily understand that the mode and details of the present invention can be modified in various ways without departing from the spirit and scope of the invention. Accordingly, the present invention should not be limited by the contents of the following embodiments.

The present invention forms an insulating film with an opening on a substrate having an insulating surface, forms on the insulating film and over the opening an amorphous semiconductor film or a polycrystalline semiconductor film that has randomly-formed grain boundaries, and forms a crystalline semiconductor film filling the opening with the crystalline semiconductor film. This mode is described first with reference to FIG. 27.

Figure 27:
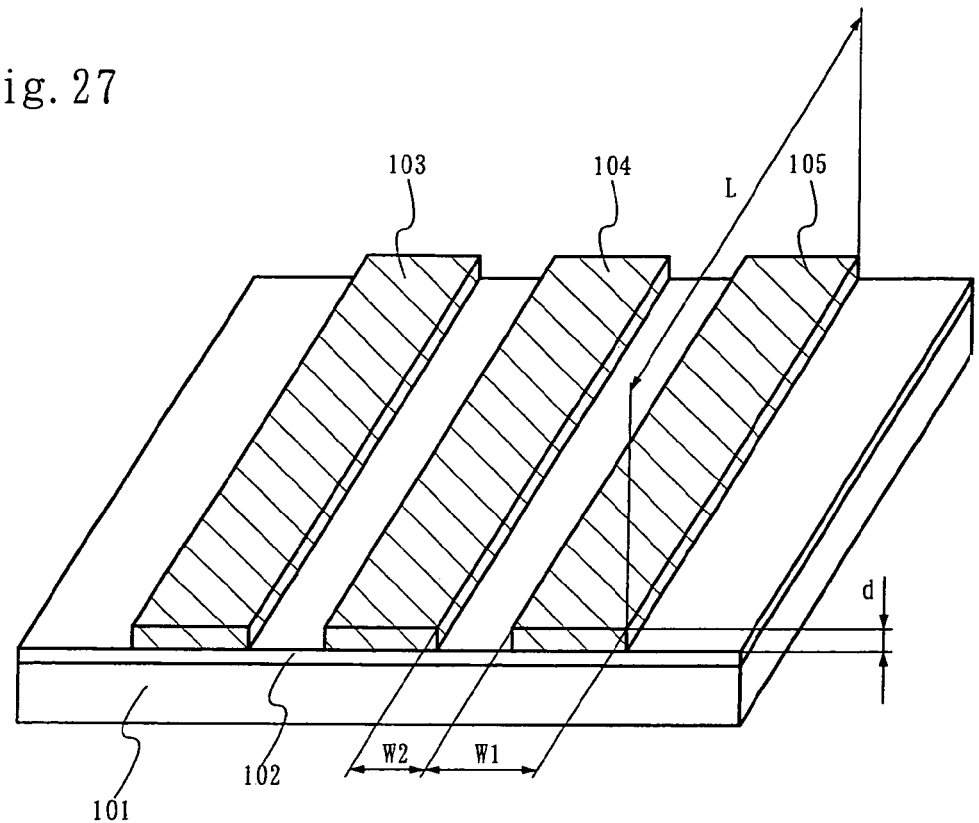
FIG. 27 is a perspective view illustrating a crystallization method in the present invention.

The perspective view of FIG. 27 shows a mode in which a first insulating film 102 and second insulating films 103 to 105 shaped like belts by patterning are formed on a substrate 101. The second insulating films here draw three belt patterns but the number of belts is not limited to 3. The substrate 101 is a commercially-available non-alkaline glass substrate, quartz substrate, sapphire substrate, single crystal substrate, or polycrystalline semiconductor substrate with its surface covered by an insulating film. Alternatively, the substrate 101 may be a metal substrate with its surface covered with an insulating film.

The width W1 of each of the belt-like second insulating films is 0.1 to 10 μm (preferably 0.5 to 1 μm). The gap W2 between adjacent second insulating films is 0.1 to 5 μm (preferably 0.5 to 1 μm). The thickness d of each of the second insulating films is the same as the thickness of a non-single crystal semiconductor film formed thereon, or more. The level differences may not always appear regularly and periodically but it is sufficient if level differences are formed to suit the placement and shape of an island-like semiconductor region including a channel formation region of a TFT. Accordingly, the length L of each of the second insulating films is also unlimited and it is sufficient if the second insulating films are long enough to form a channel formation region of a TFT, for example.

The first insulating film is formed of silicon nitride or silicon nitroxide. The second insulating films are formed of silicon oxide or silicon oxynitride. A silicon oxide film can be formed by plasma CVD using a mixture of tetraethyl ortho silicate (TEOS) and $O_2$. A silicon nitroxide film can be formed by plasma CVD using as material $SiH_4$, $NH_3$, and $N_2O$, or $SiH_4$ and $N_2O$.

When the concave and convex by the opening are formed from the first insulating film and the second insulating films as in FIG. 27, it is desirable to suitably adjust the material and film forming conditions so as to make the relative etching rate of the second insulating films faster and ensure the selective ratio in the etching processing. It is also desirable for the insulating films to have an effect of blocking sodium or other alkaline metal ions. The angle of the side faces of the opening formed from the second insulating films with respect to the substrate surface is set suitably within a range of 5 to 90°, preferably 30 to 90°.

Figure 28:
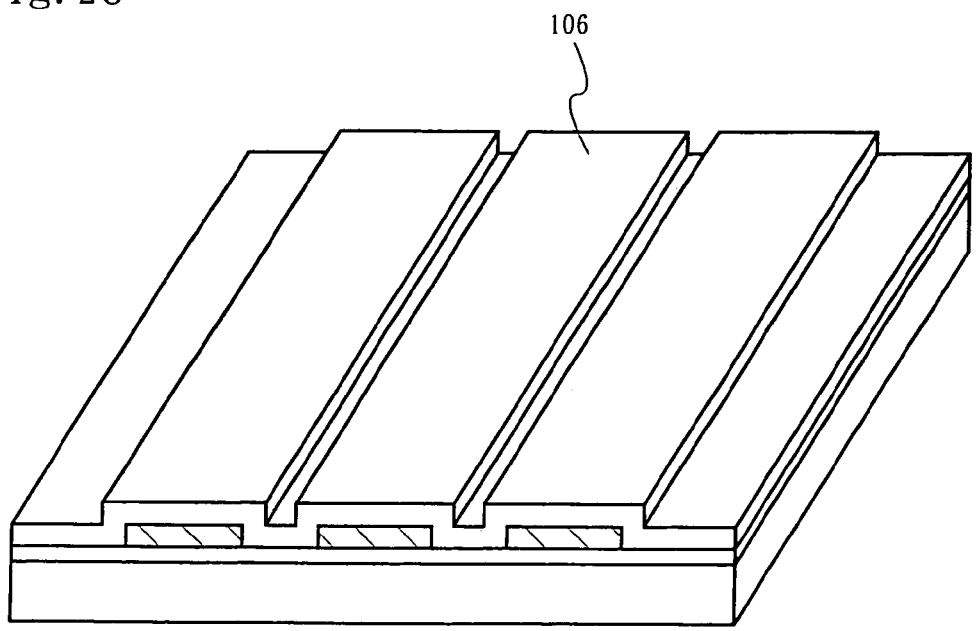
FIG. 28 is a perspective view illustrating a crystallization method in the present invention.

As shown in FIG. 28, an amorphous semiconductor film 106 with a thickness of 50 to 200 nm covers the surface comprised of the first insulating film 102 and the second insulating films 103 to 105 as well as the opening. The amorphous semiconductor film is formed of silicon, a compound or alloy of silicon and germanium, or a compound or alloy of silicon and carbon.

The amorphous semiconductor film 106 is irradiated with continuous wave laser light for crystallization. The laser light employed is collected and expanded by an optical system to have a linear shape. The intensity of the laser light may be uniform in the longitudinal direction while it is varied in the lateral direction. A laser oscillator used as the light source is a rectangular beam solid-state laser oscillator, and a slab laser oscillator is particularly preferable. Alternatively, a solid-state laser oscillator using a rod doped with Nd, Tm, or Ho may be employed. Specifically, it is a combination of a slab structure amplifier and a solid-state laser oscillator using a crystal such as YAG, $YVO_4$, YLF, or $YAlO_3$ doped with Nd, Tm, or Ho. As indicated by the arrow in the drawing, the laser light runs in the direction intersecting the longitudinal direction of the linear shape. Most desirably, the laser light runs in the direction parallel to the longitudinal direction of the belt-like pattern formed on the base insulating film. The linear shape here means one that is 10 or more times longer in the longitudinal direction than in the lateral direction.

A slab material used is a crystal such as Nd:YAG, Nd:GGG (gadolinium gallium garnet), or Nd:GsGG (gadolinium scandium gallium garnet). Laser light of a slab laser travels along a zigzag light path in this plate-like laser medium repeating total reflection.

Taking into consideration the absorption coefficient of the amorphous semiconductor film, the wavelength of the continuous wave laser light is desirably 400 to 700 nm. Light of this wavelength band is obtained by picking the second harmonic or third harmonic of the fundamental wave through a wavelength converting element. Employable wavelength converting elements are ADP (ammonium dihydrogen phosphate), $Ba_2NaNb_5O_{15}$ (barium sodium niobate), CdSe (cadmium selenium), KDP (kalium dihydrogen-phosphate), $LiNbO_3$ (lithium niobate), Se, Te, LBO, BBO, KB5, etc. LBO is particularly desirable. In a typical example, the second harmonic (532 nm) of a Nd:$YVO_4$ laser oscillator (fundamental wave: 1064 nm) is used. The laser oscillation mode employed is the single mode that is the $TEM_{oo}$ mode.

In the case of silicon, which is chosen as the most suitable material, a region where the absorption coefficient is $10^3$ to $10^4$ cm$^{-1}$ is mostly in the visible light range. When crystallizing an amorphous semiconductor film that is formed of silicon to a thickness of 30 to 200 nm on a substrate formed of glass or other substance highly transmissive of visible light, the semiconductor region can be selectively heated and crystallized without damaging the base insulating film by irradiation of visible light having a wavelength of 400 to 700 nm. Specifically, the penetration length of light having a wavelength of 532 nm in an amorphous silicon film is about 100 nm to 1000 nm, and therefore the light can reach the inside of the amorphous semiconductor film 106 having a thickness of 30 to 200 nm sufficiently. This means that the semiconductor film can be heated from the inside and that nearly the entire semiconductor film in the laser light irradiation region can be heated uniformly.

Figure 29:
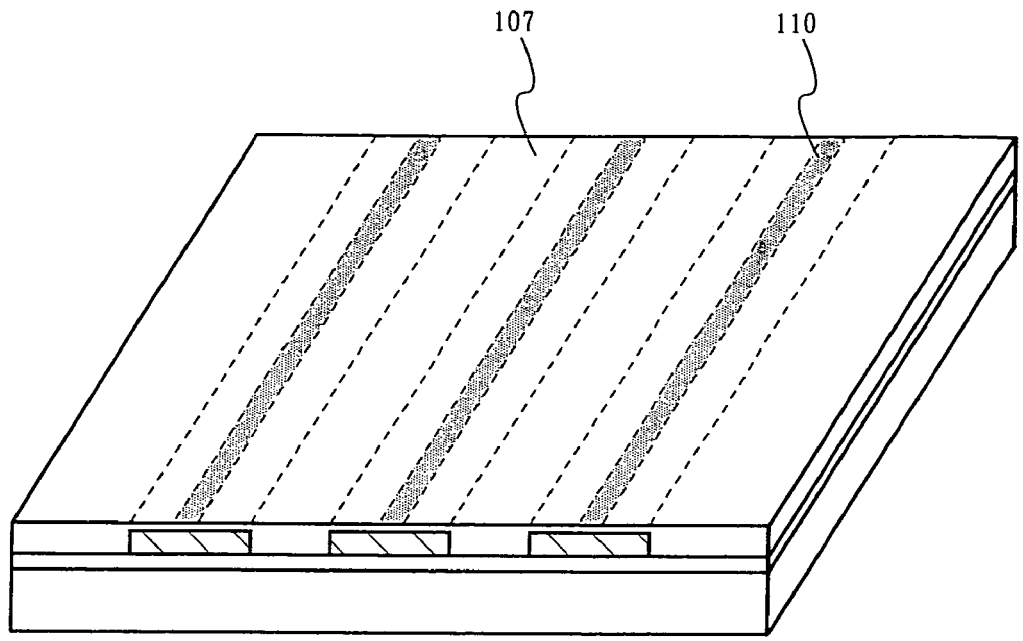
FIG. 29 is a perspective view illustrating a crystallization method in the present invention.

The semiconductor melted by laser light irradiation gathers in the openings (concave portions) through surface tension. The semiconductor then solidifies to obtain a mostly flat surface as shown in FIG. 29. Crystal growth ends and grain boundaries or sub-grain boundaries are formed on the second insulating films (on the convex portions) (hatched regions 110 in the drawing). Thus formed is a crystalline semiconductor film 107.

Figure 30:
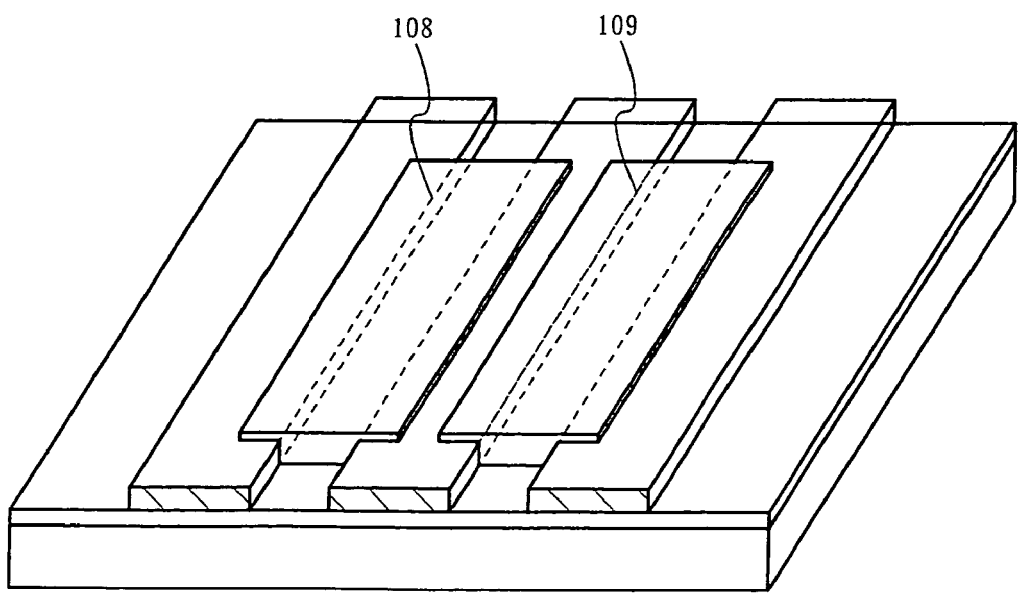
FIG. 30 is a perspective view illustrating a crystallization method in the present invention.

Thereafter, the crystalline semiconductor film 107 is etched as shown in FIG. 30 to form island-like semiconductor regions 108 and 109. Through the etching, the regions 110 where growth ends and grain boundaries or sub-grain boundaries are concentrated are removed by etching, thereby leaving only good quality semiconductor regions. A gate insulating film and a gate electrode are formed from the island-like semiconductor regions 108 and 109, in particular, the crystalline semiconductor filling the openings (concave portions) so that channel formation regions are positioned at the openings. TFTs are completed through these steps.

FIGS. 2A to 2E are conceptual diagrams showing knowledge about crystallization which has been obtained through results of an experiment conducted by the present inventors. Schematically shown in FIGS. 2A to 2E is the depth and interval of openings (concave portions) comprised of the first insulating film and the second insulating films in relation to crystal growth.

In FIGS. 2A to 2E, as Reference Symbols concerning length, t01 denotes the thickness of the amorphous semiconductor film on the second insulating films (convex portions), t02, the thickness of the amorphous semiconductor film in the openings (concave portions), t11, the thickness of the crystalline semiconductor film on the second insulating films (convex portions), t12, the thickness of the crystalline semiconductor film in the openings (concave portions), d, the thickness of each second insulating film (the depth of each opening), W1, the width of each second insulating film, and W2, the width of each opening. Denoted by 201 is the first insulating film, 202, the second insulating films, and 203, a third insulating film.

Figure 2A:
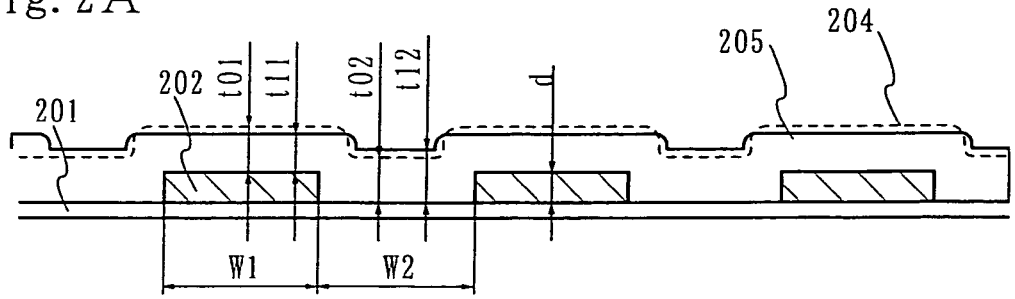
FIGS. 2A to 2E are vertical sectional views illustrating in detail the relation between the shape of an opening and the form of a crystalline semiconductor film in crystallization.

FIG. 2A shows a case in which d<t02 and W1 and W2 are each equal to or less than 1 μm. When the depth of each opening (groove) is smaller than the thickness of an amorphous semiconductor film 204, the surface of a crystalline semiconductor film 205 obtained through melt crystallization is not flat enough because the openings are shallow. In other words, most of the level differences of the base of the crystalline semiconductor film 205 remain.

Figure 2B:
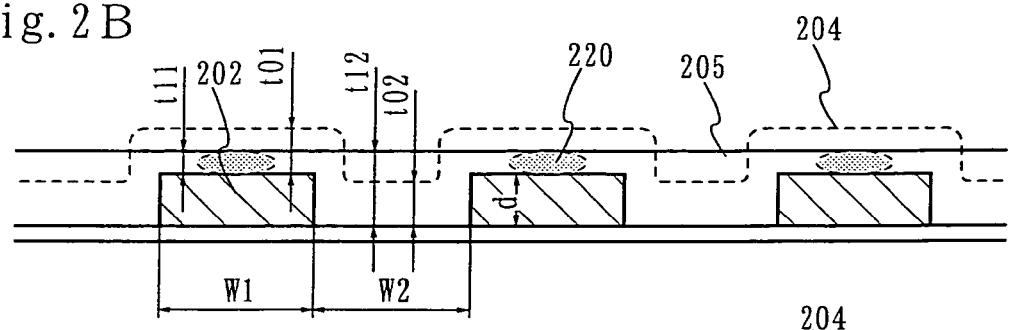

FIG. 2B shows a case in which d≧t02 and W1 and W2 are each equal to or less than 1 μm. When the depth of each opening (groove) is mostly equal to or more than the thickness of an amorphous semiconductor film 204, the semiconductor gathers in the openings (concave portions) through surface tension. The semiconductor then solidifies to obtain a mostly flat surface as shown in FIG. 2B. In this case, t11<t12 and stress is concentrated on thin portions 220 on the second insulating films 202. As a result, distortion accumulates in the regions 220 to form grain boundaries.

Figure 2C:
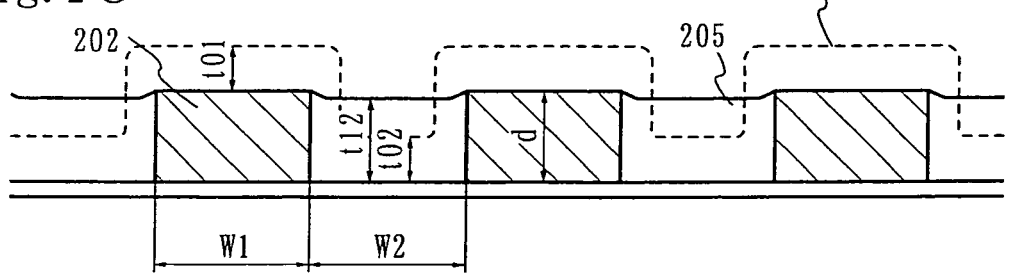

FIG. 2C shows a case in which d>t02 and W1 and W2 are each equal to or less than 1 μm. In this case, a crystalline semiconductor film 205 can be formed so as to fill the openings while almost no crystalline semiconductor film is left on the second insulating films 202.

Figure 2D:
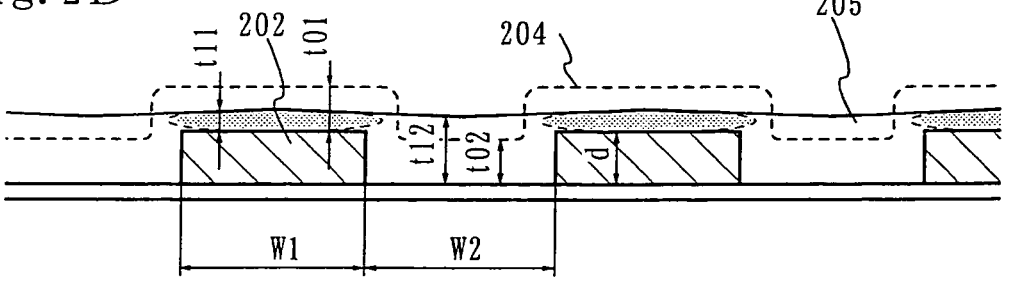

FIG. 2D shows a case in which d≧t02 and W1 and W2 are each equal to or slightly larger than 1 μm. When the openings are wide, a crystalline semiconductor film 205 fills the openings to provide the leveling effect. On the other hand, grain boundaries and sub-grain boundaries are formed about the center of the openings. Stress is concentrated not only on the openings but also on the second insulating films and distortion accumulates in there to form grain boundaries. This is supposedly because an increase in interval lowers the stress relieving effect.

Figure 2E:
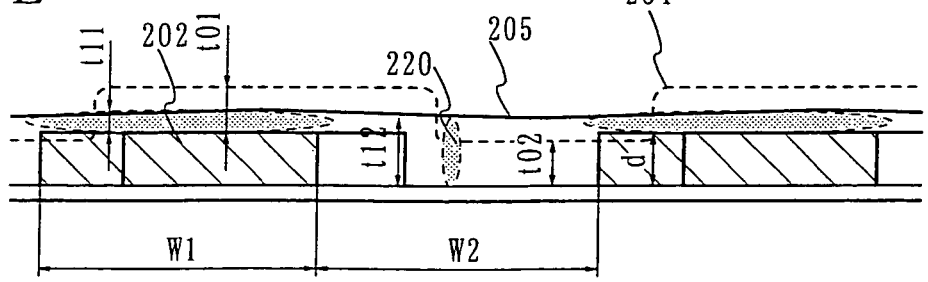

FIG. 2E shows a case in which d≧t02 and W1 and W2 are each larger than 1 μm. In FIG. 2E, the state of FIG. 2D is more prominent.

Figure 21:
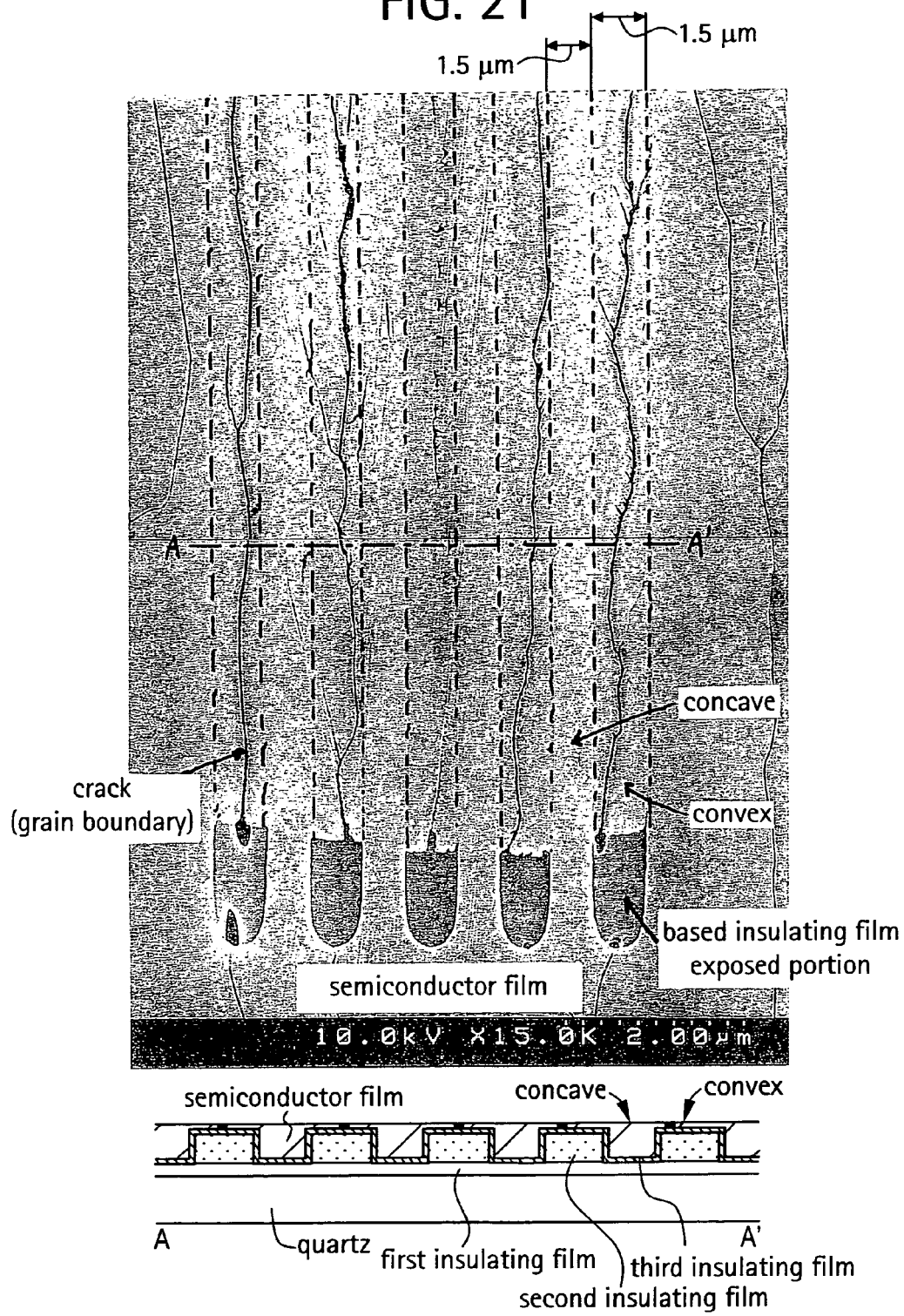
FIG. 21 is a scanning electron microscope (SEM) photograph (after Secco etching) showing a surface state of an amorphous silicon film formed to a thickness of 150 nm and crystallized on a base insulating film that has a 170 nm deep level difference and 1.5 µm width convex portions with an interval of 1.5 µm.
Figure 22:
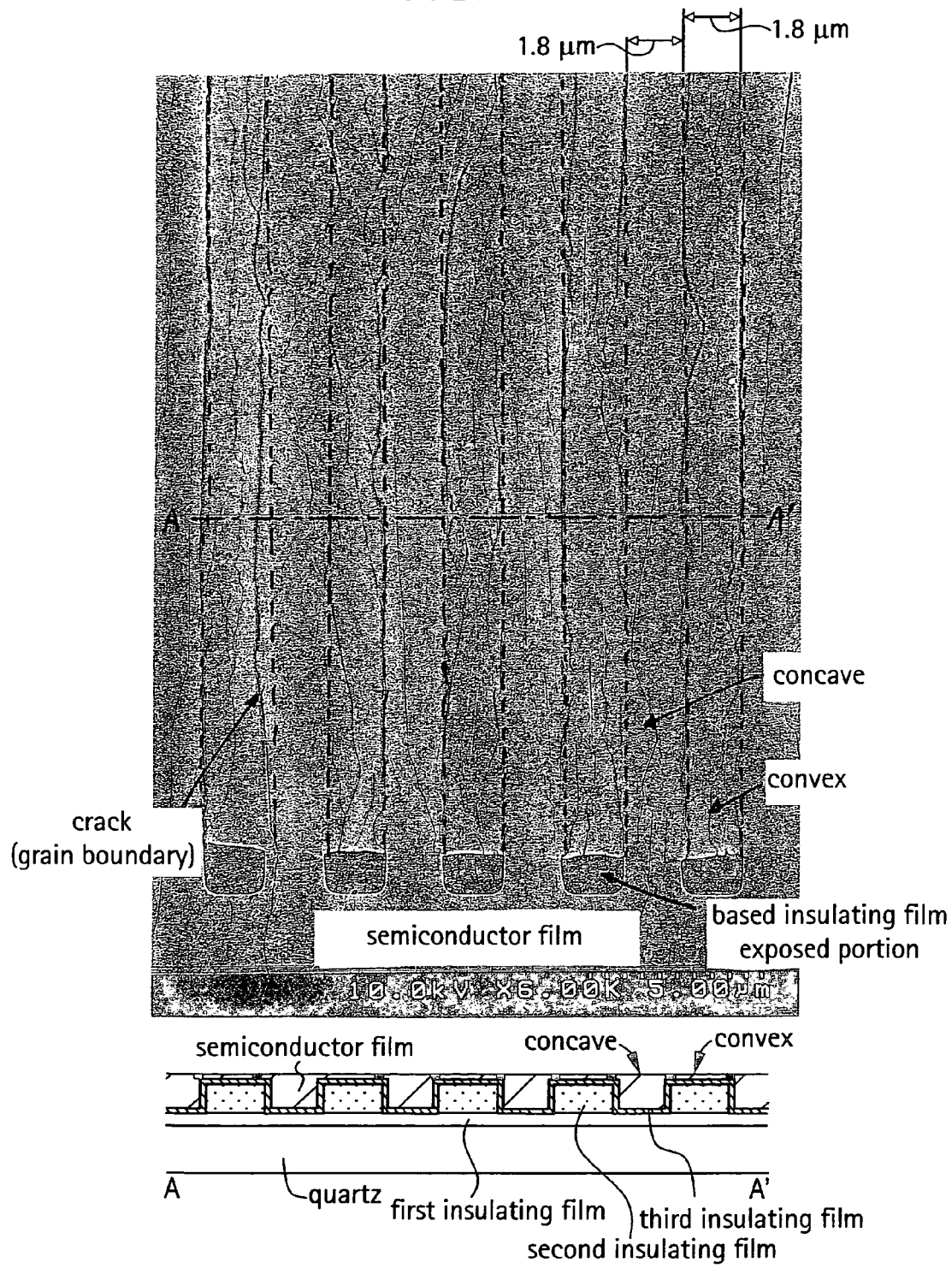
FIG. 22 is a scanning electron microscope (SEM) photograph (after Secco etching) showing a surface state of an amorphous silicon film formed to a thickness of 150 nm and crystallized on a base insulating film that has a 170 nm deep level difference and 1.8 µm width convex portions with an interval of 1.8 µm.

The scanning electron microscope (SEM) picture of FIG. 22 shows an example thereof. In the example, an amorphous silicon film is formed to a thickness of 150 nm and crystallized on a base insulating film where a 170 nm deep level difference is formed and 1.8 μm width convex portions are formed with an interval of 1.8 μm. The surface of the crystalline semiconductor film is etched by a Secco solution in order to show grain boundaries clearly. In comparison with FIG. 21, it is apparent that grain boundaries here are not convex portions forming level differences but are spread out over the entire surface. It is impossible in such structure to pick out a crystalline semiconductor film that has no grain boundaries.

As described above referring to FIGS. 2A to 2E, the mode of FIG. 2B is most suitable to form a semiconductor element, in particular, a TFT. In the examples shown here, concave and convex of a base for forming a crystalline semiconductor film are comprised of a first insulating film and a second insulating film. However, the present invention is not limited to the mode shown here and others can be used to form the concave and convex as long as the shape is the same. For instance, the concave and convex may be obtained by directly forming openings through etching treatment of the surface of a quartz substrate.

FIG. 13 shows an example of the structure of laser processing apparatus that can be used in crystallization. FIG. 13 is a frontal view and side view showing the structure of laser processing apparatus, which is composed of laser oscillators 401a and 401b, a shutter 402, high conversion efficiency mirrors 403 to 406, cylindrical lenses 407 and 408, a slit 409, a mount base 411, driving means 412 and 413, control means 414, information processing means 415, etc. The driving means 412 and 413 move the mount base 411 in the direction X and the direction Y. The control means 414 controls the driving means. The information processing means 415 sends signals to the laser oscillator 401 and the control means 414 based on a program that is stored in advance.

The laser oscillators are rectangular beam solid-state laser oscillators, and slab laser oscillators are particularly preferable. Alternatively, a combination of a slab structure amplifier and a solid-state laser oscillator using a crystal such as YAG, YVO$_4$, YLF, or YAlO$_3$ doped with Nd, Tm, or Ho may be employed. A slab material used is a crystal such as Nd:YAG; Nd:GGG (gadolinium gallium garnet), or Nd:GsGG (gadolinium scandium gallium garnet). Other than those, continuous wave gas laser oscillators and solid-state laser oscillators may also be employed. The continuous wave solid-state laser oscillator employed uses a crystal such as YAG, YVO$_4$, YLF, or YAlO$_3$ doped with Cr, Nd, Er, Ho, Ce, Co, Ti, or Tm. Although the fundamental wave of the oscillation wavelength is varied depending on the material used in doping, laser light oscillates in a wavelength range of 1 μm to 2 μm. A solid-state laser oscillator utilizing diode excitation may be connected by cascade connection to obtain a 5 W or higher output.

Circular or rectangular laser light outputted from such laser oscillators is collected by the cylindrical lenses 407 and 408 into a linear shape in section on the irradiation surface. The high conversion efficiency mirrors are suitably adjusted such that the laser light enters the irradiation object obliquely (at an angle of 10 to 80°) in order to prevent interference on the irradiation surface. The cylindrical lenses 407 and 408 are formed of synthesized quartz to obtain high transmittance. The surfaces of the cylindrical lenses are coated to obtain 99% or higher transmittance for the wavelength of the laser light. The laser light may not always be linear in section on the irradiation surface and may be of any shape such as rectangular, elliptical, and oblong. In either case, the ratio of the major axis of the laser light to its minor axis ranges between 1:10 to 1:100. A wavelength converting element 410 is provided to obtain second harmonic of the fundamental wave.

The driving means 412 and 413 move the mount base 411 in two axial directions to perform laser processing on a substrate 420. The mount base may be continuously moved in one direction over a distance longer than the length of one side of the substrate 420 at a uniform velocity of 1 to 200 cm/sec, preferably 5 to 75 cm/sec. The mount base may be intermittently moved in steps in the other direction over a distance equal to the length in the longitudinal direction of the linear beam. Oscillation of the laser oscillators 401a and 401b and movement of the mount base 411 are synchronized by the information processing means 415 that has a microprocessor mounted thereto.

The base mount 411 linearly moves in the direction X in the drawing, so that the entire surface of the substrate can be processed with laser light radiated from the fixed optical system. Position detecting means 416 detects that the substrate 420 is in the laser light irradiation position and sends a signal to the information processing means 415. Receiving the signal, the information processing means 415 synchronizes laser light irradiation timing. That is, when the substrate 420 is not in the laser light irradiation position, the shutter 402 is closed to stop laser light irradiation.

Laser light emitted from the thus structured laser irradiation apparatus irradiates the substrate 420 relatively moving in the direction X or direction Y in the drawing. This way a desired region or the entire surface of the semiconductor film can be processed.

As described above, level differences are formed on a base insulating film and an amorphous semiconductor film is crystallized by irradiation of continuous wave laser light, thereby making distortion or stress that accompanies crystallization concentrate on the level differences while avoiding the distortion or stress on the crystalline semiconductor that serves as an active layer. A TFT is formed such that its channel formation region is placed in the crystalline semiconductor film that has been relieved from the distortion or stress. This improves the current drive performance at high speed as well as the reliability of the element.

Embodiment 1

Referring to FIGS. 1A to 1E, explanations will be given on the above-described mode of the present invention. FIGS. 1A to 1E are vertical sectional views illustrating a process of forming a crystalline semiconductor film of the present invention.

Figure 1A:
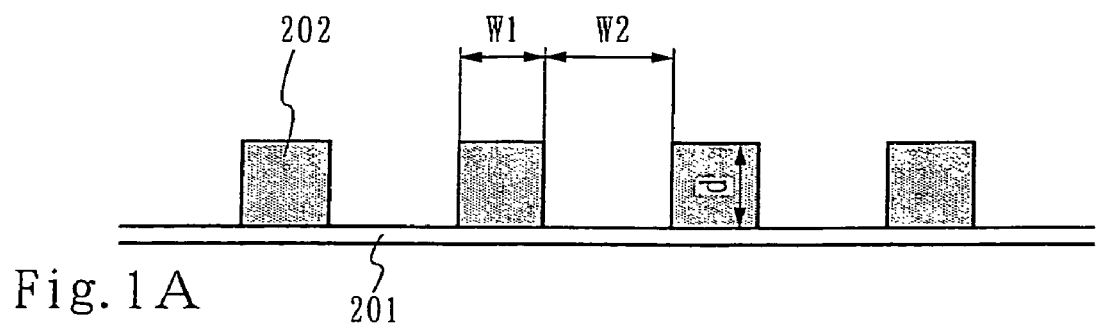
FIGS. 1A to 1E are diagrams illustrating a crystallization method in the present invention.

In FIG. 1A, a first insulating film 201 is formed to a thickness of 30 to 300 nm from silicon nitride, silicon oxynitride whose nitrogen content is larger than its oxygen content, aluminum nitride, or aluminum oxynitride. On the first insulating film 201, a second insulating film 202 is formed from silicon oxide or silicon oxynitride to a thickness of 10 to 1000 nm, preferably 50 to 200 nm. The second insulating film 202 has openings having a desired shape. A desired shape may be a rectangle, a circle, a polygon, a belt, or a shape matching the shape of an island-like semiconductor film (active layer) of a TFT to be manufactured. A silicon oxide film can be formed by plasma CVD using a mixture of tetraethyl ortho silicate (TEOS) and $O_2$. A silicon oxynitride film can be formed by plasma CVD using as material $SiH_4$ and $N_2O$, or $SiH_4$, $NH_3$, and $N_2O$.

The first insulating film 201 and the second insulating film are selectively etched using buffer fluoric acid or by dry etching that uses $CHF_3$. In either case, it is desirable to suitably adjust the material and film forming conditions so that the second insulating film is etched at a relatively faster rate than the first insulating film and the selective ratio in the etching processing is ensured. The angle of the side faces of the openings in the second insulating film is set suitably within a range of 5 to 90°, preferably 30 to 90°.

The substrate used is a commercially-available non-alkaline glass substrate, quartz substrate, sapphire substrate, single crystal substrate, or polycrystalline semiconductor substrate with its surface covered with an insulating film. Alternatively, a metal substrate with its surface covered with an insulating film may be employed.

The width W1 of the second insulating films 202 remaining after the etching is not limited but is 0.1 to 10 μm. The width W2 of each opening in the second insulating film 202 is 0.01 to 2 μm (preferably 0.1 to 1 μm). The thickness d of the second insulating film is 0.01 to 1 μm (preferably 0.05 to 0.2 μm). The length of each opening (in the direction perpendicular to the paper face) is not particularly limited and the openings may be linear or curved. It is sufficient if each opening is long enough to form a channel formation region of a TFT, for example.

Figure 1B:
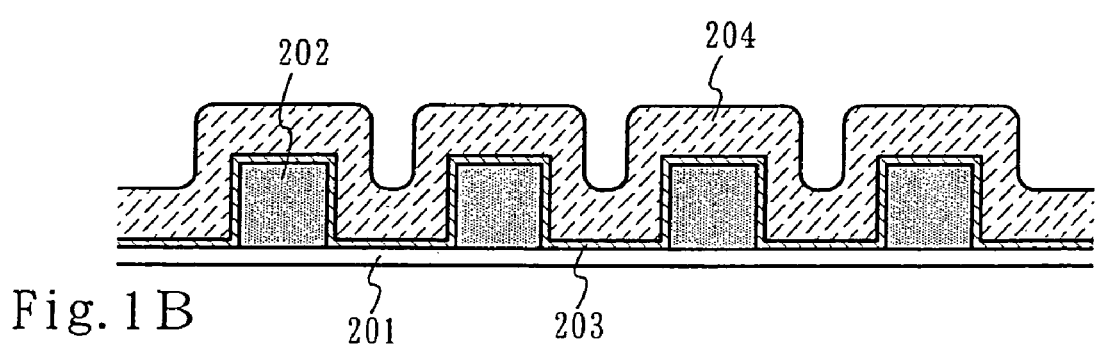

As shown in FIG. 1B, an amorphous semiconductor film 204 with a thickness of 0.2 to 3 μm (preferably 0.5 to 1.5 μm) is formed to cover the surface and openings comprised of the first insulating film 201 and the second insulating film 202. In other words, a desirable thickness of the amorphous semiconductor film 204 is equal to or more than the depth of the openings formed in the second insulating film. The amorphous semiconductor film is formed of silicon, a compound or alloy of silicon and germanium, or a compound or alloy of silicon and carbon. As shown in the drawing, the amorphous semiconductor film is formed on the base insulating film and over the opening so that the semiconductor is deposited reflecting the level differences of the base. It is preferable to form as a third insulating film 203 a silicon oxynitride film under the amorphous semiconductor film by forming the films in the same film formation apparatus in succession without exposing them to the air. This removes influence of chemical contamination such as boron adhered to the surfaces of the first insulating film and second insulating film and also prevents direct contact between silicon nitride and the amorphous semiconductor film.

The amorphous semiconductor film 204 is melted in an instant and crystallized. In crystallization, the semiconductor film is irradiated with laser light or light emitted from a lamp light source after the irradiation is collected by an optical system to have an energy density enough to melt the semiconductor film. In this step, laser light emitted from a continuous wave laser oscillator is preferable. The laser light used is collected into linear shape and expanded in the longitudinal direction by an optical system. The intensity of the laser light is desirably uniform in the longitudinal direction while it is varied in the lateral direction.

A laser oscillator used is a rectangular beam solid-state laser oscillator, and a slab laser oscillator is particularly preferable. A slab material used is a crystal such as Nd:YAG, Nd:GGG (gadolinium gallium garnet), or Nd:GsGG (gadolinium scandium gallium garnet). Laser light of a slab laser travels along a zigzag light path in this plate-like laser medium repeating total reflection. Alternatively, a solid-state laser oscillator using a rod doped with Nd, Tm, or Ho may be employed. Specifically, it is a combination of a slab structure amplifier and a solid-state laser oscillator using a crystal such as YAG, $YVO_4$, YLF, or $YAlO_3$ doped with Nd, Tm, or Ho. As indicated by the arrow in the drawing, the laser light runs in the direction intersecting the longitudinal direction of the linear shape. The linear shape here means one that is 10 or more times longer in the longitudinal direction than in the lateral direction.

Taking into consideration the absorption coefficient of the amorphous semiconductor film, the wavelength of the continuous wave laser light is desirably 400 to 700 nm. Light of this wavelength band is obtained by picking the second harmonic or third harmonic of the fundamental wave through a wavelength converting element. Employable wavelength converting elements are ADP (ammonium dihydrogen phosphate), $Ba_2NaNb_5O_{15}$ (barium sodium niobate), CdSe (cadmium selenium), KDP (kalium dihydrogen phosphate), $LiNbO_3$ (lithium niobate), Se, Te, LBO, BBO, KB5, etc. LBO is particularly desirable. In a typical example, the second harmonic (532 nm) of a Nd:$YVO_4$ laser oscillator (fundamental wave: 1064 nm) is used. The laser oscillation mode employed is the single mode that is the TEM$_{oo}$ mode.

In the case of silicon, which is chosen as the most suitable material, a region where the absorption coefficient is $10^3$ to $10^4$ cm$^{-1}$ is mostly in the visible light range. When crystallizing an amorphous semiconductor film that is formed of silicon to a thickness of 30 to 200 nm on a substrate formed of glass or other substance highly transmissive of visible light, the semiconductor film can be selectively heated and crystallized without damaging the base insulating film by irradiation of visible light having a wavelength of 400 to 700 nm. Specifically, the penetration length of light having a wavelength of 532 nm in an amorphous silicon film is about 100 nm to 1000 nm, and therefore the light can reach the inside of the amorphous semiconductor film 204 having a thickness of 30 to 200 nm sufficiently. This means that the semiconductor film can be heated from the inside and that nearly the entire semiconductor film in the laser light irradiation region can be heated uniformly.

Figure 1C:
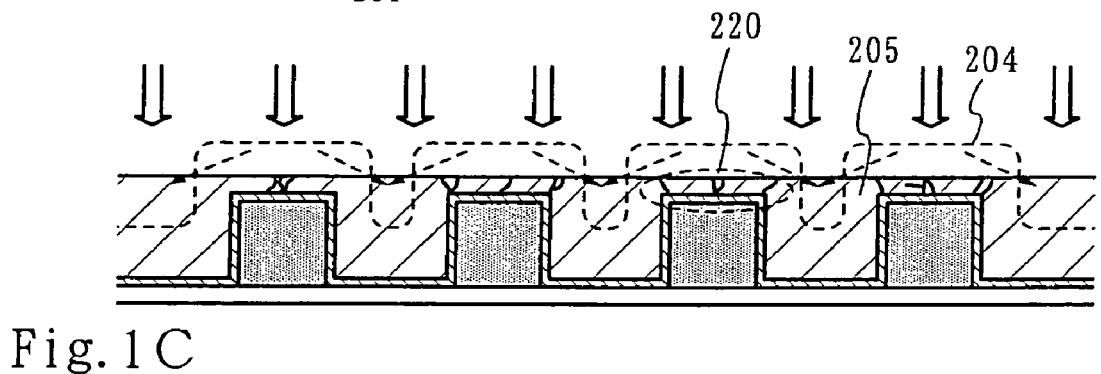

The semiconductor melted in an instant by laser light irradiation gathers in the openings (concave portions) through surface tension. The semiconductor then solidifies to form a crystalline semiconductor film 205 that has a mostly flat surface as shown in FIG. 1C. Crystal growth ends and grain boundaries are formed on the second insulating film (on the convex portions) (regions 220 in FIG. 1C).

Figure 1D:
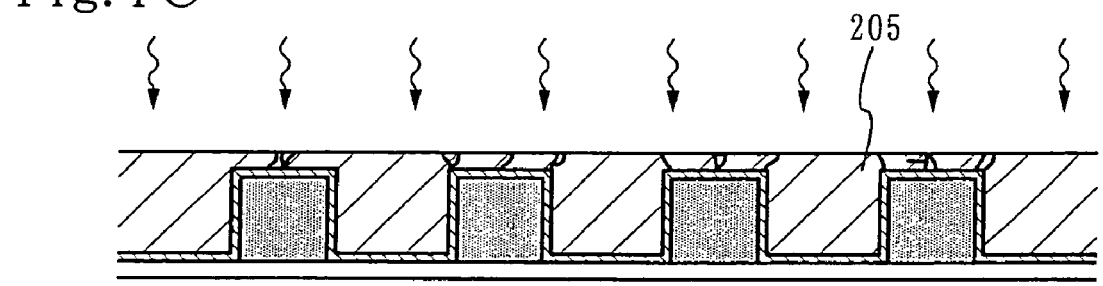

Thereafter, heat treatment is preferably conducted at 500 to 600° C. as shown in FIG. 1D to remove distortion accumulated in the crystalline semiconductor film. The distortion is caused by semiconductor volume shrinkage, thermal stress with the base, and lattice mismatch which are brought by crystallization. This heat treatment employs, for example, gas heating type rapid thermal annealing (RTA) and lasts for 1 to 10 minutes. This step is not indispensable in the present invention but optional.

Figure 1E:
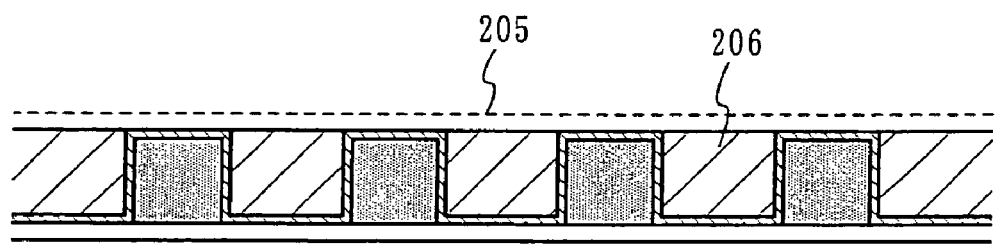

As shown in FIG. 1E, the surface of the crystalline semiconductor film 205 is etched to selectively extract crystalline semiconductor films 206 formed in the openings (concave portions). This is to remove the crystalline semiconductor film which remains on the second insulating film 202 and which contains grain boundaries and crystal defects, thereby leaving only quality crystals that are in the openings (concave portions). The crystalline semiconductor films 206 are characterized by having varying crystal orientations and no grain boundaries.

Particularly, a gate insulating film and a gate electrode are formed from the crystalline semiconductors filling the openings (concave portions) so that channel formation regions are positioned at the openings. This way a TFT is completed. If the openings are formed in the direction parallel to the channel length direction of the TFT and laser light runs in this direction, crystals grow in the direction. This makes it possible to grow crystals primarily in a specific crystal orientation. Details thereof are shown in FIGS. 2A to 2E, and the best mode is that W1 and W2 are each equal to or smaller than 1 μm and the depth of each opening (groove) is mostly equal to or more than the thickness of the amorphous semiconductor film 203.

The scanning electron microscope (SEM) picture of FIG. 21 shows an example thereof. In the example, a 170 nm deep level difference is formed by a second insulating film that is formed of silicon oxide on a quartz substrate, an amorphous silicon film is formed to a thickness of 150 nm on a base insulating film where 0.5 μm width (W1) convex portions are formed with an interval (W2) of 0.5 μm, and the amorphous silicon film is crystallized by laser light irradiation. The surface of the crystalline semiconductor film is etched by a Secco solution in order to show grain boundaries clearly. The Secco solution is a chemical prepared by mixing $K_2Cr_2O_7$ as additive with $HF:H_2O=2:1$. It is apparent from this picture that grain boundaries are concentrated on the convex portions forming level differences.

Figure 23:
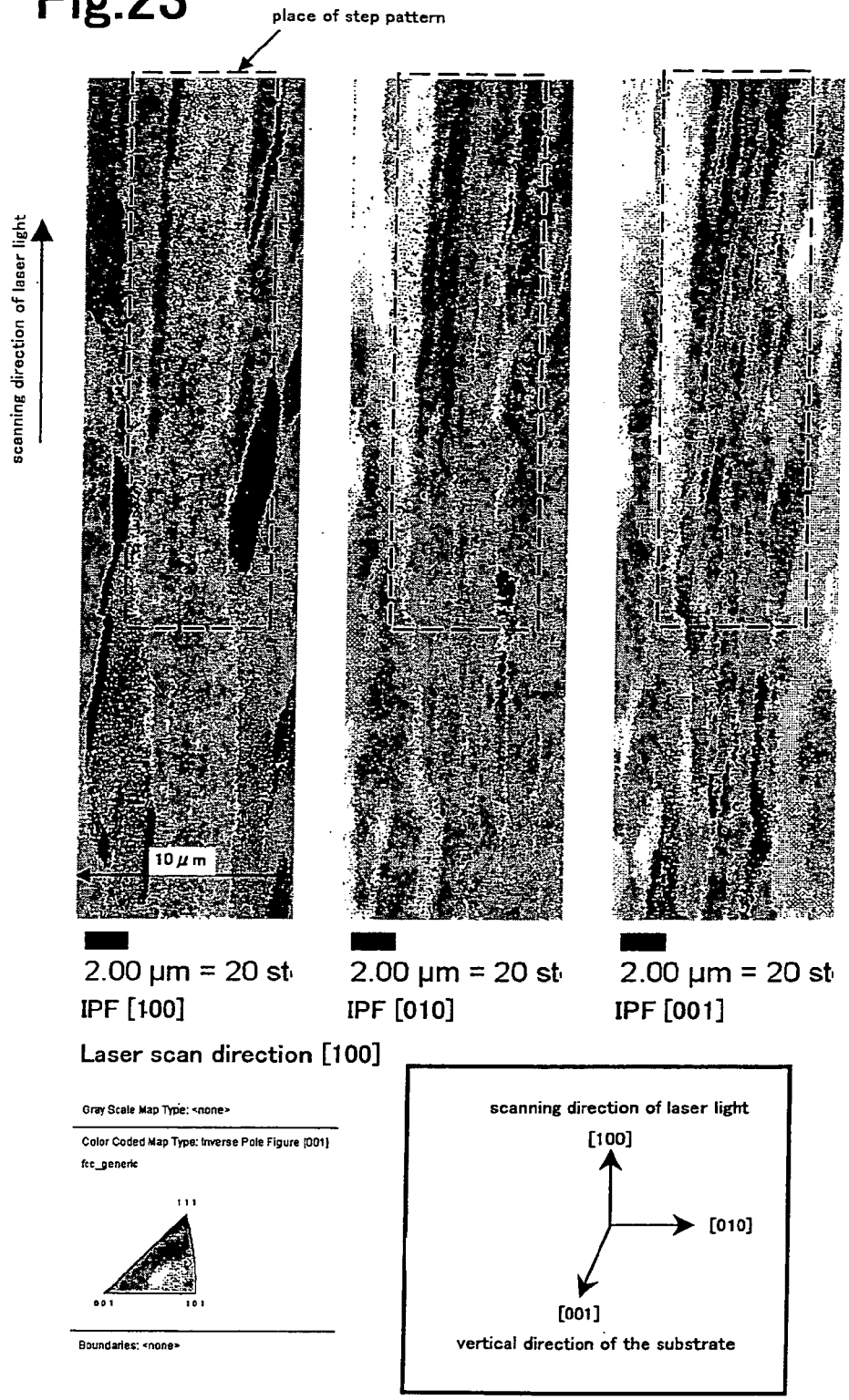
FIG. 23 is EBSP mapping data showing orientations of crystals formed in concave portions.

FIG. 23 shows results of obtaining the orientation of the crystalline semiconductor films in the openings (concave portions) by electron back scatter diffraction pattern (EBSP). EBSP is a method in which a special detector is attached to a scanning electron microscope (SEM), a crystal surface is irradiated with an electron beam, and the crystal orientation is identified from its Kikuchi line by a computer through image recognition to measure the micro crystallinity not in surface orientation alone but rather all directions of the crystal (hereinafter this method is called an EBSP method for conveniences' sake).

The data of FIG. 23 shows that crystals in the openings (concave portions) grow in the direction parallel to the scanning direction of laser light collected into a linear shape. The dominant plane orientation of the growth is <110> orientation but the <100> orientation growth is also present.

As described above, openings (or accompanying level difference) are provided under an amorphous semiconductor film and the amorphous semiconductor film is crystallized by irradiation of continuous wave laser light, thereby making distortion or stress that accompanies crystallization concentrate on regions other than the openings. This makes it possible to selectively form regions of poor crystallinity which have grain boundaries or the like. In other words, only crystalline semiconductor films in the openings are left and the crystalline semiconductor films have at least two crystal orientations and at least two crystal grains which extend in a direction parallel to a channel length direction without forming a grain boundary, A TFT is formed such that its channel formation region is placed in such crystalline semiconductor films. This improves the current drive performance at high speed as well as the reliability of the element.

Embodiment 2

In forming a crystalline semiconductor film of the present invention, an amorphous semiconductor film crystallized by laser light irradiation as shown in Embodiment 1 may be further irradiated with laser light to melt the film again for re-crystallization.

FIGS. 3A to 3E show an example thereof. First, a first insulating film 201, a second insulating film 202, a silicon oxynitride film 203, and an amorphous semiconductor film 204 are formed in the manner described in Embodiment 1. The amorphous semiconductor film 204 is doped with Ni as a metal element having catalytic functions for accelerating crystallization, such as lowering the crystallization temperature of silicon and improving the orientation. How the film is doped with Ni is not limited and spin coating, evaporation, sputtering, or other methods can be employed. When spin coating is used, an aqueous solution containing 5 to 10 ppm of nickel acetate is applied to form a metal element-containing layer 210. The catalytic element is not limited to Ni and other known materials may also be employed.

Figure 3A:
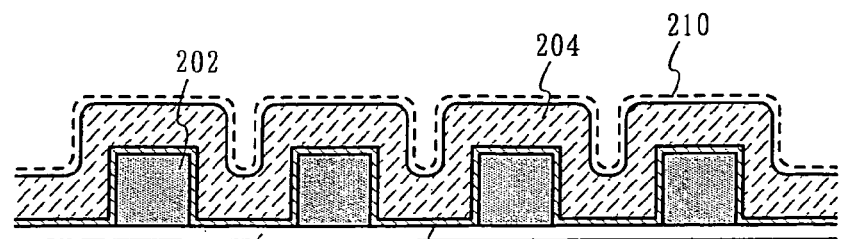
FIGS. 3A to 3E are diagrams illustrating a crystallization method in the present invention.
Figure 3B:
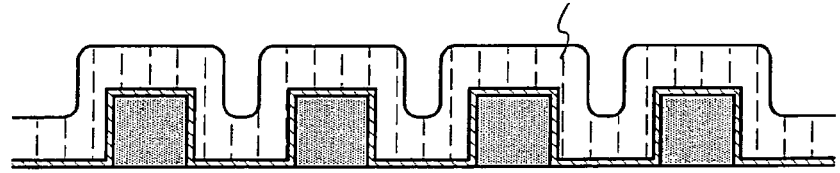

Next, as shown in FIG. 3B, the amorphous semiconductor film 204 is crystallized by heat treatment at 550 to 580° C. for 4 to 8 hours to form a crystalline semiconductor film 211. The crystalline semiconductor film 211 is a mass of rod-like or needle-like crystals. Macroscopically, each of the crystals grows in a specific orientation and therefore the crystalline semiconductor film 211 has uniform crystallinity. The crystalline semiconductor film 211 is also characterized by having high orientation ratio in a specific orientation.

Figure 3C:
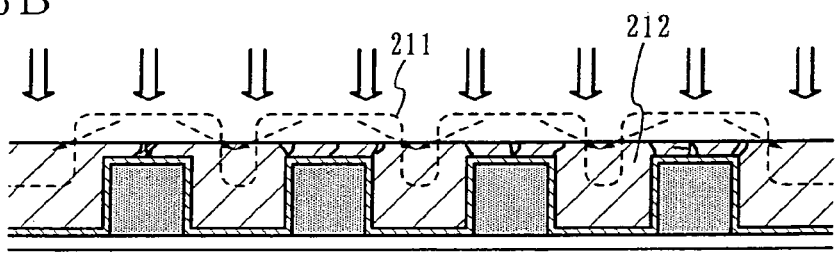
Figure 3D:
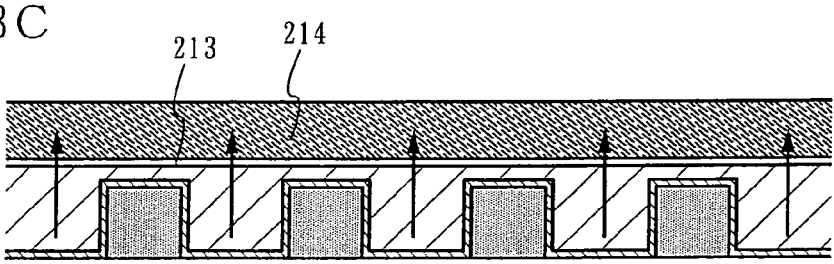

As shown in FIG. 3C, the crystalline semiconductor film obtained by crystallization through heat treatment is irradiated with continuous wave laser light or equally intense light to melt the film for re-crystallization. Thus obtained is a crystalline semiconductor film 212 that has a mostly flat surface. Crystal growth ends and grain boundaries in the crystalline semiconductor film 212 too are on the second insulating film (on the convex portions). An amorphous region remaining in the crystalline semiconductor film 211 is crystallized by this treatment. An advantage of using a crystalline semiconductor film as an object irradiated with laser light is the volatility of the absorption coefficient of a semiconductor film; the absorption coefficient hardly changes even when a crystallized semiconductor film is melted by laser light irradiation. This allows a wide margin in setting laser irradiation conditions.

Thereafter, gettering treatment is preferably conducted to remove the metal element remaining in the crystalline semiconductor film 212. A thin silicon oxide film is formed as a barrier film 213 to contact with the crystalline semiconductor film 212. An amorphous silicon film 214 containing a noble gas element in a concentration of $1 \times 10^{20}/cm^3$ or higher is formed as a gettering site. Then the substrate is subjected to heat treatment at 500 to 700° C. For details of this technique, see Japanese Patent Application No. 2001-019367 (or Japanese Patent Application No. 2002-020801). The heat treatment for the gettering treatment also has an effect of relieving distortion of the crystalline semiconductor film 212.

Figure 3E:
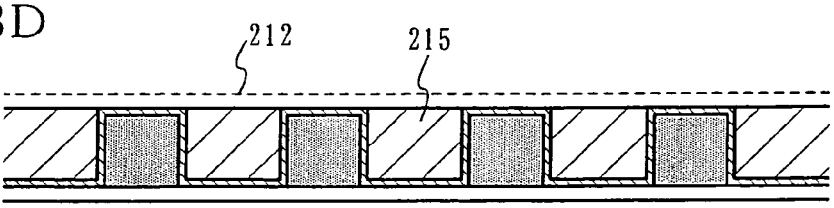

Thereafter, as shown in FIG. 3E, the amorphous silicon film 214 and the barrier film 213 are removed and, similar to Embodiment 1, the surface of the crystalline semiconductor film 212 is etched to selectively extract crystalline semiconductor films 215 formed in the openings (concave portions). The thus obtained crystalline semiconductor films 215 have varying crystal orientations and no grain boundaries. Crystallization treatment in two stages as this makes it possible to form a crystalline semiconductor film having relatively less distortion compared to Embodiment 1.

Embodiment 3

Figure 4A:
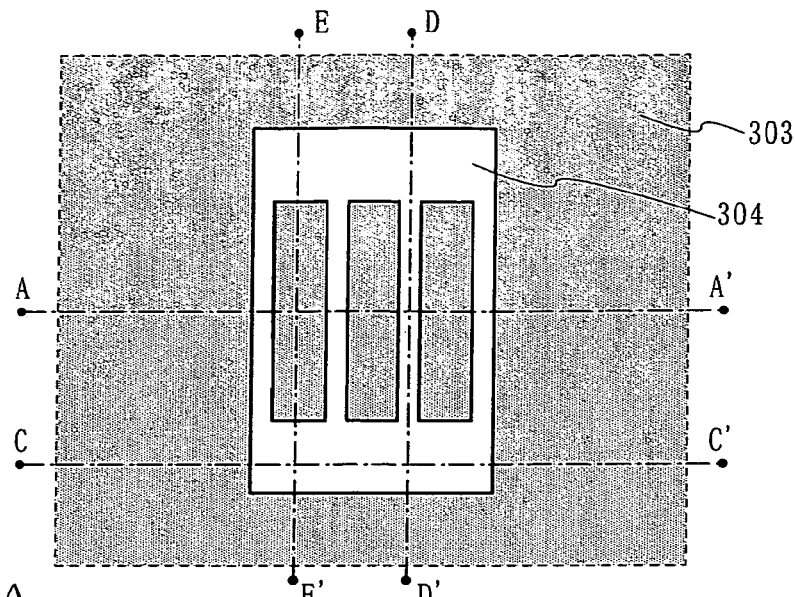
FIGS. 4A to 4E are a top view and vertical sectional views illustrating a process of manufacturing a TFT in accordance with the present invention.
Figure 4B:
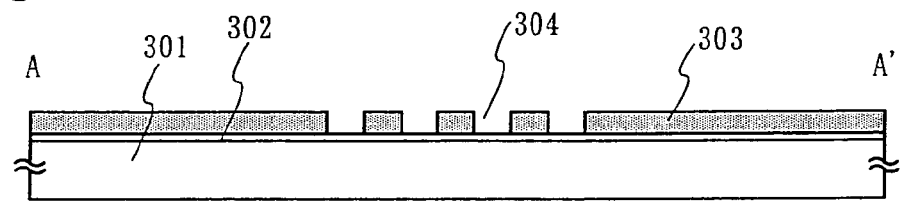
Figure 4C:
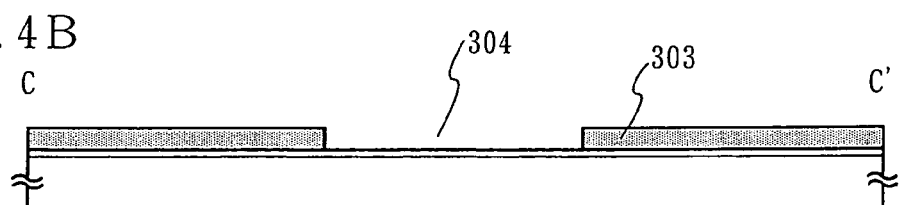
Figure 4D:
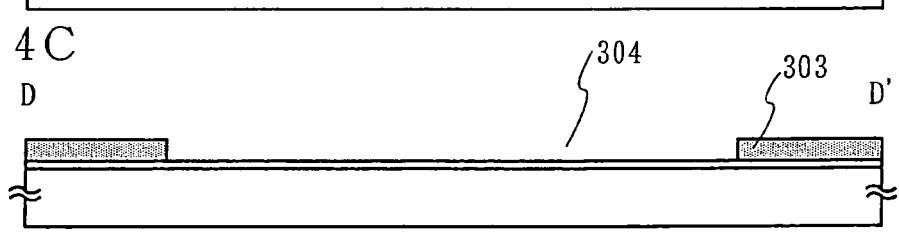
Figure 4E:
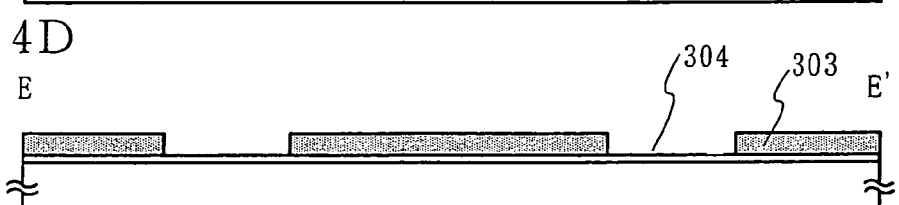
Figure 5A:
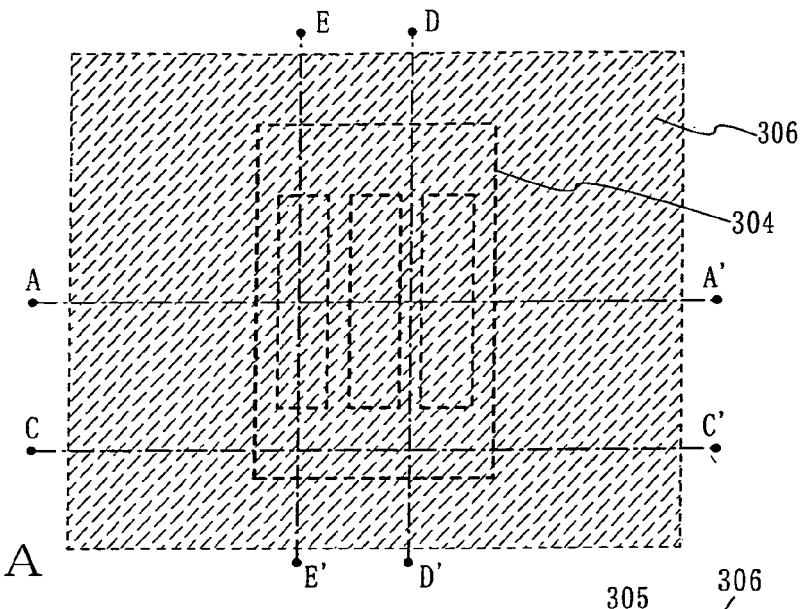
FIGS. 5A to 5E are a top view and vertical sectional views illustrating a process of manufacturing a TFT in accordance with the present invention.
Figure 5B:
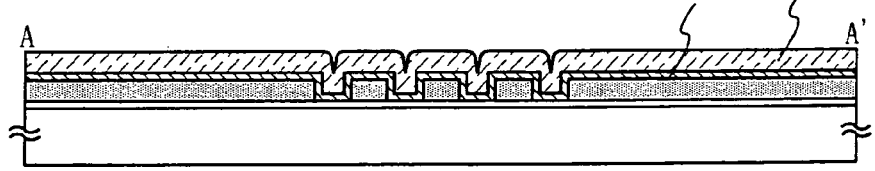
Figure 5C:
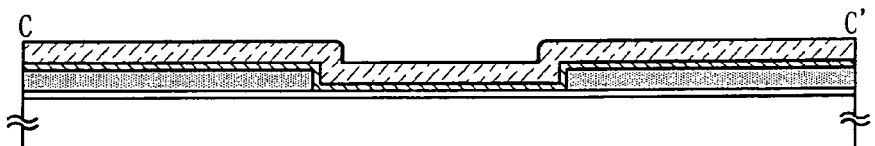
Figure 5D:
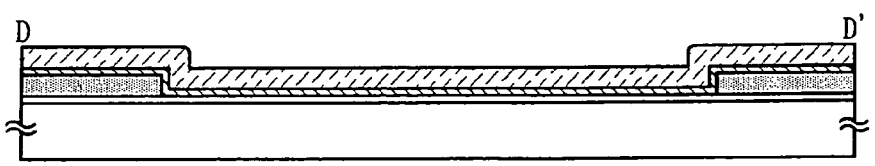
Figure 5E:
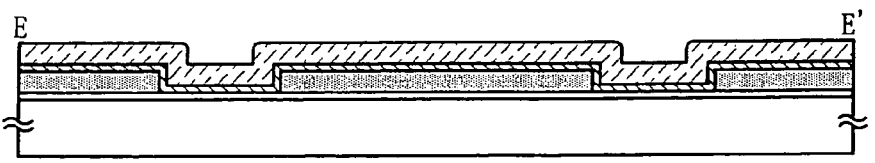
Figure 6A:
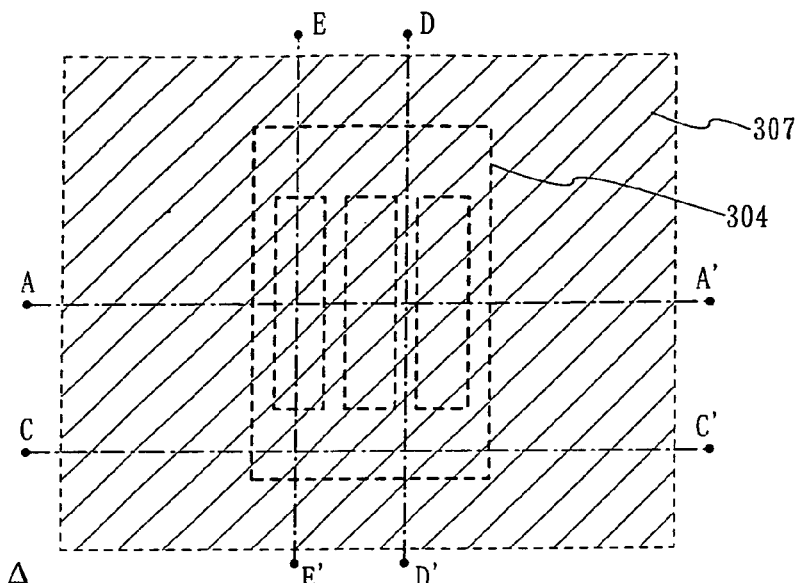
FIGS. 6A to 6E are a top view and vertical sectional views illustrating a process of manufacturing a TFT in accordance with the present invention.
Figure 6B:
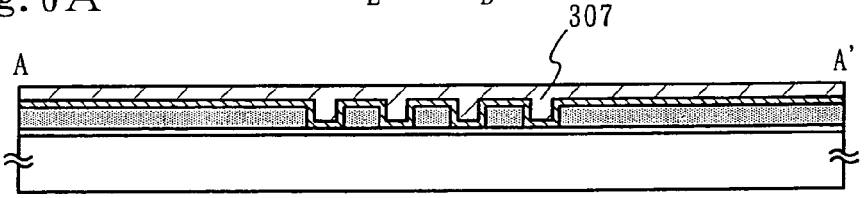
Figure 6C:
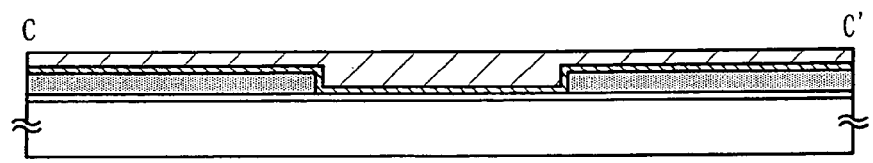
Figure 6D:
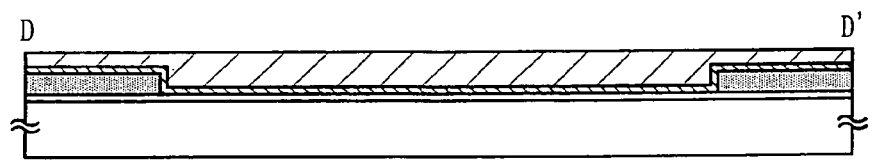
Figure 6E:
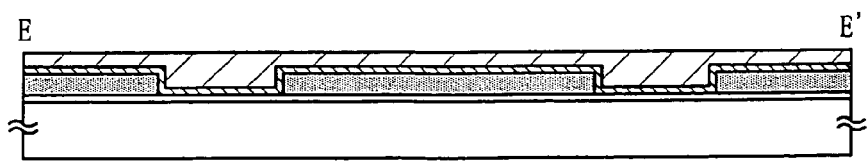
Figure 7A:
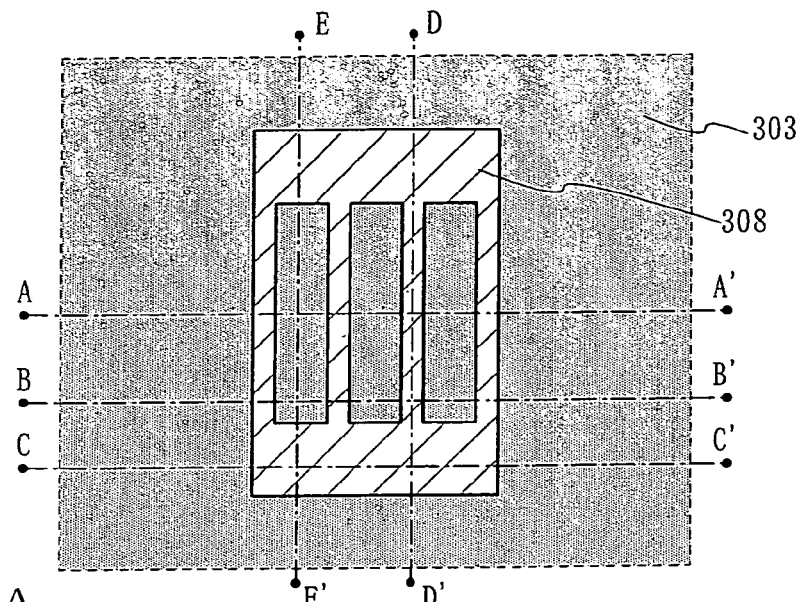
FIGS. 7A to 7E are a top view and vertical sectional views illustrating a process of manufacturing a TFT in accordance with the present invention.
Figure 7B:
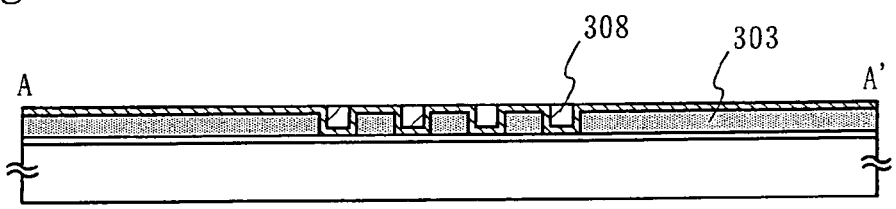
Figure 7C:
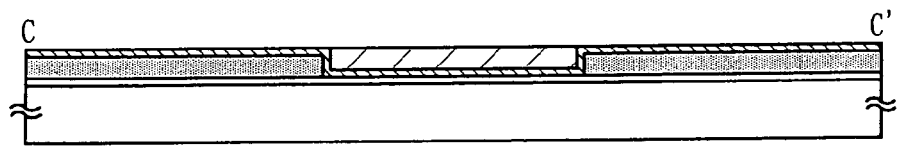
Figure 7D:
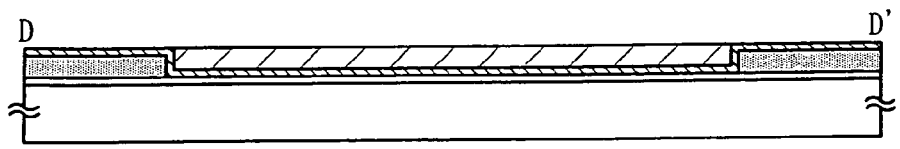
Figure 7E:
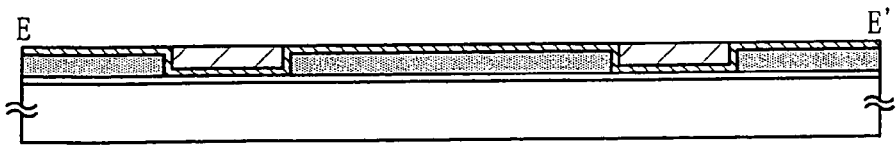
Figure 8A:
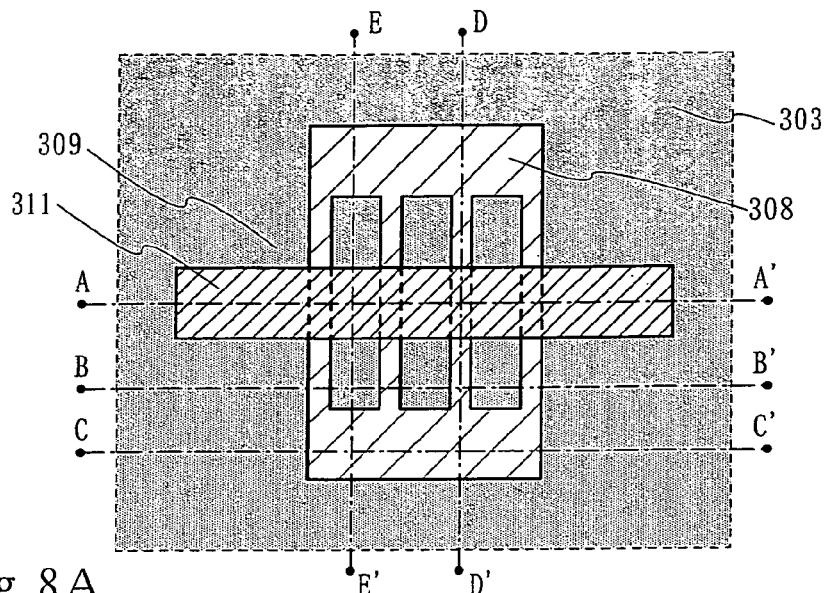
FIGS. 8A to 8F are a top view and vertical sectional views illustrating a process of manufacturing a TFT in accordance with the present invention.
Figure 8B:
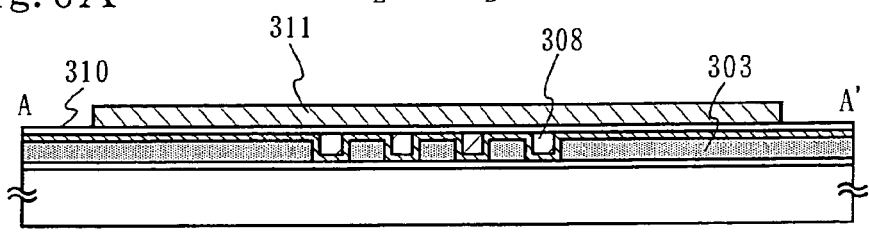
Figure 8C:
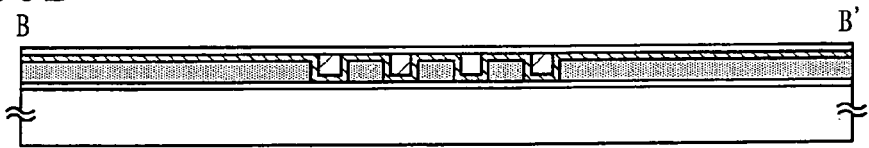
Figure 8D:
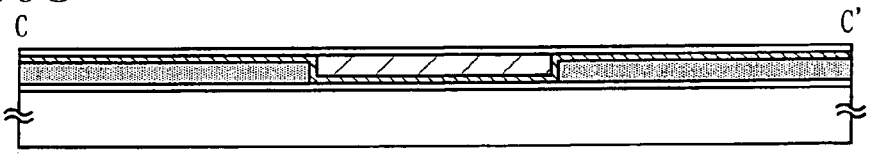
Figure 8E:
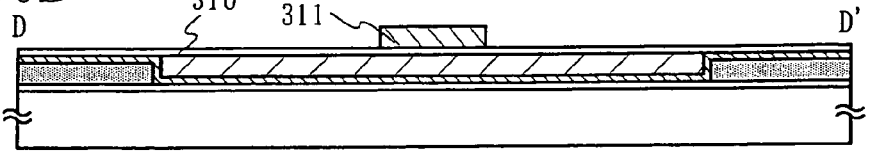
Figure 8F:
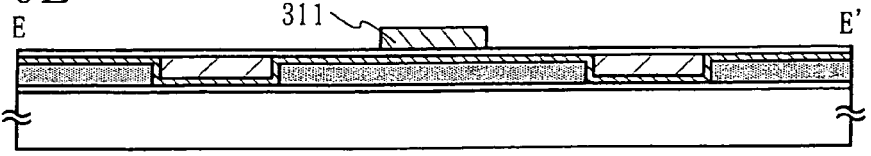
Figure 9A:
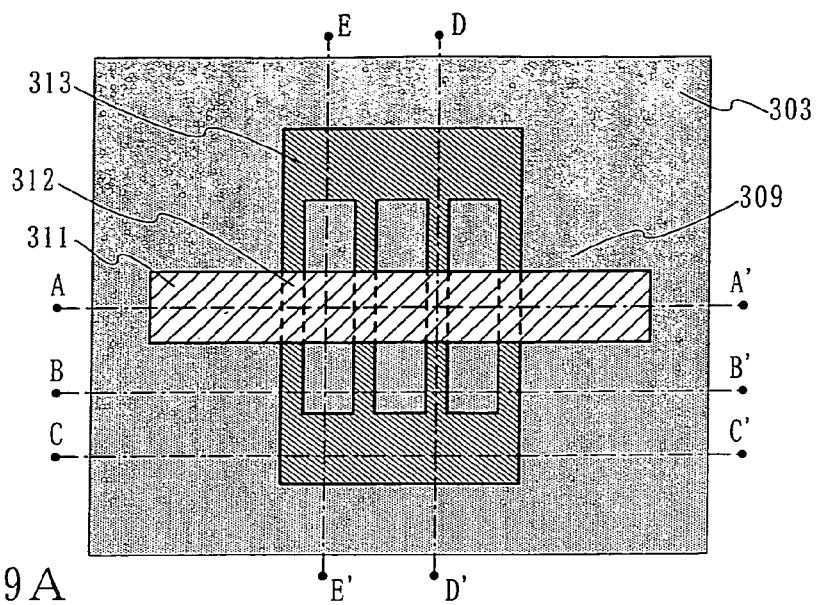
FIGS. 9A to 9F are a top view and vertical sectional views illustrating a process of manufacturing a TFT in accordance with the present invention.
Figure 9B:
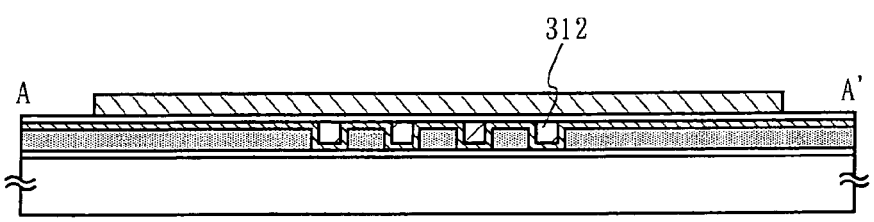
Figure 9C:
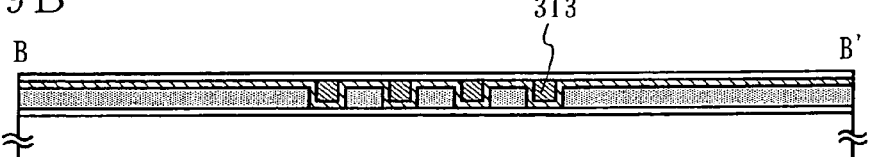
Figure 9D:
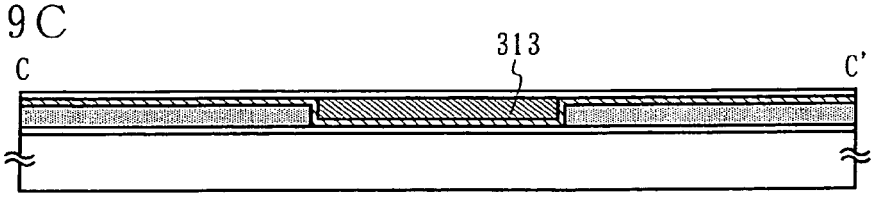
Figure 9E:
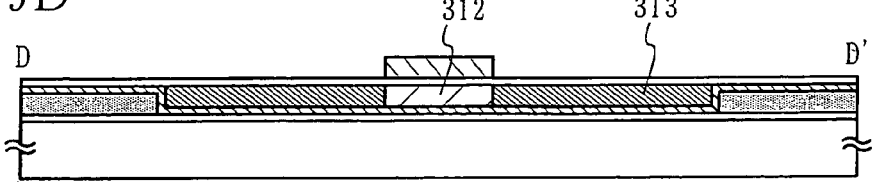
Figure 9F:
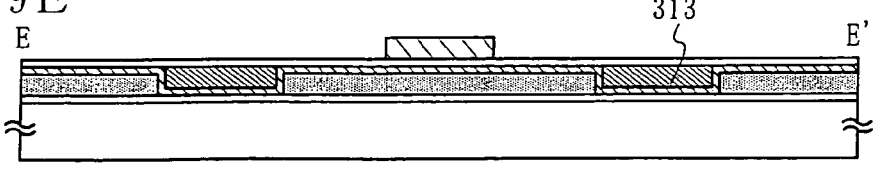

This embodiment gives a description with reference to FIGS. 4A to 10F on a mode of manufacturing a TFT whose channel formation region is placed in a filling region. The filling region is a region of a crystalline silicon film that fills an opening of a base insulating film that is formed under the crystalline silicon film. FIG. 4A is a top view whereas FIG. 4B and the subsequent drawings are vertical sectional views of various portions of FIG. 4A. Similarly, FIGS. 5A, 6A, 7A, 8A, 9A, and 10A are top views whereas the rest are vertical sectional views.

In FIGS. 4A to 4E, a silicon nitride film or aluminum oxynitride film with a thickness of 30 to 300 nm is formed as a first insulating film 302 on a glass substrate 301. On the first insulating film 302, a silicon oxide film or a silicon oxynitride film is formed and subjected to photo etching to form a second insulating film 303 that has rectangular patterns. A silicon oxide film with a thickness of 1000 nm is formed by plasma CVD using a mixture of TEOS and $O_2$ and setting the reaction pressure to 40 Pa, the substrate temperature to 400° C., and the high-frequency (13.56 MHz) power density to 0.6 W/cm² for electric discharge. The silicon oxide film is then etched to form an opening 304. In this case, the depth of the opening is almost equal to the thickness of the second insulating film and is 0.01 to 1 μm, preferably 0.05 to 0.2 μm.

On the first insulating film 302 and the second insulating film 303, as shown in FIGS. 5A to 5E, a third insulating film 305 and an amorphous semiconductor film 306 are formed in succession using the same plasma CVD apparatus without exposing them to the air. The third insulating film 305 is a silicon oxide film or a silicon oxynitride film. The amorphous semiconductor film 306 is a semiconductor film mainly containing silicon and is formed by plasma CVD using $SiH_4$ as material gas. At this stage, the film covers the bottom and side faces of the opening 304 and its surface is not flat.

Then, as shown in FIGS. 6A to 6E, the semiconductor film is crystallized by irradiation of continuous wave laser light. Crystallization conditions include employing a continuous wave mode $YVO_4$ laser oscillator, using an optical system to collect its 2 to 10 W power second harmonic (wavelength: 532 nm) into linear laser light which is 10 times longer in the longitudinal direction than in the lateral direction and which has a uniform energy density distribution in the longitudinal direction, and running the laser light at a rate of 10 to 200 cm/sec. The phrase uniform energy density distribution does not exclude everything that is not thoroughly constant. The acceptable range of the energy density distribution is ±10%. Laser processing apparatus structured as shown in FIG. 13 can be employed in this laser light irradiation.

Figures 14A, 14B:
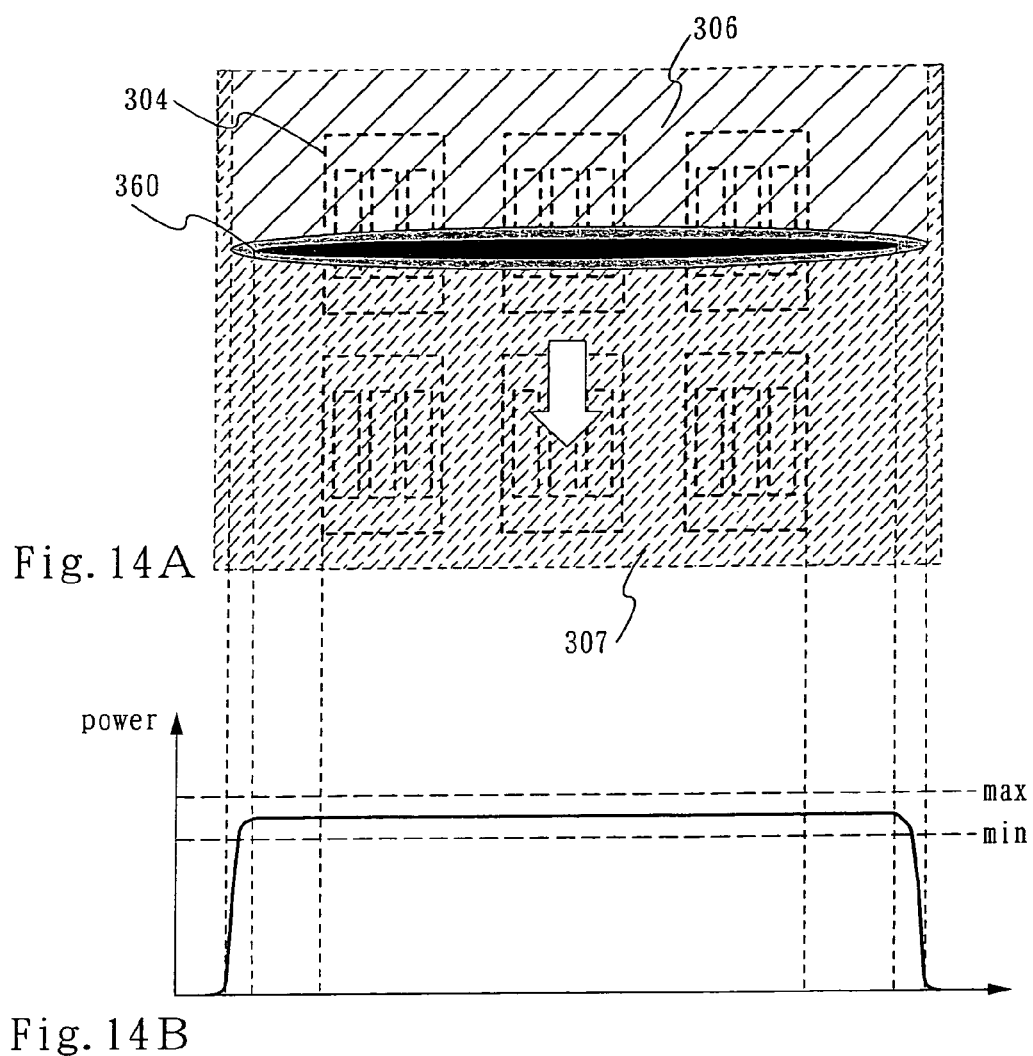
FIGS. 14A and 14B are diagrams illustrating laser light collected into a linear shape and its scanning direction in the present invention.

FIGS. 14A and 14B show the relation between the scanning direction of linearly collected laser light 360 and placement of openings. The intensity distribution of the linearly collected laser light 360 desirably has a region where the intensity is uniform in the longitudinal direction. This is to keep the temperature of the irradiation region constant by the temperature of the heated semiconductor film. If the temperature is varied in the longitudinal direction of the linearly collected laser light (the direction intersecting the scanning direction), the crystal growth direction cannot be kept to the laser light scanning direction. As shown in the drawing, openings 304 are aligned with the scanning direction of the linearly collected laser light 360. This makes the crystal growth direction match the channel length direction of every TFT. Fluctuation in characteristics between TFT elements are thus reduced.

By irradiation of laser light under these conditions, the amorphous semiconductor film is melted in an instant and crystallized. In practice, crystallization progresses as the melting zone moves. Melted silicon gathers in the openings (concave portions) through surface tension and solidifies. This way a crystalline semiconductor film 307 with a flat surface is formed filling the openings 304 as shown in FIGS. 6A to 6E.

Thereafter, as shown in FIGS. 7A to 7E, the crystalline semiconductor film 307 is etched leaving at least portions of the crystalline semiconductor film 307 that are in the openings 304. Through this etching treatment, portions of the crystalline semiconductor film that are on the second insulating film 303 are removed and an island-like semiconductor film 308 shaped to match the shape of the openings is formed from the crystalline semiconductor film. The crystalline semiconductor film is etched using as etching gas fluorine-based gas and oxygen, thereby ensuring the selectivity with respect to the base oxide film. For example, mixture gas of $CF_4$ and $O_2$ is used as etching gas. As shown in Embodiment 1, the island-like semiconductor film 308 is characterized by having varying crystal orientations and no grain boundaries. The top face may be etched by chemical mechanical polishing (CMP). The thickness of the island-like semiconductor film 308 is 0.01 to 1 μm, preferably 0.05 to 0.2 μm.

FIGS. 7A to 7E are not to limit the shape of the island-like semiconductor film 308, namely, the shape of the openings 304 comprised of the first insulating film and the second insulating film. As mentioned in Embodiment 1, the shape of the film is not particularly limited as long as it follows a given design rule. The island-like semiconductor film of FIGS. 7A to 7E are shaped by adjoining plural slip-like crystalline semiconductor films with a pair of rectangular crystalline semiconductor films. As described later, channel formation regions of TFTs are placed in the plural slip-like crystalline semiconductor films.

In FIGS. 8A to 8F, a fourth insulating film 310 serving as a gate insulating film and a conductive film 311 serving as a gate electrode are formed to cover the top and side faces of the island-like semiconductor film 308. The fourth insulating film 310 is a silicon oxide film or silicon oxynitride film with a thickness of 30 to 200 nm. The conductive film 311 is formed of tungsten, or an alloy containing tungsten, or others.

FIGS. 9A to 9F show a stage where an impurity region 313 of one conductivity type is formed in the island-like semiconductor film 308. The impurity region 313 may be formed in a self-aligning manner using as a mask the conductive film 311 that serves as a gate electrode, or may be formed by masking using photo resist or the like. The impurity region 313 forms source and drain regions and, if necessary, a lightly doped drain region.

To form the impurity region 313, ion implantation in which an impurity ion is accelerated by electric field and implanted in a semiconductor film or ion doping is used. Whether or not there is mass separation of ion species implanted is not an essential matter in applying the present invention.

Then, as shown in FIGS. 10A to 10F, a silicon nitride film or silicon oxynitride film containing hydrogen is formed as a fifth insulating film 314 to a thickness of 50 to 100 nm. In this state, heat treatment is conducted at 400 to 450° C. and hydrogen contained in the silicon nitride film or silicon oxynitride film is released to hydrogenate the island-like semiconductor film. A silicon oxide film or the like is formed as a sixth insulating film to form a wire 316, which is in contact with the impurity region 313 that serves as source and drain regions.

A TFT is manufactured in this way. The TFT manufactured in accordance with FIGS. 4A to 10F is a multi-channel TFT in which plural channel formation regions are arranged in parallel and are adjoined with a pair of impurity regions. In this structure, the number of channel formation regions arranged in parallel is not limited and can be set as needed. The channel formation regions are formed from a crystalline semiconductor film that has at least two crystal orientations and having at least two crystal grains which extend in a direction parallel to a channel length direction without forming a grain boundary.

Embodiment 4

Figure 11A:
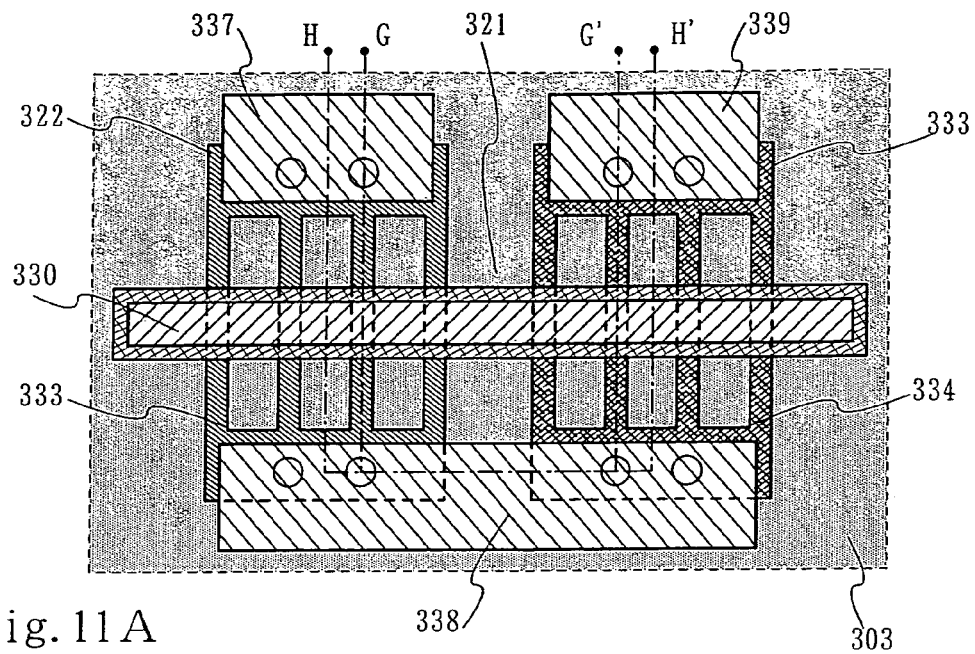
FIGS. 11A to 11C are a top view and vertical sectional views illustrating the structure of a TFT manufactured in accordance with the present invention.
Figure 11B:
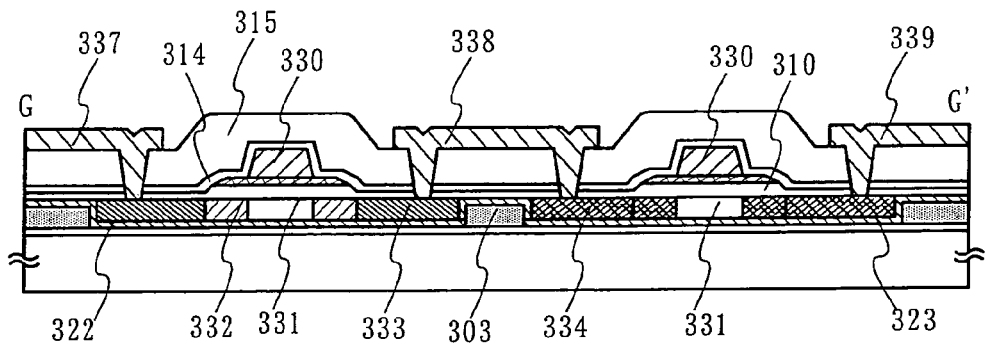
Figure 11C:
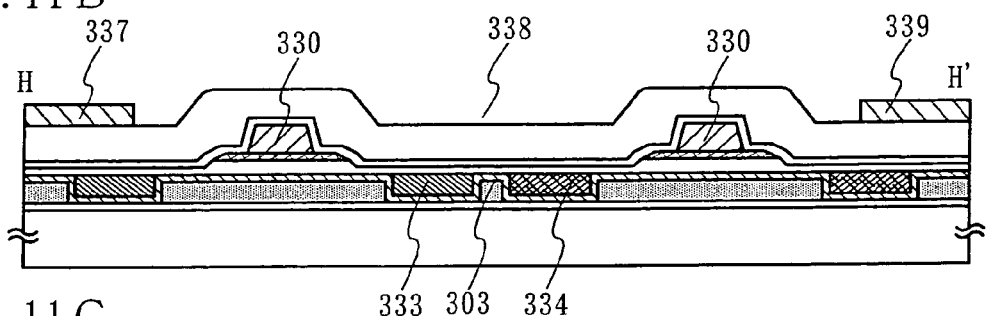
Figure 12A:
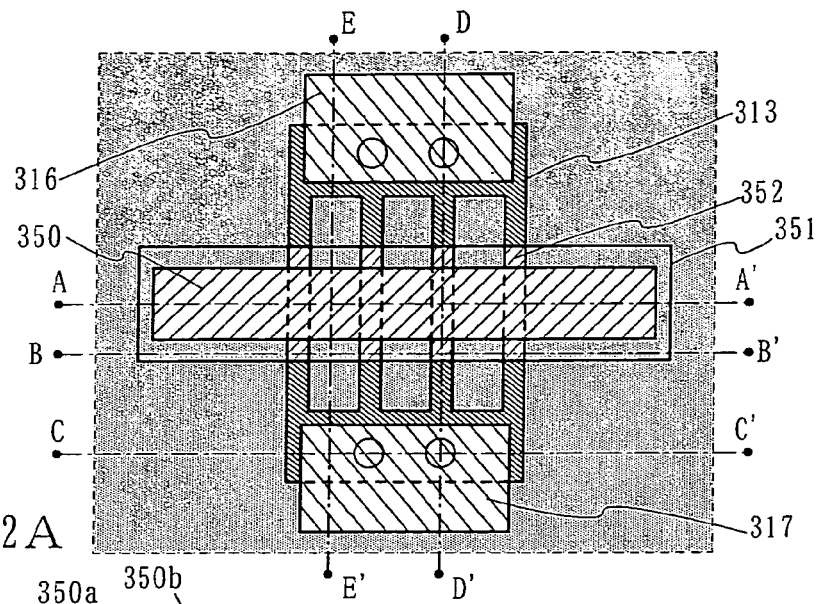
FIGS. 12A to 12F are a top view and vertical sectional views illustrating the structure of a TFT manufactured in accordance with the present invention.
Figure 12B:
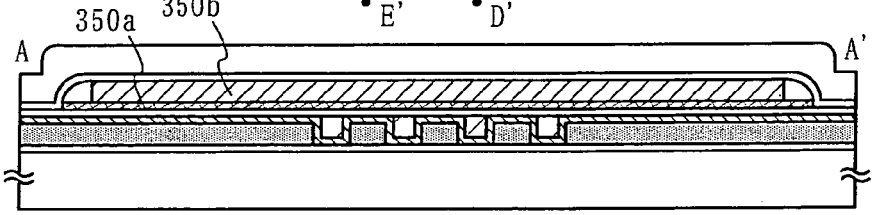
Figure 12C:
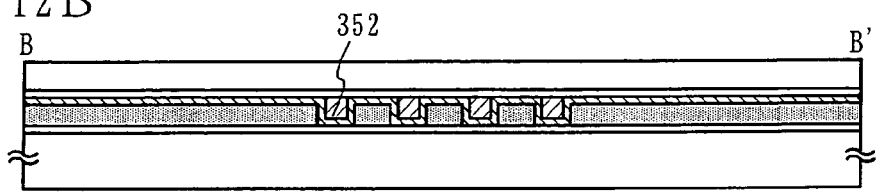
Figure 12D:
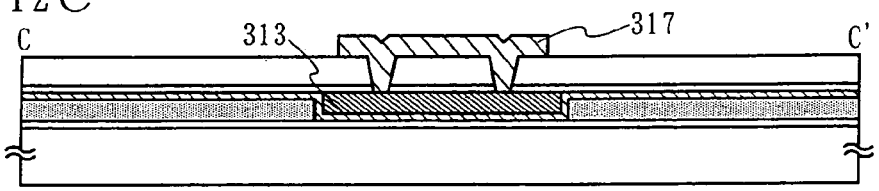
Figure 12E:
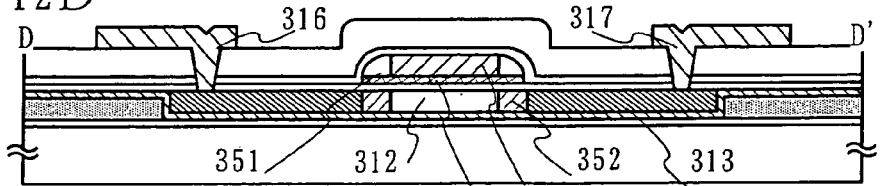
Figure 12F:
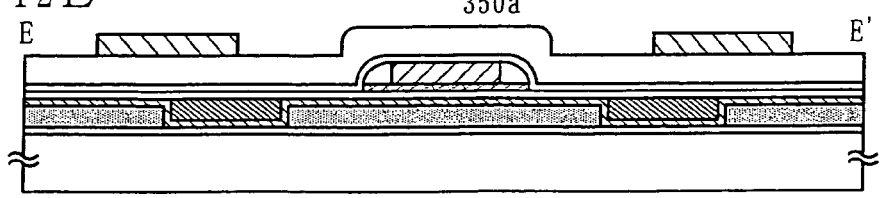

FIGS. 11A to 11C show an example of building an inverter circuit that is a basic circuit of the CMOS structure from an n-channel multi-channel TFT having a lightly doped drain (LDD) structure and a p-channel multi-channel TFT. In FIGS. 11A to 11C, a second insulating film 320, an opening 321, and island-like semiconductor films 322 and 323 are formed in the manner described in Embodiment 3.

FIG. 11A is a top view. A first n type impurity region 333 for forming source and drain regions is formed in the island-like semiconductor film 322. A first p type impurity region 334 for forming source and drain regions is formed in the island-like semiconductor film 323. Other than the impurity regions, conductive layers 330 for forming gate electrodes are formed as well as source and drain wires 337 to 339. The thickness of the island-like semiconductor film 323 is 0.01 to 1 μm, preferably 0.05 to 0.2 μm.

FIGS. 11B and 11C are vertical sectional views taken along the lines G-G' and H-H'. In the n-channel TFT, a second n type impurity region for forming an LDD region is formed next to the first n type impurity region 333. The gate electrodes 330 have a two-layer structure, and the first n type impurity region 333, the second n type impurity region, and the first p type impurity region can be formed in a self-aligning manner. Denoted by 331 are channel formation regions. For details of the gate electrodes and impurity regions and manufacturing method thereof, see JP 2002-14337 A or Japanese Patent Application No. 2001-011085.

A fifth insulating film 314 and a sixth insulating film 315 in FIGS. 11A to 11C are identical with the fifth and sixth insulating films of Embodiment 3, and explanations thereof are omitted here.

Embodiment 5

FIGS. 12A to 12F show a variation of the multi-channel TFT shown in Embodiment 3 in which the gate electrode is structured differently. The TFT in FIGS. 12A to 12F is identical with the one in Embodiment 3 except the structure of the gate electrode and LDD region. The symbols used are common to Embodiments 3 and 5 and detailed explanations are omitted.

The TFT structure shown in FIGS. 12A to 12F is an example of forming a gate electrode from a metal nitride 350a such as titanium nitride or tantalum nitride and from a high melting point metal 351b such as tungsten or a tungsten alloy. Spacers 351 are formed on the side faces of a gate electrode 350b. The spacers 351 may be formed from an insulator such as silicon oxide, or from n type polycrystalline silicon to have a conductivity. Anisotropic dry etching is used to form the spacers 351. An LDD region 352 is formed prior to the spacers, so that it can be formed in a self-aligning manner using the gate electrode 350b. When a conductive material is used to form the spacers, the LDD region substantially overlaps the gate electrode to form a gate overlapped LDD structure.

The structure in which a spacer is provided and an LDD region is formed in a self-aligning manner is effective particularly when the design rule is minute. Although a TFT structure of single polarity is shown here, it is also possible to form a CMOS structure as in Embodiment 4.

Embodiment 6

This embodiment shows an example of manufacturing a TFT whose channel formation region is placed in a filling region. The filling region is a region of a crystalline silicon film that fills an opening of a base insulating film that is formed under the crystalline silicon film.

In FIGS. 31A to 31C, a silicon oxynitride film with a thickness of 100 nm is formed as a first insulating film 602 on a glass substrate 601. On the first insulating film 602, a silicon oxide film is formed and subjected to photo etching to form a second insulating film 603 that has rectangular patterns. The silicon oxide film is formed to a thickness of 150 nm by plasma CVD using a mixture of TEOS and $O_2$ and setting the reaction pressure to 40 Pa, the substrate temperature to 400° C., and the high-frequency (13.56 MHz) power density to 0.6 W/cm$^2$ for electric discharge. The silicon oxide film is then etched to form openings 604a and 604b.

FIG. 31A is a top view, FIG. 31B is a vertical sectional view taken along the line A-A' in FIG. 31A, and FIG. 31C is a vertical sectional view taken along the line B-B' in FIG. 31A. The same applies to FIGS. 32A to 36C.

As shown in FIGS. 32A to 32C, an amorphous silicon film 605 are formed to a thickness of 150 nm to cover the first insulating film 602 and the second insulating film 603. The amorphous silicon film 605 is formed by plasma CVD using $SiH_4$ as material gas.

Then, as shown in FIGS. 33A to 33C, the silicon film is crystallized by irradiation of continuous wave laser light. Crystallization conditions include employing a continuous wave mode $YVO_4$ laser oscillator, using an optical system to collect its 5.5 W power second harmonic (wavelength: 532 nm) into linear laser light which is 400 μm in the longitudinal direction and 50 to 100 μm in the lateral direction and which has a uniform energy density distribution in the longitudinal direction, and running the laser light at a rate of 50 cm/sec. The phrase uniform energy density distribution does not exclude everything that is not thoroughly constant. The acceptable range of the energy density distribution is ±5%. Laser processing apparatus structured a shown in FIG. 13 can be employed in this laser light irradiation. The intensity of the laser light collected in the optical system may be uniform in the longitudinal direction while it is varied in the lateral direction. The region of the laser light where the intensity distribution is uniform in the longitudinal direction is used for crystallization, thereby enhancing the effect of making crystals grow in the direction parallel to the laser light scanning direction.

By irradiation of laser light under these conditions, the amorphous silicon film is melted in an instant and crystallization progresses as the melting zone moves. Melted silicon gathers in the openings (concave portions) through surface tension and solidifies. This way a crystalline semiconductor film 606 is formed filling the openings 604a and 604b.

Thereafter, as shown in FIGS. 34A to 34C, a mask pattern is formed for etching treatment so as to leave at least portions of the crystalline semiconductor film that are in the openings 604a and 604b. As a result, island-like semiconductor regions 607 and 608 including channel formation regions are formed.

Figures 35A, 35B, 35C:
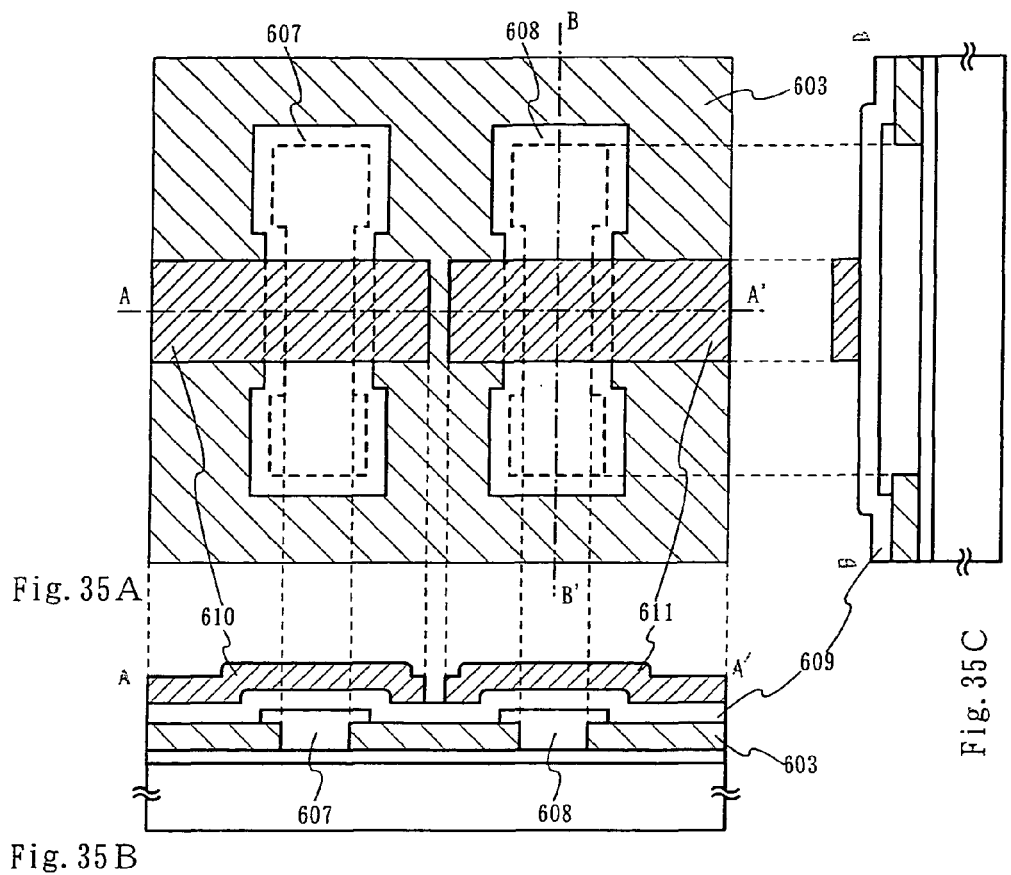
FIGS. 35A to 35C are a top view and vertical sectional views illustrating a process of manufacturing a TFT in accordance with the present invention.

In FIGS. 35A to 35C, a gate insulating film 609 and gate electrodes 610 and 611 are formed on the semiconductor regions 607 and 608. The gate insulating film is a silicon oxide film formed by plasma CVD to a thickness of 80 nm. The gate electrodes 610 and 611 are formed from tungsten or an alloy containing tungsten. This structure makes it possible to place channel formation regions in the island-like semiconductor regions filling the openings 604a and 604b.

Subsequently, source and drain regions, a lightly doped drain region, and others are suitably formed to complete the TFT.

Embodiment 7

Figures 36A, 36B, 36C:
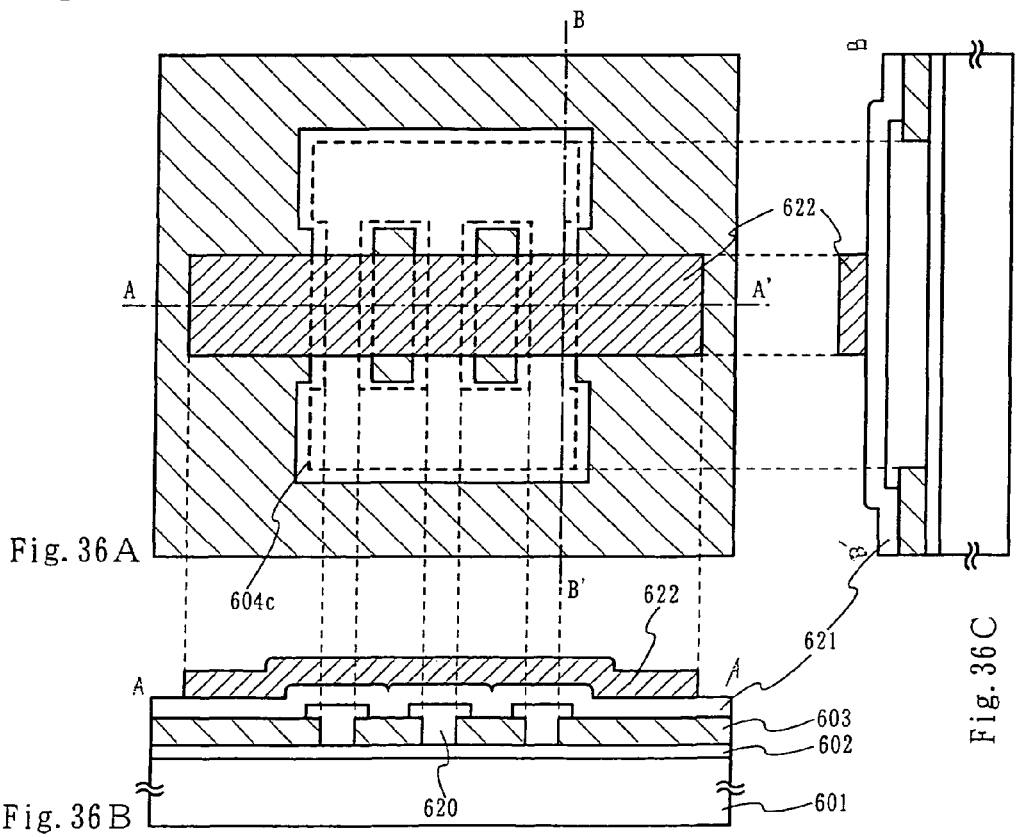
FIGS. 36A to 36C are a top view and vertical sectional views illustrating an example of a TFT manufactured in accordance with the present invention.
Figures 37A, 37B, 37C:
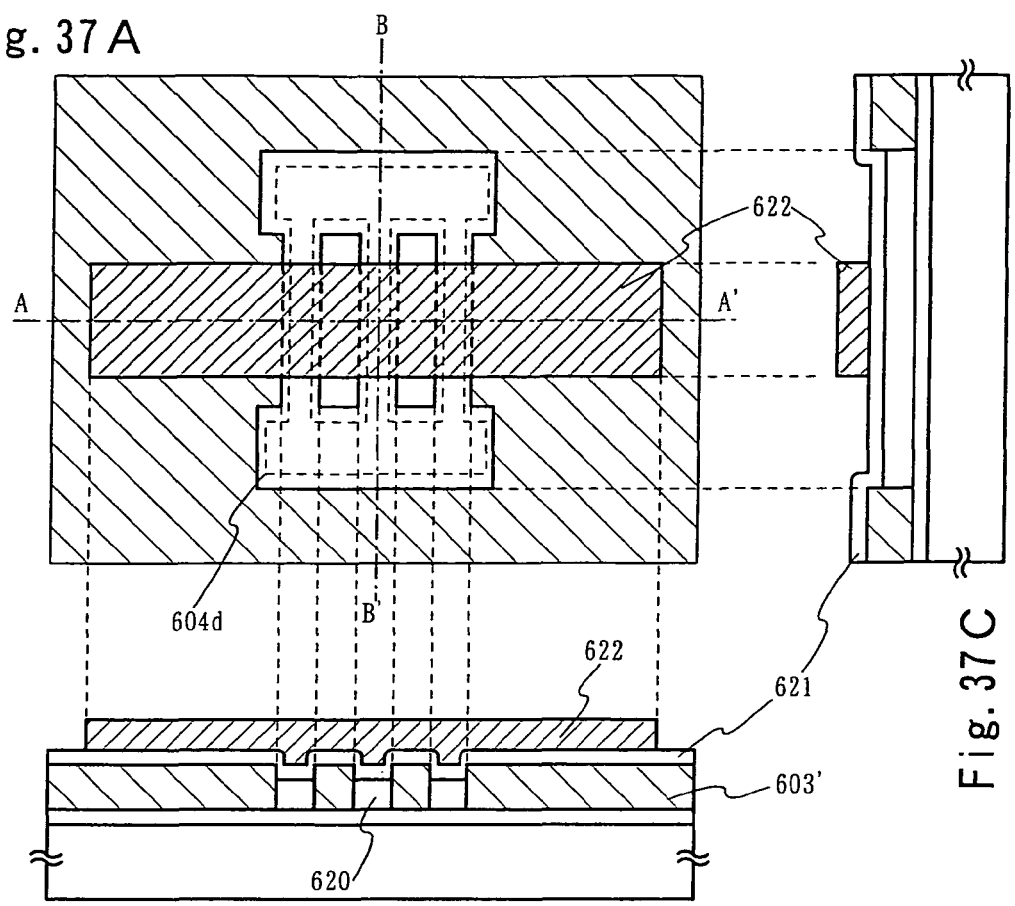
FIGS. 37A to 37C are a top view and vertical sectional views illustrating an example of a TFT manufactured in accordance with the present invention.
Figure 39:
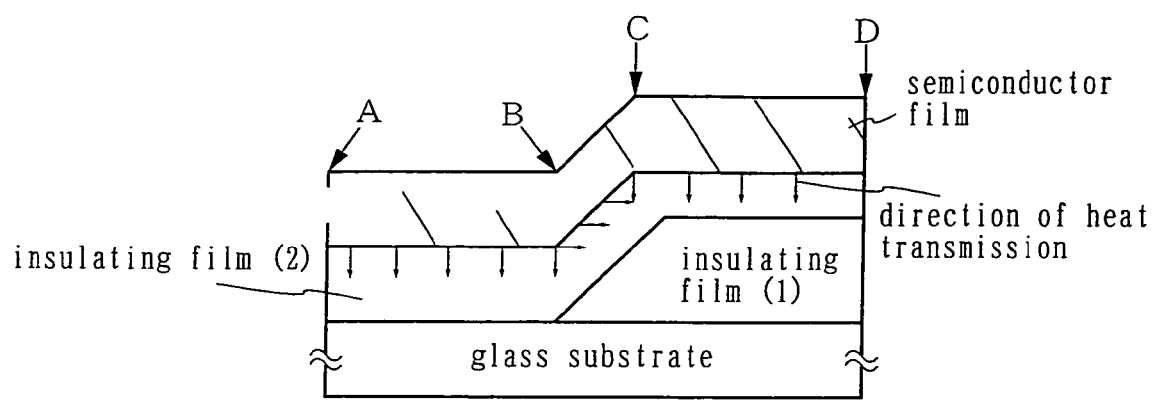
FIG. 39 is a sectional view showing a structure used in thermal analysis simulation.
Figure 40:
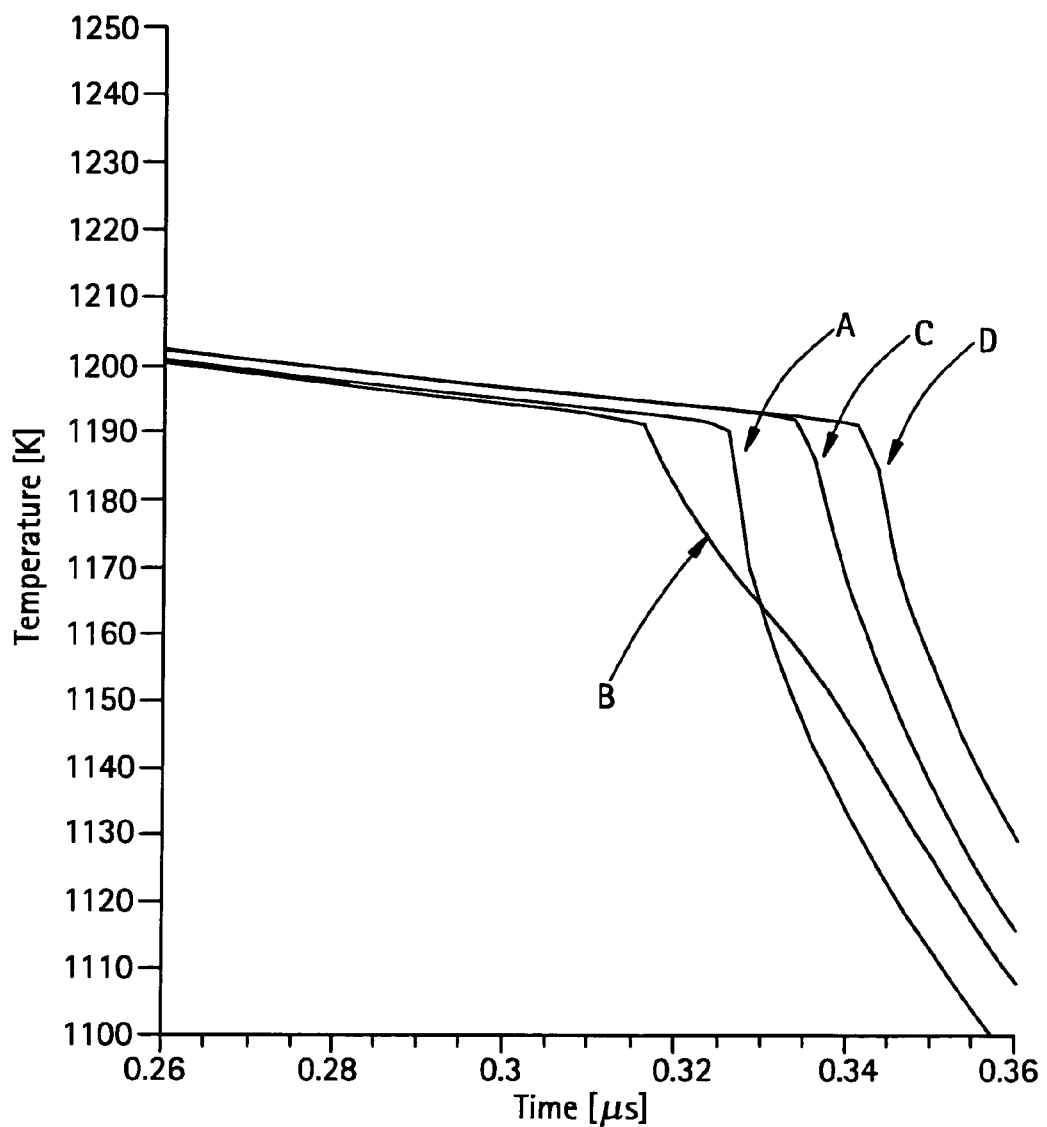
FIG. 40 is a graph showing results of the thermal analysis simulation.

A single gate/multi-channel TFT can be formed by a process similar to Embodiment 6. As shown in FIGS. 36A to 36C, an opening 604c is formed in a second insulating film 603 and is shaped by narrow slip-like regions and regions adjoining thereto. An island-like semiconductor region 620 is formed from the crystalline silicon film and shaped to match the shape of the opening 604c. Then a gate insulating film 621 and a gate electrode 622 are formed to complete the TFT.

Embodiment 8

If the second insulating film in Embodiment 7 is thicker than the amorphous semiconductor film and has a thickness of, for example, 350 nm, the island-like semiconductor region 620 formed from the crystalline semiconductor film can be formed completely in an opening 604d. Then, similar to Embodiment 7, a gate insulating film 621 and a gate electrode 622 are formed to complete a single gate/multi-channel TFT.

Embodiment 9

FIGS. 38A to 38D show another example of a single gate/multi-channel TFT. A first insulating film 602, a second insulating film 603, an island-like semiconductor region 630, a gate insulating film 631, and a gate electrode 632 are formed on a substrate 601 in a manner similar to Embodiments 1 through 3. The difference between this embodiment and Embodiments 1 through 3 is that, in FIGS. 38A to 38D, a second opening 625 is formed in addition to an opening 604e that is comprised of the second insulating film 603. The second opening 625 is formed after the island-like semiconductor region 630 is formed by removing a portion of the second insulating film that surrounds a portion of the island-like semiconductor region 630 where a channel formation region is to be formed.

The area surrounding the channel formation region is enlarged and shown in FIG. 38D. The gate insulating film 631 is in contact with the top and side faces of the island-like semiconductor region 630 and the gate electrode 632 is formed so as to cover the gate insulating film. In this case, the channel formation region is formed on both a top face 634 and side faces 635 of the semiconductor region 630. This increases the depletion region and improves the current drive performance of the TFT.

Embodiment 10

The present invention can be applied to various semiconductor devices. A mode of display panel manufactured in accordance with Embodiments 1 through 5 will be described.

Figure 15:
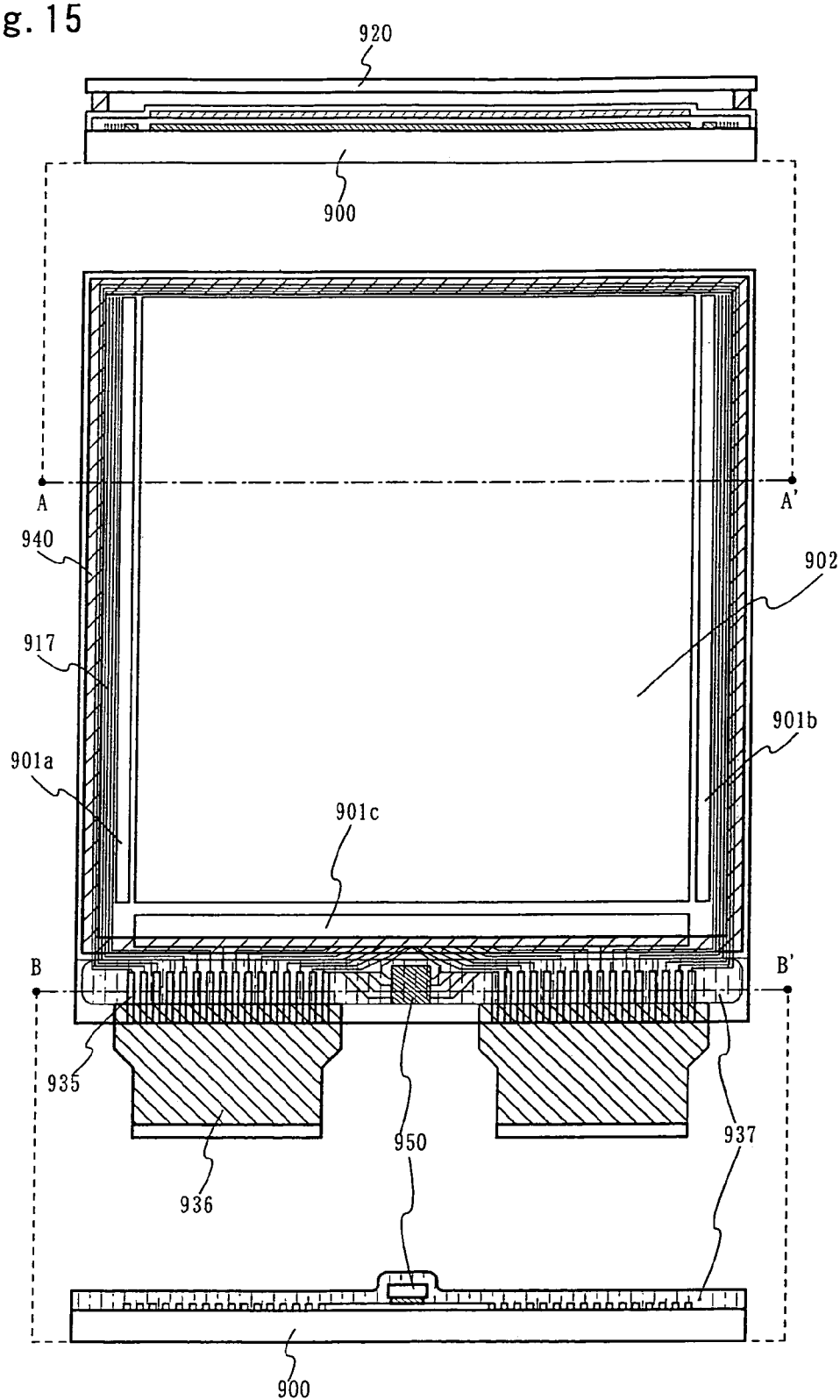
FIG. 15 is an example of an exterior view of a semiconductor device manufactured in accordance with the present invention.

In FIG. 15, a substrate 900 is provided with a pixel portion 902, gate signal side driving circuits 901a and 901b, a data signal side driving circuit 901c, an input output terminal portion 908, and a wire or a group of wires 917. A seal pattern 940 may partially overlap the gate signal side driving circuits 901a and 901b and the data signal side driving circuit 901c, as well as the wire or group of wires 917 for connecting the driving circuits with input terminals. In this way, the area of the frame region (the region surrounding the pixel portion) of the display panel can be reduced. An FPC 936 is fixed to an external input terminal portion.

A chip in which a microprocessor, a memory, a media processor/DSP (Digital Signal Processor), and the like are formed from a TFT of the present invention may be mounted to the display panel. These function circuits are formed under a design rule different from the one for the pixel portion 902, the gate signal side driving circuits 901a and 901b, and the data signal side driving circuit 901c. Specifically, a design rule smaller than 1 μm is employed. How the chip is mounted is not limited and COG or the like can be employed.

For example, the TFTs shown in Embodiments 3 through 5 can be used as switching elements of the pixel portion 902, and as active elements constituting the gate signal side driving circuits 901a and 901b and the data signal side driving circuit 901c.

Figure 17:
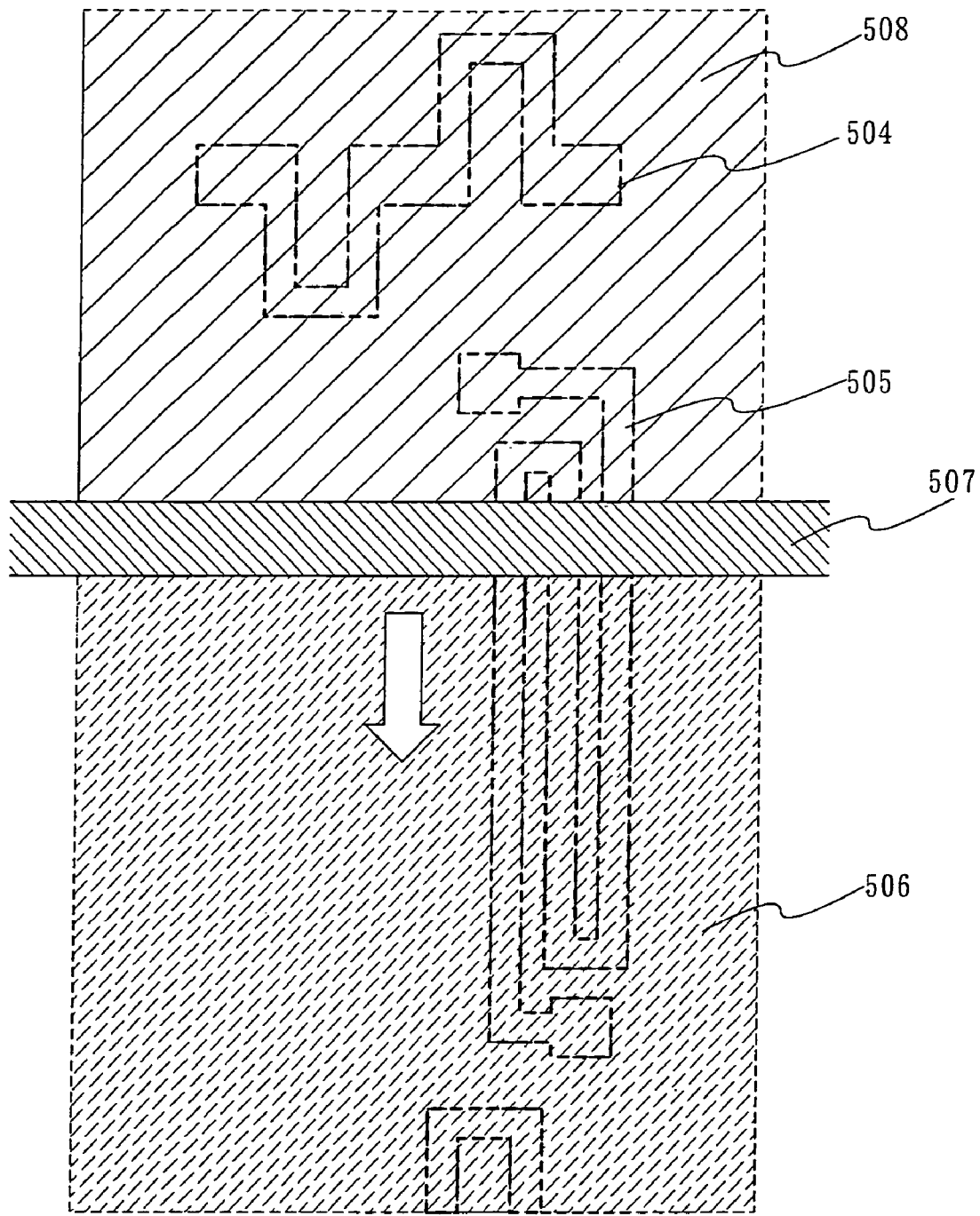
FIG. 17 is a top view illustrating a process of manufacturing a pixel portion of the semiconductor device shown in FIG. 15.
Figure 18:
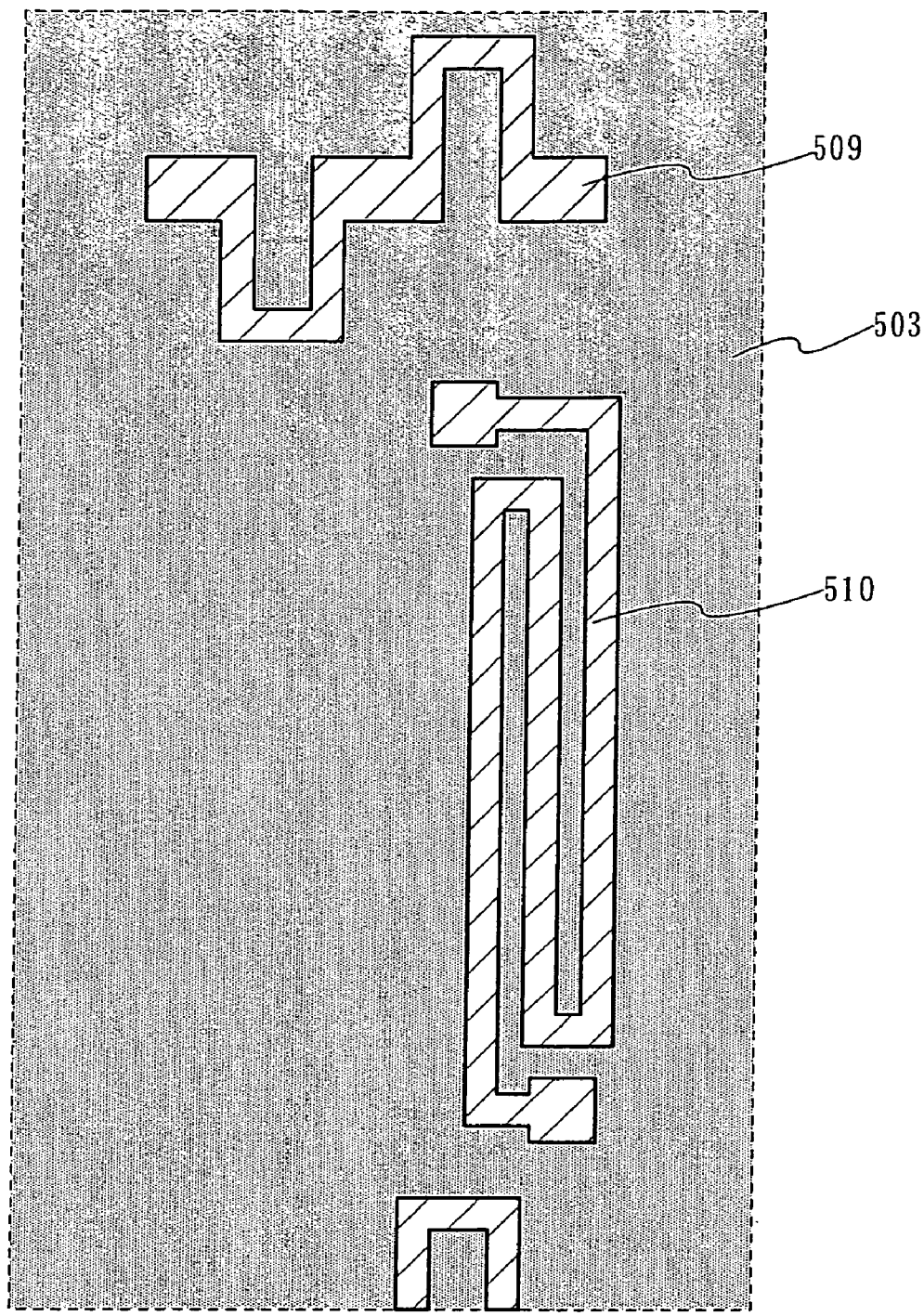
FIG. 18 is a top view illustrating a process of manufacturing a pixel portion of the semiconductor device shown in FIG. 15.
Figure 19:
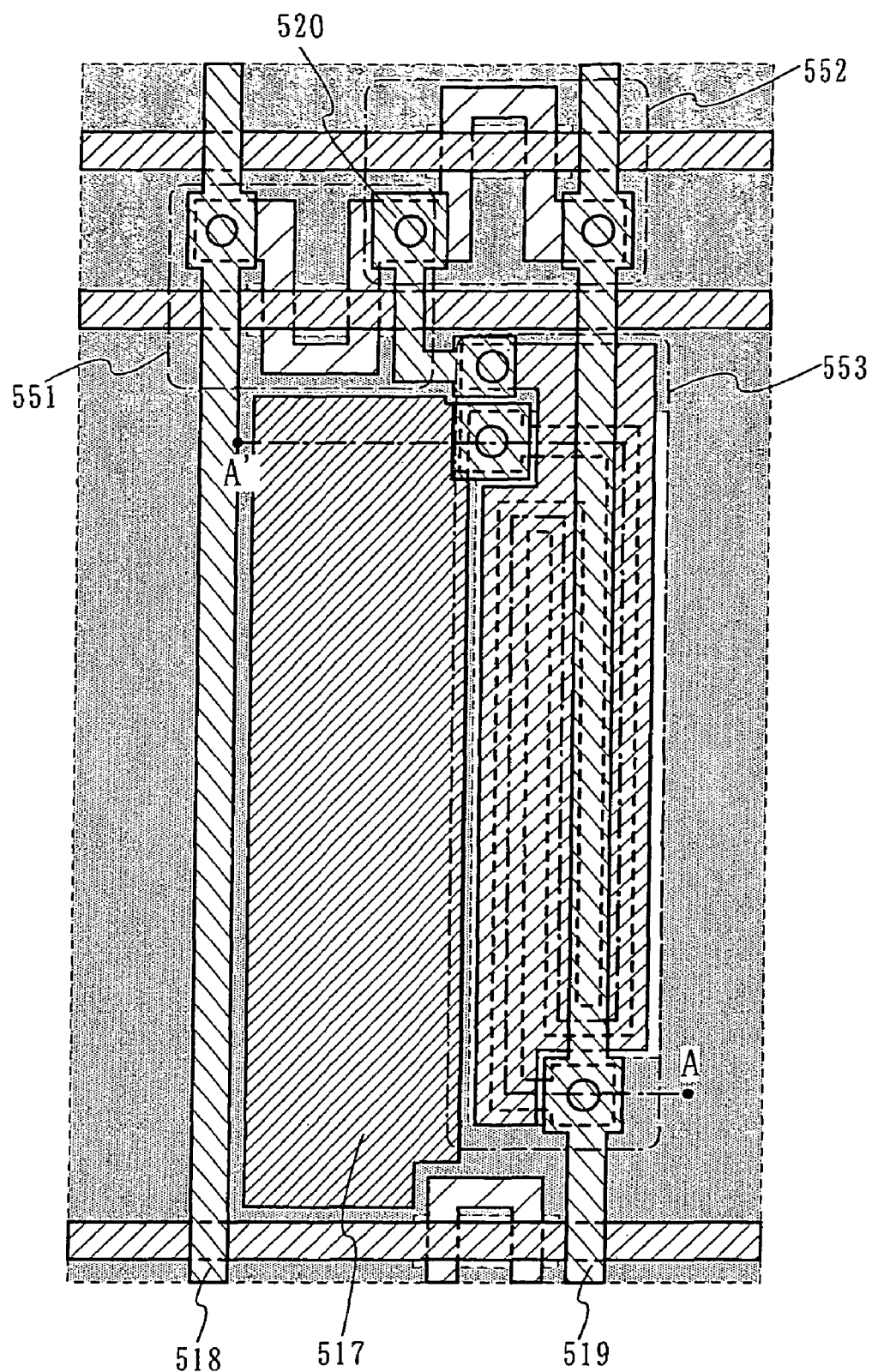
FIG. 19 is a top view illustrating the structure of a pixel portion of the semiconductor device shown in FIG. 15.

FIG. 19 shows an example of the structure of one pixel in the pixel portion 902. The pixel has TFTs 801 to 803, which are a switching TFT, a reset TFT, and a driving TFT, respectively, for controlling a light emitting element or liquid crystal element of the pixel. A process of manufacturing these TFTs is shown in FIGS. 16 to 19. Details of the process are described in Embodiment 3 and the description will not be repeated here.

Figure 16:
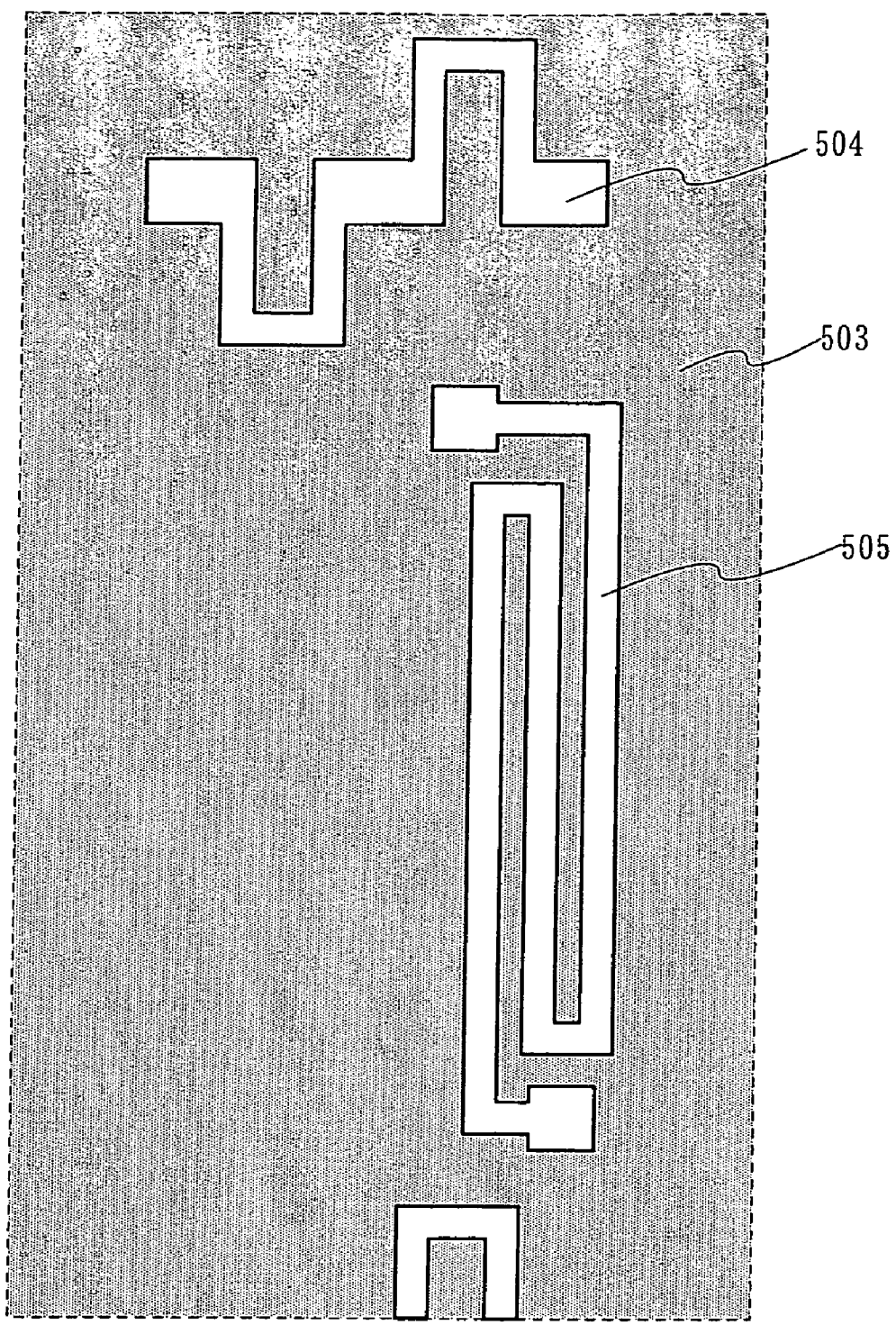
FIG. 16 is a top view illustrating a process of manufacturing a pixel portion of the semiconductor device shown in FIG. 15.

FIG. 16 shows a stage in which a second insulating film 503 is formed and openings 504 and 505 are formed in the second insulating film. FIG. 17 shows a stage after the openings 504 and 505 are formed in which an amorphous semiconductor film 506 is formed by deposition and irradiated with linearly collected laser light 507 to form a crystalline semiconductor film 508.

In FIG. 18, the crystalline semiconductor film on the second insulating film 503 is selectively removed by etching to obtain island-like semiconductor films 509 and 510 that are formed from the crystalline semiconductor film filling the openings.

Then a gate insulating film (not shown in the drawing) and gate electrodes (or gate wires) 514 to 516 are formed. Openings 511 to 513 are formed at positions where the island-like semiconductor films 509 and 510 intersect the gate electrode (or gate wires) 514 to 516. This way a gate structure similar to the one in Embodiment 3 can be obtained. Thereafter, an n type or p type impurity region is formed, an insulating film is formed thereon, and a power supply line 819, other various wires 820 and 821, and a pixel electrode 517 are formed on the insulating film. Thus obtained is the pixel structure shown in FIG. 19.

Figure 20:
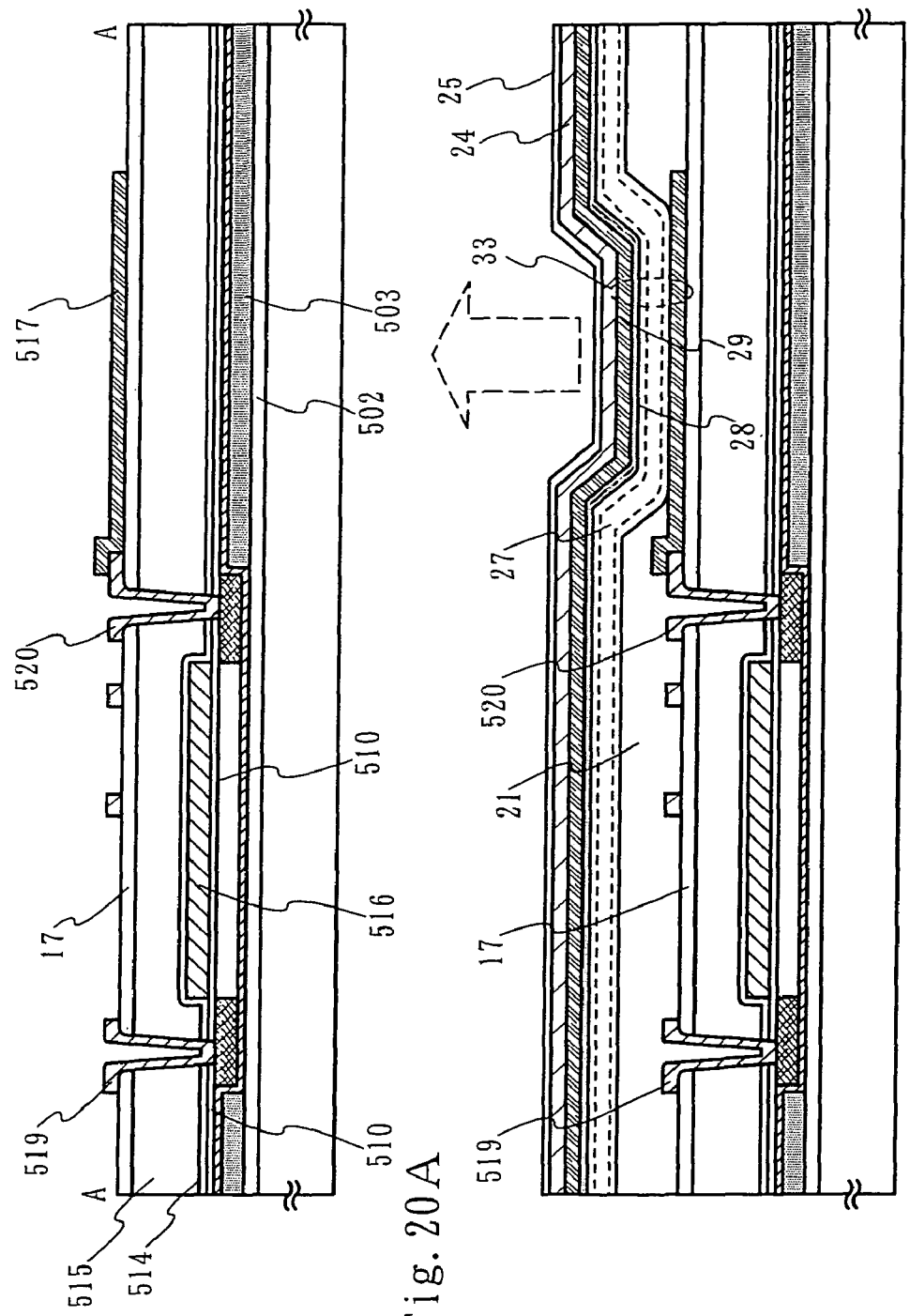
FIGS. 20A and 20B are vertical sectional views illustrating the structure of the pixel portion of FIG. 19.

FIG. 20A is a vertical sectional view taken along the line A-A' in FIG. 19. The pixel electrode 517 can be used to form an organic light emitting element as shown in FIG. 20B.

FIG. 20B shows a mode (upward emission type) in which light from a light emitting element 33 is emitted from the opposite side of the substrate. The pixel electrode 517 serves as a cathode which is one of electrodes of the light emitting element 33 and which is connected to a wire 520. An organic compound layer 27 is composed of an electron injection transporting layer, a light emitting layer, and a hole injection transporting layer which are formed in this order with the electron injection transporting layer being closest to the cathode. An anode 29 is formed above the organic compound layer 27. A thin light-transmissive metal layer 28 is formed between the organic compound layer and the anode. The anode 29 is formed by resistance heating evaporation from a light-transmissive conductive film such as an indium tin oxide (ITO) film, a zinc oxide (ZnO) film, or an indium zinc oxide (IZO) film. The metal layer 28 avoids damaging the organic compound layer 27 when the anode 29 is formed and degrading element characteristics. Then a protective film 24 and a passivation film 25 are formed.

If the organic compound layer 27 is formed from a low-molecular weight organic compound, a hole injection transporting layer is formed from copper phthalocyanine (CuPc) and MTDATA and α-NPD which are aromatic amine-based materials, and an electron injection layer that doubles as a light emitting layer is formed from a tris-8-quinolinolate aluminum complex ($Alq_3$) and laid on the hole injection transporting layer. $Alq_3$ makes it possible to emit light from singlet excitation state (fluorescence).

In order to raise the luminance, light emission from triplet excitation state (phosphorescence) is preferred. In this case, the organic compound layer 27 may be a laminate of a hole injection transporting layer, a light emitting layer, a hole blocking layer, and an electron injection transporting layer which are layered in this order. The hole injection transporting layer is formed from CuPc which is a phthalocyanine-based material and α-NPD which is an aromatic amine-based material. The light emitting layer is formed of carbazole-based CBP+$Ir(ppy)_3$. The hole blocking layer is formed of bathocuproin (BCP). The electron injection transporting layer is formed of $Alq_3$.

The above-mentioned two structures are examples of using a low-molecular weight organic compound. It is also possible to obtain an organic light emitting element in which a high-molecular weight organic compound and a low-molecular weight organic compound are combined. For example, the organic compound layer 27 may be a laminate of a hole injection transporting layer formed of a polythiophene derivative (PEDOT) that is a high-molecular weight organic compound, a hole injection transporting layer formed from α-NPD, a light emitting layer formed from CBP+$Ir(ppy)_3$, a hole blocking layer formed of BCP, and an electron injection transporting layer formed of $Alq_3$. They are layered in the order stated with the PEDOT layer the closest to the anode. By using PEDOT in the hole injection layer, the hole injection characteristic is improved as well as light emission efficiency.

In either case, light emission from triplet excitation state (phosphorescence) has higher light emission efficiency than light emission from singlet excitation state (fluorescence). Therefore the same light emission luminance can be obtained with a lower operation voltage (the voltage required to cause an organic light emitting element to emit light).

As described, a display panel with an organic light emitting element can be manufactured using the present invention. Although not given as an example here, the present invention can also be used to manufacture a display panel that utilizes electric optical characteristics of a liquid crystal.

Embodiment 11

This embodiment shows an example of using a glass substrate as an etching stopper when the second insulating film 202 of FIGS. 1A to 1E are formed and forming on the second insulating film 202 an insulating film that corresponds to the first insulating film 201.

Figure 26A:
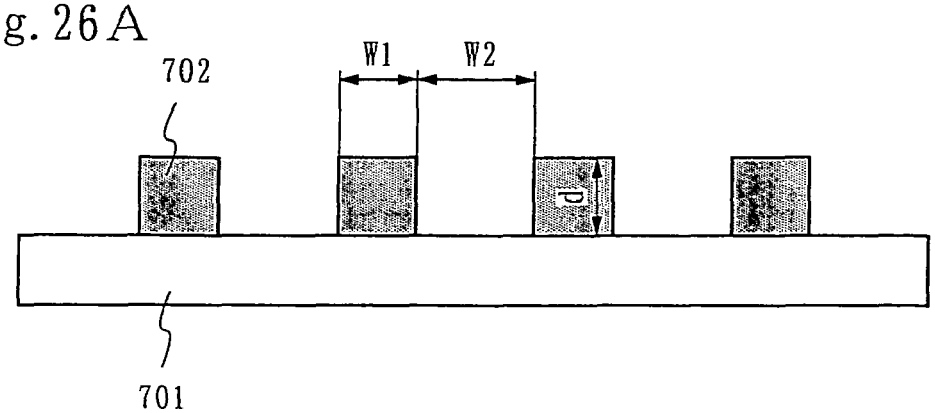
FIGS. 26A and 26B are diagrams illustrating a crystallization method in the present invention.

In FIG. 26A, a second insulating film 702 is formed first on a glass substrate 701 from silicon oxide or silicon oxynitride to a thickness of 10 to 3000 nm, preferably, 100 to 2000 nm. Openings having a given shape are formed in the second insulating film 702. For details, see Embodiment 1. The openings are formed by wet etching or dry etching. In this embodiment, dry etching using $CHF_3$ gas is employed. In this case, the gas flow rate is set to 30 to 40 sccm, the reaction pressure is set to 2.7 to 4.0 kPa, the applied voltage to 500 W, and the substrate temperature to 20° C.

A preferred material for the glass substrate 701 in this embodiment is one having high selective ratio with respect to a silicon oxide film (for example, Corning #1737 glass substrate (a product of Corning Inc.). This is because the glass substrate 701 having high selective ratio can be used as an etching stopper in forming the second insulating film 702.

Figure 26B:
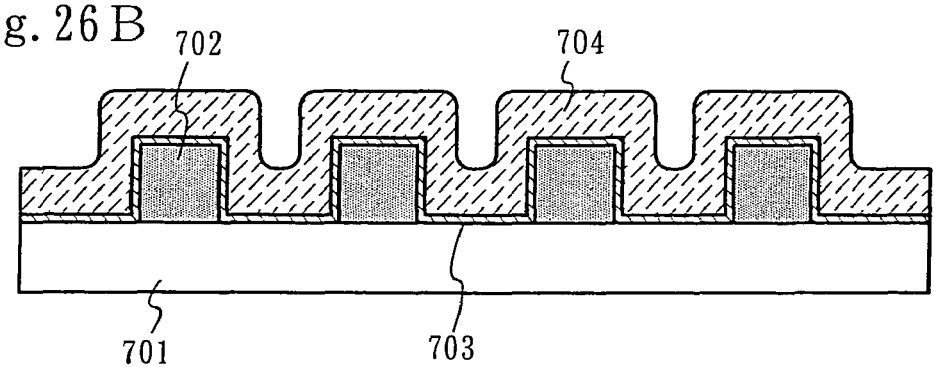

After the second insulating film 702 is formed, it is covered with a first insulating film 703. The first insulating film 703 is a silicon nitride film, or a silicon oxynitride film whose nitrogen content is larger than its oxygen content, or a laminate of these films. An amorphous semiconductor film 704 is formed on the first insulating film 703 to obtain the state of FIG. 26B. For details of the first insulating film 703 and amorphous semiconductor film 704, see the descriptions in Embodiment 1. Steps subsequent to FIG. 26B follow the instructions of Embodiment 1 and they are not repeated here.

According to this embodiment, a high enough selective ratio between the glass substrate 701 and the second insulating film 702 is ensured to improve the process margin for forming the openings of the second insulating film 702. This embodiment is also free from the problem of the lower edge of the second insulating film 702 being scraped, or other similar problems. In a region where the second insulating film 702 is not formed, a silicon nitride film, or a silicon oxynitride film whose nitrogen content is larger than its oxygen content, or a laminate of these films is placed on the glass substrate. This eliminates the need for a special insulating film such as an aluminum nitride film.

This embodiment can be combined freely with any structure of Embodiments 1 through 10.

Embodiment 12

The present invention can be used in various devices. Examples thereof include portable information terminals (electronic schedulers, mobile computers, cellular phones, and the like), video cameras, digital cameras, personal computers, television monitors, projection display devices, etc. FIGS. 24A to 25D show examples of the devices.

Figure 24A:
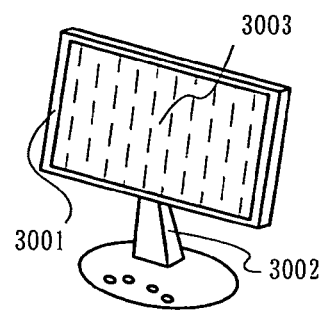
FIGS. 24A to 24G are diagrams showing examples of a semiconductor device.

FIG. 24A shows an example of applying the present invention to a television monitor. The device is composed of a case 3001, a supporting base 3002, a display unit 3003, and others. A TFT manufactured in accordance with the present invention can be used in the display unit 3003 and, in addition, various integrated circuits formed on a glass substrate, such as various logic circuits, high-frequency circuits, memories, microprocessors, media processors, and graphics LSIs.

Figure 24B:
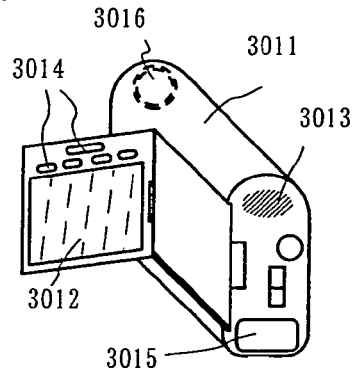

FIG. 24B shows an example of applying the present invention to a video camera. The device is composed of a main body 3011, a display unit 3012, an audio input unit 3013, operation switches 3014, a battery 3015, an image receiving unit 3016, and others. A TFT manufactured in accordance with the present invention can be used in the display unit 3012 and, in addition, various integrated circuits formed on a glass substrate, such as various logic circuits, high-frequency circuits, memories, microprocessors, media processors, and graphics LSIs.

Figure 24C:
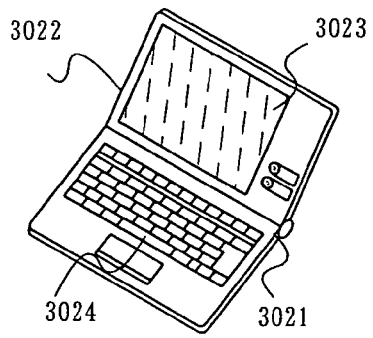

FIG. 24C shows an example of applying the present invention to a notebook personal computer. The device is composed of a main body 3021, a case 3022, a display unit 3023, a keyboard 3024, and others. A TFT manufactured in accordance with the present invention can be used in the display unit 3023 and, in addition, various integrated circuits formed on a glass substrate, such as various logic circuits, high-frequency circuits, memories, microprocessors, media processors, graphics LSIs, and encoder LSIs.

Figure 24D:
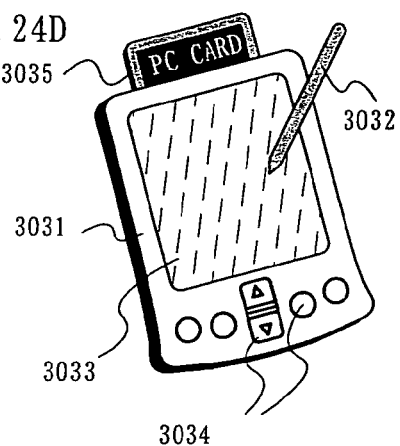

FIG. 24D shows an example of applying the present invention to a PDA (Personal Digital Assistant). The device is composed of a main body 3031, a stylus 3032, a display unit 3033, operation buttons 3034, an external interface 3035, and others. A TFT manufactured in accordance with the present invention can be used in the display unit 3033 and, in addition, various integrated circuits formed on a glass substrate, such as various logic circuits, high-frequency circuits, memories, microprocessors, media processors, graphics LSIs, and encoder LSIs.

Figure 24E:
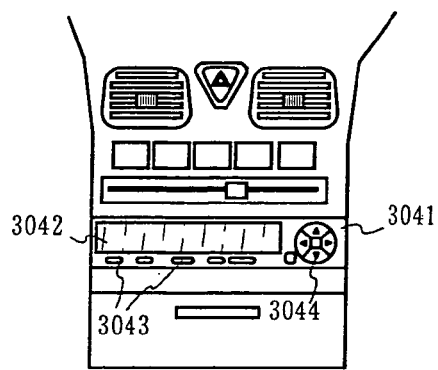

FIG. 24E shows an example of applying the present invention to an audio player, specifically, a car-mount audio device. The device is composed of a main body 3041, a display unit 3042, operation switches 3043 and 3044, and others. A TFT manufactured in accordance with the present invention can be used in the display unit 3042 and, in addition, various integrated circuits formed on a glass substrate, such as various logic circuits, high-frequency circuits, memories, microprocessors, media processors, graphics LSIs, and amplifier circuits.

Figure 24F:
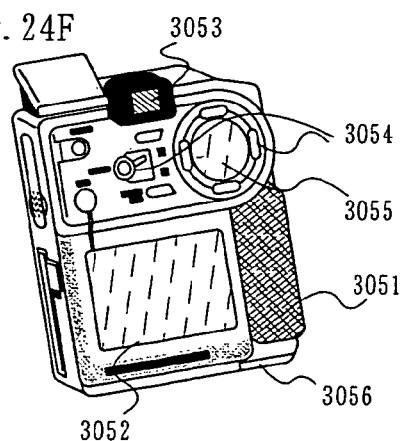

FIG. 24F shows an example of applying the present invention to a digital camera. The device is composed of a main body 3051, a display unit (A) 3052, an eye piece 3053, operation switches 3054, a display unit (B) 3055, a battery 3056, and others. A TFT manufactured in accordance with the present invention can be used in the display unit (A) 3052 and the display unit (B) 3056 and, in addition, various integrated circuits formed on a glass substrate, such as various logic circuits, high-frequency circuits, memories, microprocessors, media processors, graphics LSIs, and encoder LSIs.

Figure 24G:
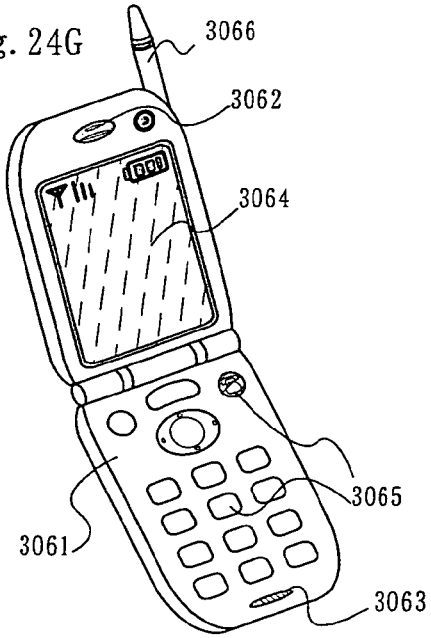

FIG. 24G shows an example of applying the present invention to a cellular phone. The device is composed of a main body 3061, an audio output unit 3062, an audio input unit 3063, a display unit 3064, operation switches 3065, an antenna 3066, and others. A TFT manufactured in accordance with the present invention can be used in the display unit 3064 and, in addition, various integrated circuits formed on a glass substrate, such as various logic circuits, high-frequency circuits, memories, microprocessors, media processors, graphics LSIs, encoder LSIs, and cellular phone LSIs.

Figure 25A:
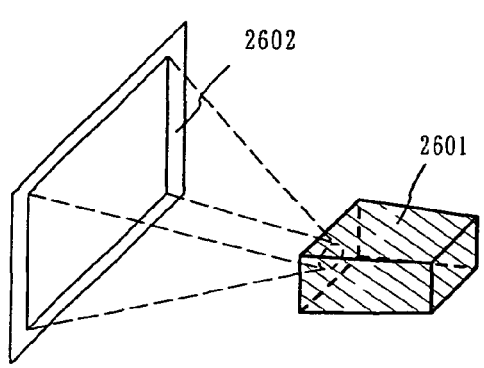
FIGS. 25A to 25D are diagrams showing examples of a projector.
Figure 25B:
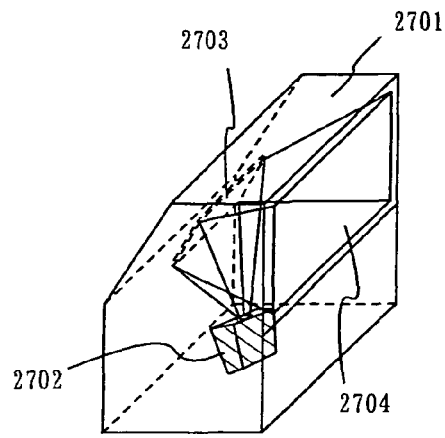

FIG. 25A shows a front projector, which includes a projection device 2601, a screen 2602, and others. FIG. 25B shows a rear projector, which includes a main body 2701, a projection device 2702, a mirror 2703, a screen 2704, and others.

Figure 25C:
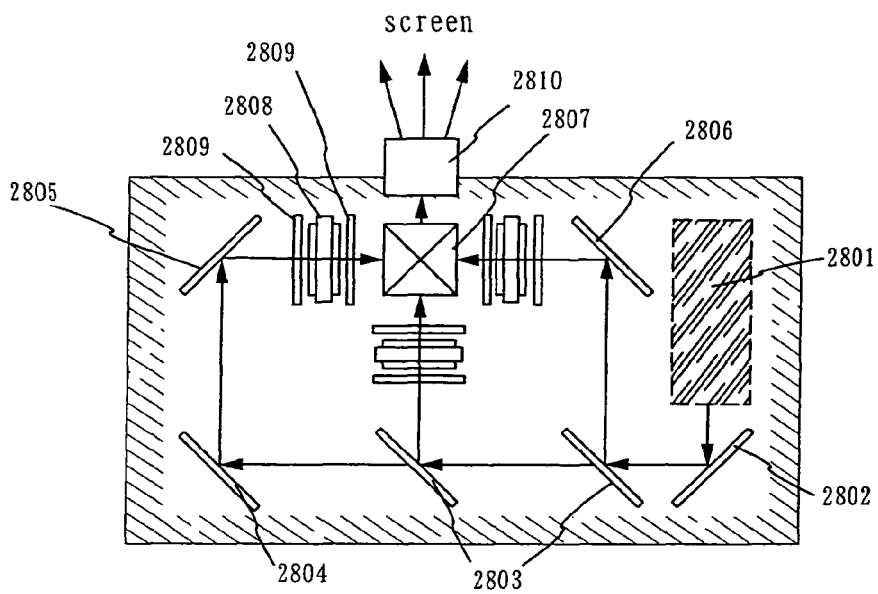

FIG. 25C is a diagram showing an example of the structure of the projection devices 2601 and 2702 in FIGS. 25A and 25B. The projection devices 2601 and 2702 are each composed of a light source optical system 2801, mirrors 2802 and 2804 to 2806, a dichroic mirror 2803, a prism 2807, a liquid crystal display device 2808, a phase difference plate 2809, and a projection optical system 2810. The projection optical system 2810 is an optical system including a projection lens. Shown in this embodiment is a three-plate type but there is no particular limitation. For example, it may be a single-plate type. An optical system such as an optical lens, a film having a polarizing function, a film for adjusting the phase difference, or an IR film may be provided in the light path indicated by the arrow in FIG. 25C if so desired.

Figure 25D:
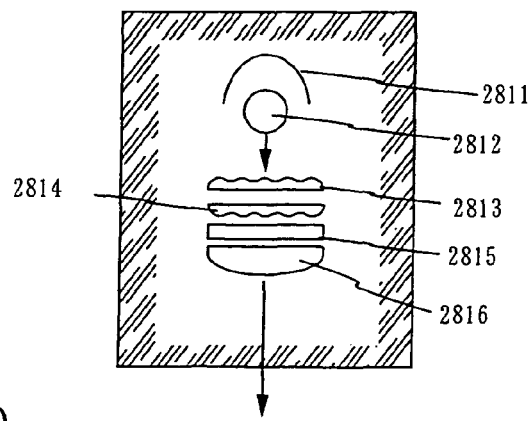

FIG. 25D is a diagram showing an example of the structure of the light source optical system 2801 in FIG. 25C. In this embodiment, the light source optical system 2801 is composed of a reflector 2811, a light source 2812, lens arrays 2813 and 2814, a polarization converting element 2815, and a condenser lens 2816. The light source optical system shown in FIG. 25 is merely an example and is not to limit the present invention. For example, an optical system such as an optical lens, a film having a polarizing function, a film for adjusting the phase difference, or an IR film may be provided in the light source optical system if so desired.

The devices shown here are merely examples and the present invention is not limited to these uses.

As described above, a semiconductor film is melted and gathered through surface tension in an opening formed on an insulating surface and crystals are allowed to grow from the vicinity of the point where the bottom and side faces of the opening meet. In this way distortion accompanying crystallization is concentrated on regions other than the opening. Portions of the crystalline semiconductor film that are not in the opening are removed by etching, so that regions having excellent crystallinity can be picked out.

The present invention also makes it possible to form a crystalline semiconductor film that has no grain boundaries by specifying the position of a semiconductor element such as a transistor, in particular, a channel formation region of a TFT. In this way, the cause of characteristic fluctuation, namely, randomly-formed grain boundaries and crystal defects, is removed and a TFT or a group of TFTs with less characteristic fluctuation can be formed.

What is claimed is:

1. A semiconductor device comprising:
a crystalline semiconductor island on an insulating surface, the crystalline semiconductor island including a pair of impurity regions and at least first and second portions extending in parallel with each other between the pair of impurity regions wherein each of the first and second portions includes a channel formation region;
a gate insulating film formed on the first and second portions;
a gate electrode formed over the first and second portions with the gate insulating film interposed, therebetween; and
a second insulating film formed on the insulating surface, the second insulating film including an opening where the crystalline semiconductor island is disposed,
wherein the gate insulating film contacts a top surface and side surfaces of each of the first and second portions of the crystalline semiconductor island and the gate electrode is formed adjacent to the top surface and side surfaces of each of the first and second portions of the crystalline semiconductor island with the gate insulating film interposed therebetween, and
wherein each of the first and second portions includes at least one crystal which extends along a channel length direction of each of the first and second portions.

2. A semiconductor device comprising:
a crystalline semiconductor island on an insulating surface, the crystalline semiconductor island including a pair of impurity regions and at least first and second portions extending in parallel with each other between the pair of impurity regions wherein each of the first and second portions includes a channel formation region;
a gate insulating film formed on the first and second portions;
a gate electrode formed over the first and second portions with the gate insulating film interposed therebetween; and
a second insulating film formed on the insulating surface, the second insulating film including an opening where the crystalline semiconductor island is disposed,
wherein an inner side surface of the opening is in contact with at least a portion of the crystalline semiconductor island,
wherein the gate insulating film contacts a top surface and side surfaces of each of the first and second portions of the crystalline semiconductor island and the gate electrode is formed adjacent to the top surface and side surfaces of each of the first and second portions of the crystalline semiconductor island with the gate insulating film interposed therebetween, and
wherein each of the first and second portions includes at least one crystal which extends along a channel length direction of each of the first and second portions.

3. The semiconductor device according to claim 2 wherein the gate electrode is in contact with an upper surface of the second insulating film.

4. A semiconductor device comprising:
a crystalline semiconductor island on an insulating surface, the crystalline semiconductor island including a pair of impurity regions and at least one portion extending between the pair of impurity regions wherein the one portion includes a channel formation region;
a gate insulating film formed on the one portion;
a gate electrode formed over the one portion with the gate insulating film interposed therebetween;
a second insulating film on the insulating surface, the second insulating film including an opening where the crystalline semiconductor island is disposed,
wherein the gate insulating film contacts a top surface and side surfaces of the one portion of the crystalline semiconductor island and the gate electrode is formed adjacent to the top surface and side surfaces of the one portion of the crystalline semiconductor island with the gate insulating film interposed therebetween,
wherein the gate electrode is in contact with an upper surface of the second insulating film, and
wherein each of the first and second portions includes at least one crystal which extends along a channel length direction of each of the first and second portions.

* * * * *